(12) United States Patent
Kurihara et al.

(10) Patent No.: US 7,456,078 B2
(45) Date of Patent: Nov. 25, 2008

(54) THIN-FILM CAPACITOR AND METHOD FOR FABRICATING THE SAME, ELECTRONIC DEVICE AND CIRCUIT BOARD

(75) Inventors: Kazuaki Kurihara, Kawasaki (JP); Takeshi Shioga, Kawasaki (JP); John David Baniecki, Kawasaki (JP); Masatoshi Ishii, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 211 days.

(21) Appl. No.: 11/393,910

(22) Filed: Mar. 31, 2006

(65) Prior Publication Data
US 2007/0141800 A1    Jun. 21, 2007

(30) Foreign Application Priority Data
Dec. 20, 2005    (JP) .............................. 2005-366789

(51) Int. Cl.
*H01L 21/20* (2006.01)
(52) U.S. Cl. ..................................... 438/399
(58) Field of Classification Search ......... 257/300–307, 257/698, 776; 438/399, 629, 637, 667
See application file for complete search history.

(56) References Cited

U.S. PATENT DOCUMENTS

| | | | | |
|---|---|---|---|---|
| 5,929,473 | A * | 7/1999 | Nishihori et al. ............. | 257/277 |
| 5,976,928 | A | 11/1999 | Kirlin et al. | |
| 6,023,407 | A | 2/2000 | Farooq et al. | |
| 6,178,082 | B1 | 1/2001 | Farooq et al. | |
| 6,326,671 | B1 | 12/2001 | Nagano et al. | |
| 6,624,501 | B2 * | 9/2003 | Shioga et al. ............... | 257/534 |
| 2002/0070423 | A1 | 6/2002 | Takafuji | |
| 2005/0111162 | A1 | 5/2005 | Osaka et al. | |
| 2005/0146838 | A1 | 7/2005 | Shioga et al. | |

FOREIGN PATENT DOCUMENTS

| | | |
|---|---|---|
| JP | 9-293869 | 11/1997 |
| JP | 11-97289 | 4/1999 |
| JP | 11/274408 A | 10/1999 |
| JP | 2000-228499 | 8/2000 |
| JP | 3157734 | 4/2001 |
| JP | 2002-110931 | 4/2002 |

OTHER PUBLICATIONS

German Office Action dated Jan. 26, 2007, Application No. 10 2006 013 812.0-34.

* cited by examiner

*Primary Examiner*—Calvin Lee
(74) *Attorney, Agent, or Firm*—Westerman, Hattori, Daniels & Adrian, LLP.

(57) ABSTRACT

The thin-film capacitor comprises a capacitor part 20 formed over a base substrate 10 and including a first capacitor electrode 14, a capacitor dielectric film 16 formed over the first capacitor electrode 14, and a second capacitor electrode 18 formed over the capacitor dielectric film 16; leading-out electrodes 26a, 26b lead from the first capacitor electrode 14 or the second capacitor electrode 18 and formed of a conducting barrier film which prevents the diffusion of hydrogen or water; and outside connection electrodes 34a, 34b for connecting to outside and connected to the leading-out electrodes 26a, 26b.

27 Claims, 35 Drawing Sheets

THIN-FILM CAPACITOR AND METHOD FOR FABRICATING THE SAME, ELECTRONIC DEVICE AND CIRCUIT BOARD

CROSS-REFERENCE TO RELATED APPLICATION

This application is based upon and claims priority of Japanese Patent Application No. 2005-366789, filed on Dec. 20, 2005, the contents being incorporated herein by reference.

BACKGROUND OF THE INVENTION

The present invention relates to a thin-film capacitor and a method for fabricating the thin-film capacitor, and an electronic device and a circuit board.

Generally, decoupling capacitors are mounted near an LSI (Large Scale Integrated circuit), etc. mounted on a printed circuit board so as to prevent erroneous operations due to source voltage variations and radio-frequency noises.

The decoupling capacitors are formed on a substrate which is separate from the printed circuit board and are mounted suitably on the printed circuit board.

Recently, as the LSI, etc. have the operation speed increased and the electric power consumption decreased, the decoupling capacitors are required to have the characteristics improved. As the LSI, etc. are downsized, the decoupling capacitors are required to be downsized.

Then, techniques for satisfying the requirement of downsizing the decoupling capacitors while increasing the capacitance are proposed.

A proposed capacitor will be explained with reference to FIG. 35. FIG. 35 is a sectional view of the proposed capacitor.

As illustrated in FIGS. 22A and 22B, a silicon oxide film 112 is formed on a silicon substrate 110. On the silicon oxide film 112, capacitor electrode (lower electrodes) 114 of, e.g., a 100 nm-thickness Pt film are formed. On the capacitor electrodes 114, a 100 nm-thickness capacitor dielectric film 116 is formed of, e.g., a $Ba_xSr_{1-x}TiO_3$ film (hereinafter also called "BST film"), which is a high dielectric substance. On the capacitor dielectric film 116, capacitor electrodes (upper electrodes) 118 of a 100 nm-thickness Pt film are formed. Thus, capacitor parts 120 are formed each of the capacitor electrode 114, the capacitor dielectric film 116 and the capacitor electrode 118.

On the silicon substrate 110 with the capacitor parts 120 formed on, an insulating barrier film 122 is formed. The insulating barrier film 122 is for preventing hydrogen or water from arriving at the capacitor parts 120.

That is, in fabricating or using the thin-film capacitors, when hydrogen or water arrive at the capacitor dielectric film 116, there is a risk that the oxide forming the capacitor dielectric film 116 may be reduced with the hydrogen, and the electric characteristics of the capacitor parts 120 may be deteriorated. In the thin-film capacitor illustrated in FIG. 22, the insulating barrier film 122 is formed, covering the capacitor parts 120, whereby the hydrogen or water are prevented from arriving at the capacitor dielectric film 116.

On the insulating barrier film 122, a protection film 130 of, e.g., a resin is formed. In the protection film 130 and the insulating barrier film 122, openings 132a and openings 132b are formed respectively down to the capacitor electrodes 114 and the capacitor electrodes (upper electrodes) 118. Electrodes 134a, 134b for the connection to the outside are buried respectively in the openings 132a, 132b. Solder bumps 136 are formed on the outside connection electrodes 134a, 134b.

The capacitor electrodes 114 of the capacitor parts 120 are electrically connected to the power source line of, e.g., the circuit board (not illustrated) via the outside connection electrodes 134a and the solder bumps 136. The capacitor electrodes 118 of the capacitor parts 120 are electrically connected to the ground line of, e.g., the circuit board (not illustrate) via the outside connection electrodes 134b and the solder bumps 136.

The thin-film capacitor illustrated in FIGS. 22A and 22B has the capacitor dielectric film 116 which is formed of the high dielectrics and is formed as thin as about 100 nm, and the capacitance can be improved. Furthermore, the thin-film capacitor can be formed by the semiconductor process, and can be formed, micronized. The inductance can be decreased. Thus, the proposed thin-film capacitor can surely prevent the source voltage variation, and can sufficiently remove the radio-frequency noises.

Following references disclose the background art of the present invention.

[Patent Reference 1]
Specification of Japanese Patent Application Unexamined Publication No. Hei 11-97289

[Patent Reference 2]
Specification of Japanese Patent Application Unexamined Publication No. 2000-228499

[Patent Reference 3]
Specification of Japanese Patent No. 3157734

[Patent Reference 4]
Specification of Japanese Patent Application Unexamined Publication No. Hei 9-293869

[Patent Reference 5]
Specification of Japanese Patent Application Unexamined Publication No. 2002-110931

However, in the thin-film capacitor illustrated in FIGS. 22A and 22B, the hydrogen or water cannot be prevented from arriving at the capacitor dielectric film 116 via the outside connection electrodes 134a, 134b. The capacitor dielectric film 116 is reduced to some extent, and sufficiently satisfactory electric characteristics cannot be always obtained.

SUMMARY OF THE INVENTION

An object of the present invention is to provide a thin-film capacitor which can surely prevent the reduction of the capacitor dielectric film with hydrogen or water and a method for fabricating the thin-film capacitor, and an electronic device and a circuit board using the thin-film capacitor.

According to one aspect of the present invention, there is provided a thin-film capacitor comprising: a capacitor part formed over a base substrate and including a first capacitor electrode, a capacitor dielectric film formed over the first capacitor electrode, and a second capacitor electrode formed over the capacitor dielectric film; a leading-out electrode led from the first capacitor electrode or the second capacitor electrode and formed of a conducting barrier film which prevents the diffusion of hydrogen or water; and an outside connection electrode for connecting to outside electrically connected to the leading-out electrode.

According to another aspect of the present invention, there is provided a method for fabricating a thin-film capacitor comprising the steps of: forming over a base substrate a capacitor part including a first capacitor electrode, a capacitor dielectric film formed over the first capacitor electrode, and a second capacitor electrode formed over the capacitor dielectric film; forming a leading-out electrode led from the first capacitor electrode or the second capacitor electrode and formed of a conducting barrier film which prevents the diffusion of hydrogen or water; and forming an outside connection electrode for connecting to outside connected to the leading-out electrode.

According to further another aspect of the present invention, there is provided an electronic device comprising: a circuit board; a thin-film capacitor mounted on the circuit board, the thin-film capacitor comprising a capacitor part including a first capacitor electrode formed over a base substrate, a capacitor dielectric film formed over the first capacitor electrode, and a second capacitor electrode formed over the capacitor dielectric film; a leading-out electrode led out from the first or the second capacitor electrode and formed of a conducting barrier film which prevents the diffusion of hydrogen or water; and an outside connection electrode for connecting to outside connected to the leading-out electrode; and a semiconductor device mounted on the circuit board.

According to further another aspect of the present invention, there is provided an electronic device comprising: a circuit board; a thin-film capacitor mounted on the circuit board, the thin-film capacitor comprising a capacitor part including a first capacitor electrode formed over a base substrate, a capacitor dielectric film formed over the first capacitor electrode, and a second capacitor electrode formed over the capacitor dielectric film, a leading-out electrode led out from the first or the second capacitor electrode and formed of a conducting barrier film which prevents the diffusion of hydrogen or water, an outside connection electrode for connecting to outside connected to the leading-out electrode, and a through-electrode electrically connected to the leading-out electrode and formed through the base substrate; and a semiconductor device mounted on the thin-film capacitor, and electrically connected to the circuit board via the outside connection electrode and the through-electrode.

According to further another aspect of the present invention, there is provided a circuit board with a thin-film capacitor incorporated in, wherein the thin-film capacitor comprises a first capacitor electrode formed over a base substrate; a capacitor dielectric film formed over the first capacitor electrode; a second capacitor electrode formed over the capacitor dielectric film; a leading-out electrode led from the first or the second capacitor electrode, and formed of a conducting barrier film which prevents the diffusion of hydrogen or water; and an outside connection electrode for connecting to outside connected to the leading-out electrode, and the outside connection electrode is electrically connected to an interconnection formed in the circuit substrate.

According to further another aspect of the present invention, there is provided a circuit board with a thin-film capacitor incorporated in, wherein the thin-film capacitor comprises a capacitor part including a first capacitor electrode formed over a base substrate; a capacitor dielectric film formed over the first capacitor electrode; a second capacitor electrode formed over the capacitor dielectric film; a leading-out electrode led out from the first or the second capacitor electrode and formed of a conducting barrier film which prevents the diffusion of hydrogen or water; an outside connection electrode for connecting to outside connected to the leading-out electrode; and a through-electrode electrically connected to the leading-out electrode and formed through the base substrate, and the through-electrode is electrically connected to an interconnection formed in the circuit board.

According to further another aspect of the present invention, there is provided a thin-film capacitor comprising: a capacitor part formed over a base substrate, and including a first capacitor electrode, a capacitor dielectric film formed over the first capacitor electrode, and a second capacitor electrode formed over the capacitor dielectric film; a first conducting barrier film which is formed over the first capacitor electrode and prevents the diffusion of hydrogen or water; a second conducting barrier film which is formed over the second capacitor electrode and prevents the diffusion of hydrogen or water; an insulation film formed over the capacitor part, covering the first conducting barrier film and the second conducting barrier film; a first outside connection electrode for connecting to outside buried in the insulation film, and electrically connected to the first capacitor electrode via the first conducting barrier film; and a second outside connection electrode for connecting to outside buried in the insulation film, and electrically connected to the second capacitor electrode via the second conducting barrier film.

According to further another aspect of the present invention, there is provided a thin-film capacitor comprising: a first capacitor electrode formed over a base substrate; a first conducting barrier film which is formed over the first capacitor electrode and prevents the diffusion of hydrogen or water; a capacitor dielectric film formed over the first conducting barrier film; a second capacitor electrode formed over the capacitor dielectric film; a second conducting barrier film which is formed over the second capacitor electrode and prevents the diffusion of hydrogen or water; an insulation film formed over the first capacitor electrode and the second capacitor electrode; a first outside connection electrode for connecting to outside buried in the insulation film, and electrically connected to the first capacitor electrode via the first conducting barrier film; and a second outside connection electrode for connecting to outside buried in the insulation layer, and electrically connected to the second capacitor electrode via the second conducting barrier film.

According to further another aspect of the present invention, there is provided a method for fabricating a thin-film capacitor comprising the steps of: forming over a base substrate a capacitor part including a first capacitor electrode, a capacitor dielectric film formed over the first capacitor electrode, and a second capacitor electrode formed over the capacitor dielectric film; forming over the first capacitor electrode a first conducting barrier film which prevents the diffusion of hydrogen or water and forming over the second capacitor electrode a second conducting barrier film which prevent the diffusion of hydrogen or water; forming an insulation film over the capacitor part, covering the first conducting layer and the second conducting layer; and burying in the insulation film a first outside connection electrode for connecting to outside electrically connected to the first capacitor electrode via the first conducting barrier film, and a second outside connection electrode for connecting to outside electrically connected to the second capacitor electrode via the second conducting barrier film.

According to further another aspect of the present invention, there is provided a method for fabricating a thin-film capacitor comprising the steps of: forming a first capacitor electrode over a base substrate; forming over a first capacitor electrode a first conducting barrier film which prevents the diffusion of hydrogen or water; forming a capacitor dielectric film over the first conducting barrier film; forming a second capacitor electrode over the capacitor dielectric film; forming over the second capacitor electrode a second conducting barrier film which prevents the diffusion of hydrogen or water; forming an insulation film over the first conducting barrier film ad the second conducting barrier film; and burying in the insulation film a first outside connection electrode for connecting to outside connected to the first capacitor electrode via the first conducting barrier film, and a second outside connection electrode for connecting to outside connected to the second capacitor electrode via the second conducing barrier film.

According to the present invention, the capacitor electrodes and the outside connection electrodes are interconnected via the leading-out electrodes of the conducting barrier film, whereby the hydrogen or water intruding via the outside connection electrodes is sufficiently blocked by the leading-out electrodes from arriving at the capacitor electrodes, and the deterioration of the capacitor dielectric film due to the hydrogen or water can be prevented. Thus, the present invention can provide a thin-film capacitor which can prevent the deterioration of the electric characteristics and the reliability and a method for fabricating the thin-film capacitor, and an electronic device and a circuit board using the thin-film capacitor.

According to the present invention, the first conducting barrier film for preventing the diffusion of hydrogen or water is formed on the first capacitor electrodes, and on the second capacitor electrodes, the second conducting barrier film for preventing the diffusion of hydrogen or water is formed. The first outside connection electrodes are electrically connected to the first capacitor electrodes via the first conducting barrier film, and the second outside connection electrodes are connected to the second outside connection electrodes via the second conducting barrier film. Thus, the arrival of hydrogen or water at the capacitor dielectric film via the first outside connection electrodes and the second outside connection electrodes can be prevented.

DETAILED DESCRIPTION OF THE INVENTION

A First Embodiment

Figure 1A:
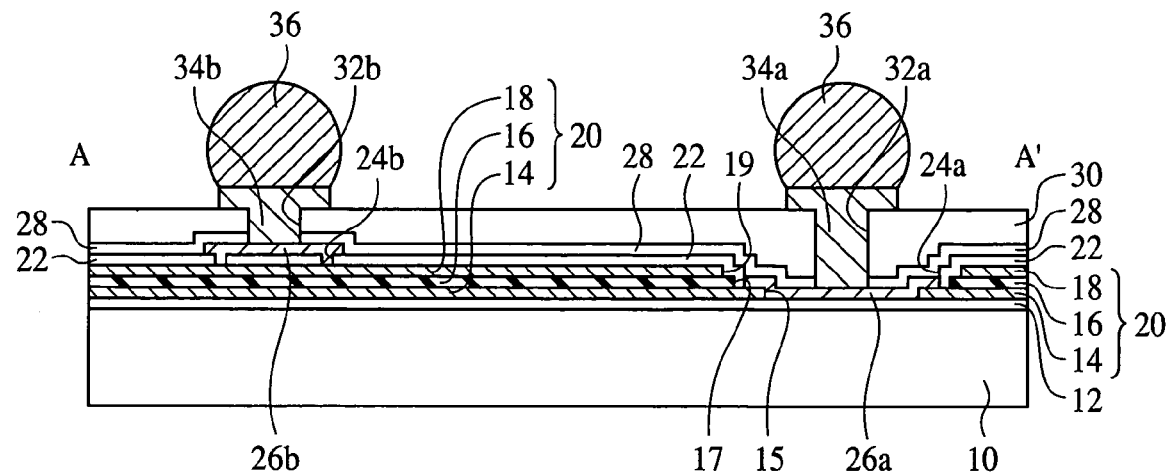
FIGS. 1A and 1B are a sectional view and a plan view of the thin-film capacitor according to a first embodiment of the present invention.
Figure 1B:
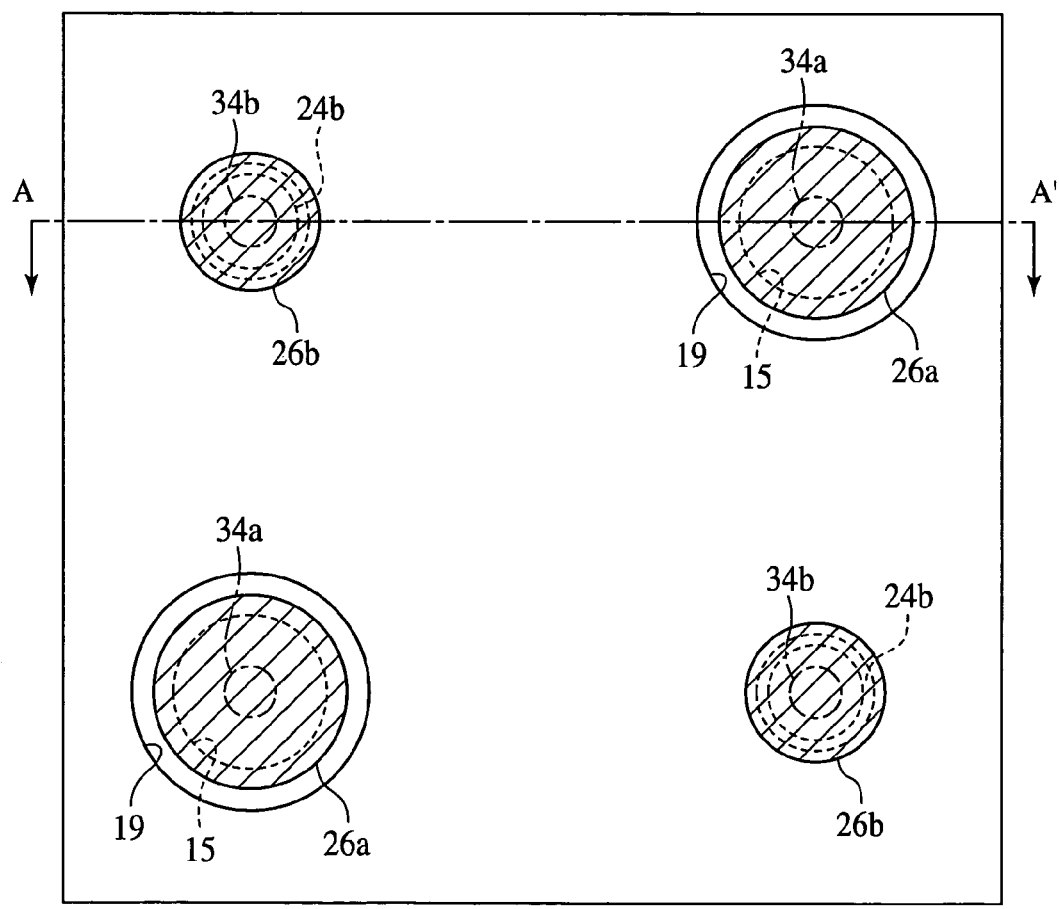

The thin-film capacitor according to a first embodiment of the present invention and the method for fabricating the thin-film capacitor will be explained with reference to FIGS. 1A to 4C. FIGS. 1A and 1B are a sectional view and a plan view of the thin-film capacitor according to the present embodiment. FIG. 1A is the sectional view along the line A-A' in FIG. 1B.

(The Thin-Film Capacitor)

First the thin-film capacitor according to the present embodiment will be explained with reference to FIGS. 1A and 1B.

As illustrated in FIGS. 1A and 1B, an insulation film 12 is formed on a base substrate 10. The base substrate 10 is, e.g., a semiconductor substrate, more specifically, a silicon substrate. As the insulation film 12, a silicon oxide film, for example, is formed. The insulation film 12 is for insulating the base substrate 10 and capacitor parts 20 which will be described later from each other.

An adhesion layer (not illustrated) is formed on the insulation film 12. As the adhesion layer, a 100 nm-thickness titanium oxide ($TiO_2$) layer, for example, is formed.

On the adhesion layer, capacitor electrodes (lower electrodes) of a 100 nm-thickness platinum (Pt) layer are formed. Openings 15 are formed in the capacitor electrodes 14 down to the insulation film 12.

A capacitor dielectric film 16 is formed on the capacitor electrodes 14. The capacitor dielectric film 16 is formed of, e.g., a high dielectric constant material. More specifically, polycrystalline $Ba_xSr_{1-x}TiO_3$ film (hereinafter also called "BST film") is used as the capacitor dielectric film 16. The thickness of the capacitor dielectric film 16 is, e.g., 100 nm. Openings 17 are formed in the capacitor dielectric film 16, corresponding to the openings 15 formed in the capacitor electrodes 14. The diameter of the openings 17 is larger than the diameter of the openings 15.

On the capacitor dielectric film 16, capacitor electrodes (upper electrodes) 18 are formed on a 100 nm-thickness Pt film. Openings 19 are formed in the capacitor electrodes 18, corresponding to the openings 15, 17. The diameter of the openings 19 is larger than the diameter of the openings 17.

Thus, capacitor parts each including the capacitor electrodes 14, the capacitor dielectric film 16 and the capacitor electrodes 18 are formed.

On the base substrate 10 with the capacitor parts 20 formed on, an insulating barrier film 22 for preventing the diffusion of hydrogen or water is formed. The barrier film 22 is formed, covering the capacitor parts 20. The insulating barrier film 22 prevents the hydrogen gas, etc. generated in curing a protection film 30 which will be described later and in forming electrodes 34a, 34b for the connection to the outside by electroplating from arriving at the capacitor parts 20 in cooperation with an insulating barrier film 28 and a conducting barrier film 26a, 26b. The insulating barrier film 22 is formed of the amorphous film of the same material as, e.g., the capacitor dielectric film 16. In the present embodiment, the capacitor dielectric film 16 is formed of BST film, and the insulating barrier film 22 is formed of amorphous BST film. The film thickness of the insulating barrier film 22 is, e.g., about 50 nm.

In the present embodiment, the insulating barrier film 22 is formed of an amorphous film for the following reason. That is, polycrystalline film has gaps among grains, i.e., grain boundaries, and hydrogen or water tend to pass through the gaps among the grains. In contrast to this, amorphous film has no grain boundaries, and hydrogen or water cannot easily pass through the amorphous film. For this reason, the insulating barrier film 22 is formed of amorphous film in the present embodiment.

The insulating barrier film 22 is formed of amorphous film of the same material as the capacitor dielectric film 16 for the following reason. That is, when the insulating barrier film 22 is formed of a material different from the material of the capacitor dielectric film 16, there is a risk that the stress due to a difference between the thermal expansion coefficient of the insulating barrier film 22 and the thermal expansion coefficient of the capacitor dielectric film 16 may be applied to the capacitor parts 20. In contrast to this, when the insulating barrier film 22 is formed of amorphous film of the same material as the capacitor dielectric film 16, the application of the stress can be prevented because the thermal expansion coefficient of the insulating barrier film 22 and the thermal expansion coefficient of the capacitor dielectric film 16 are equal to each other. For this reason, in the present embodiment, the insulating barrier film 22 is formed of amorphous film of the same material as the capacitor dielectric film 16.

In the present embodiment, the insulating barrier film 22 is formed of amorphous film of the same material as the capacitor dielectric film 16. However, the insulating barrier film 22 can be formed of a material different from that of the capacitor dielectric film 16.

In the insulating barrier film 22, openings 24a for exposing the inner edges of the capacitor electrodes 14 and the insulation film 12, and openings 24b for partially exposing the capacitor electrodes 18 are formed. The distance between the openings 24b and the outside connection electrodes 34b is set at, e.g., 5 μm or above. The distance between the openings 24b and the outside connection electrodes 34b is set at 5 μm or above, so that, as will be described later, the hydrogen or water intruding via the outside connection electrodes 34b are surely prevented from arriving at the capacitor parts 20 by leading-out electrodes 26b.

On the insulation film 12 and the capacitor electrodes 14 in the openings 24a, leading-out electrodes 26a which prevent the diffusion of the hydrogen or water are formed of a conducting barrier film. On the insulating barrier film 22 and in the openings 24b, leading-out electrodes 26b which prevent the diffusion of the hydrogen or water are formed of the conducting barrier film. That is, the leading-out electrodes 26b are connected to the capacitor electrodes 18 via the openings 24b. The conducting barrier film forming the leading-out electrodes 26*a*, 26*b* is, e.g., amorphous TaSiN film. The film thickness of the leading-out electrodes 26*a*, 26*b* is, e.g., about 100 nm.

In the present embodiment, the leading-out electrodes 26*a*, 26*b* are formed of amorphous film for the following reason. That is, polycrystalline film has gaps among grains, i.e., grain boundaries, and hydrogen or water tend to pass through the gaps among the grains. In contrast to this, amorphous film has no grain boundaries, and hydrogen or water cannot easily pass through the amorphous film. For this reason, in the present embodiment, the conducting barrier film forming the leading-out electrodes 26*a*, 26*b* is amorphous film.

An insulating barrier film 28 is further formed on the insulating barrier film 22 and the leading-out electrodes 26*a*, 26*b*. The insulating barrier film 28 is, e.g., amorphous aluminum oxide (alumina, $Al_2O_3$) film. The film thickness of the insulating barrier film 28 is, e.g., about 50 nm. The insulating barrier film 22 prevents the hydrogen gas, etc. generated in curing the protection film 30, which will be described later, and in forming the electrodes 34*a*, 34*b* for the connection to the outside by electroplating from arriving at the capacitor parts 20 in cooperation with the insulating barrier film 22 and the conducting barrier film 26*a*, 26*b*.

In the present embodiment, the insulating barrier film 28 is amorphous film for the same reason described above why the insulating barrier film 22 is amorphous film.

On the insulating barrier film 28, a protection film 30 of, e.g., a photosensitive polyimide resin. The thickness of the protection film 30 is, e.g., about 2 μm.

Openings 32*a*, 32*b* are formed in the protection film 30 and the insulating barrier film 28 down to the leading-out electrodes 26*a*, 26*b*.

A layer film (not illustrated) of a titanium (Ti) film and a copper (Cu) film sequentially laid is formed in the openings 32*a*, 32*b*. The layer film functions as the adhesion layer.

Electrodes (pad electrodes) for the connection to the outside 34*a*, 34*b* are formed of Ni (nickel) in the openings 32*a*, 32*b* with the layer film formed in.

On the outside connection electrodes 34*a*, 34*b*, solder bumps 36 of, e.g., an Sn—Ag-based material.

Thus, the thin-film capacitor according to the present embodiment is formed.

The thin-film capacitor according to the present embodiment is characterized mainly in that the capacitor electrodes 14, 18 are connected to the leading-out electrodes 26*a*, 26*b* of the conducting barrier film, which prevent the diffusion of the hydrogen or water, and the leading-out electrodes 26*a*, 26*b* led out from the capacitor electrodes 14, 18 are connected to the outside connection electrodes 34*a*, 34*b*.

With the conducting barrier film simply sandwiched between the outside connection electrodes and the capacitor electrodes, the distance along which the hydrogen or water intruding via the outside connection electrodes arrive at the capacitor parts corresponding to the film thickness of the conducting barrier film. The film thickness of the conducting barrier film is usually as small as about 100 nm. With the conducting barrier film simply sandwiched between the outside connection electrodes and the capacitor electrodes, there is a risk that the hydrogen or water intruding via the leading-out electrodes cannot be sufficiently blocked and arrive at the capacitor dielectric film, and the electric characteristics and the reliability may be deteriorated.

In contrast to this, in the present embodiment, in which the capacitor electrodes 14, 18 and the outside connection electrodes 26*a*, 26*b* are connected via the leading-out electrodes 26*a*, 26*b* formed of the conducting barrier film, the distance along which the hydrogen or water intruding via the outside connection electrodes 34*a*, 34*b* arrive at the capacitor electrodes 14, 18 is the distance from the connections between the outside connection electrodes 34*a*, 34*b* and the leading-out electrodes 26*a*, 26*b* to the connections between the capacitor electrodes 14, 18 and the leading-out electrodes 26*a*, 26*b*. With the capacitor electrodes 14, 18 and the outside connection electrodes 34*a*, 34*b* being connected with each other via the leading-out electrodes 26*a*, 26*b*, the distance from the connection between the outside connection electrodes 34*a*, 34*b* and the leading-out electrode 26*a*, 26*b* to the connection between capacitor electrodes 14, 18 and the leading-out electrodes 26*a*, 26*b* can be set to be so large as several μm to hundreds μm. Accordingly, in the present embodiment, in which the capacitor electrodes 14, 18 and the outside connection electrodes 34*a*, 34*b* are connected to each other via the leading-out electrodes 26*a*, 26*b* formed of the conducting barrier film, the hydrogen or water intruding via the outside connection electrodes 34*a*, 34*b* can be sufficiently blocked by the leading-out electrodes 26*a*, 26*b*. Thus, according to the present embodiment, the arrival of the hydrogen or water at the capacitor parts 20 can be surely prevented, and the deterioration of the capacitor dielectric film 16 due to the hydrogen or water can be prevented. The thin-film capacitor according to the present embodiment can prevent the deterioration of the electric characteristics and the reliability.

(The Method for Fabricating the Thin-Film Capacitor)

Then, the method for fabricating the thin-film capacitor according to the present embodiment will be explained with reference to FIGS. 2A to 4C. FIGS. 2A to 4C are sectional views of the thin-film capacitor according to the present embodiment in the steps of the method for fabricating the thin-film capacitor, which illustrate the method.

First, the base substrate 10 with the insulation film 12 formed on is prepared. The base substrate 10 is, e.g., a semiconductor substrate. More specifically, the base substrate 10 is, e.g., a silicon substrate, and silicon oxide film, for example, is formed as the insulation film 12.

Then, the base substrate 10 is loaded into the film forming chamber of a sputtering system (not illustrated). The sputtering system is, e.g., a multi-targets magnetron type sputtering system.

Then, an adhesion layer (not illustrated) of, e.g., a 100 nm-thickness $TiO_2$ film is formed on the entire surface by sputtering.

Then, the conductor film 14 for forming the capacitor electrodes (lower electrodes) is formed on the entire surface by sputtering. The conduction film 14 is, e.g., Pt film. The film thickness of the conduction film 14 is, e.g., 100 nm.

Then, the capacitor dielectric film 16 is formed on the entire surface by sputtering. The capacitor dielectric film 16 is, e.g. polycrystalline BST film. The film thickness of the capacitor dielectric film 16 is, e.g., 100 nm.

Then, the conduction film 18 for forming the capacitor electrodes (upper electrodes) are formed on the entire surface by sputtering. The conduction film 18 is, e.g., Pt film. The film thickness of the conduction film 18 is, e.g., 100 nm (see FIG. 1A).

Then, the base substrate 10 is unloaded out of the film forming chamber of the sputtering system.

Then, a photoresist film (not illustrated) is formed on the entire surface by spin coating. Then, the photoresist film is patterned into the plane shape of the capacitor electrodes (upper electrodes) 18 (see FIGS. 1A and 1B) by photolithography.

Figure 2A:
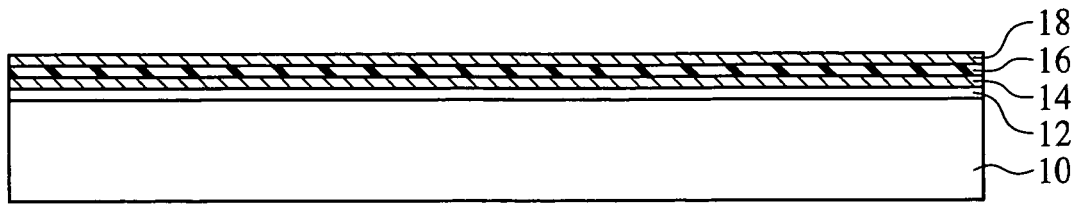
FIGS. 2A to 2D are sectional views of the thin-film capacitor according to the first embodiment of the present invention in the steps of the method for fabricating the thin-film capacitor, which illustrate the method (Part 1).
Figure 2B:
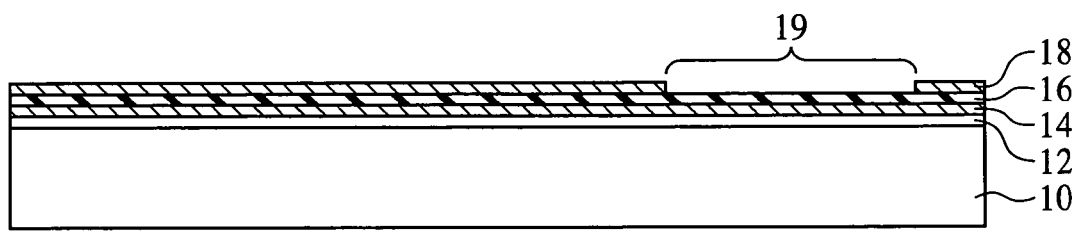

Next, with the photoresist film as the mask, the conduction film 18 is patterned by ion milling (see FIG. 2B). Thus, the capacitor electrodes (upper electrodes) 18 with the openings 19 formed down to the capacitor dielectric film 16 are formed.

Next, a photoresist film (not illustrated) is formed on the entire surface by spin coating. Then, by photolithography, the photoresist film is patterned into the plane shape of the capacitor dielectric film 16 (see FIGS. 1A and 1B).

Figure 2C:
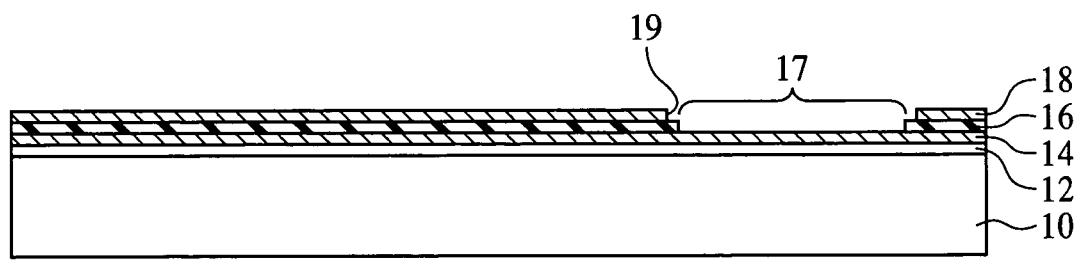

Then, with the photoresist film as the mask, the dielectric film 16 is patterned by ion milling (see FIG. 2C). Thus, the openings 17 are formed in the capacitor dielectric film 16 down to the conduction film 14.

Then, a photoresist film (not illustrated) is formed on the entire surface by spin coating. Then, the photoresist film is patterned into the plane shape of the capacitor electrodes (lower electrodes) 14 (see FIGS. 1A and 1B) by photolithography.

Next, with the photoresist film as the mask, the conduction film 14 is patterned by ion milling. Thus, the capacitor electrodes (lower electrodes) 14 with the openings 15 formed down to the insulation film 12 are formed.

Figure 2D:
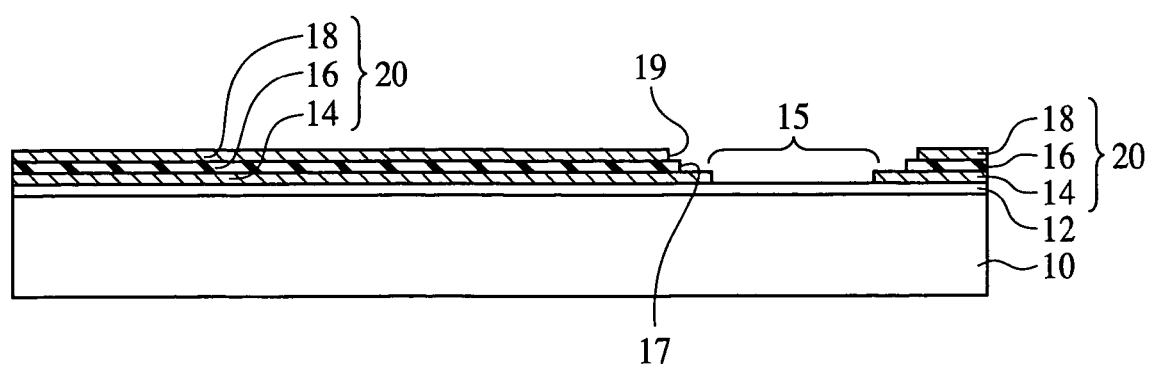
Figure 3A:
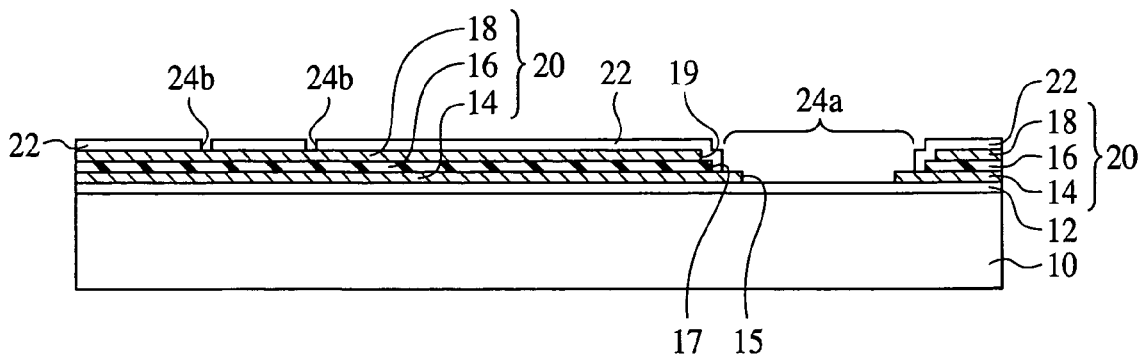
FIGS. 3A to 3C are sectional views of the thin-film capacitor according to the first embodiment of the present invention in the steps of the method for fabricating the thin-film capacitor, which illustrate the method (Part 2).
Figure 3B:
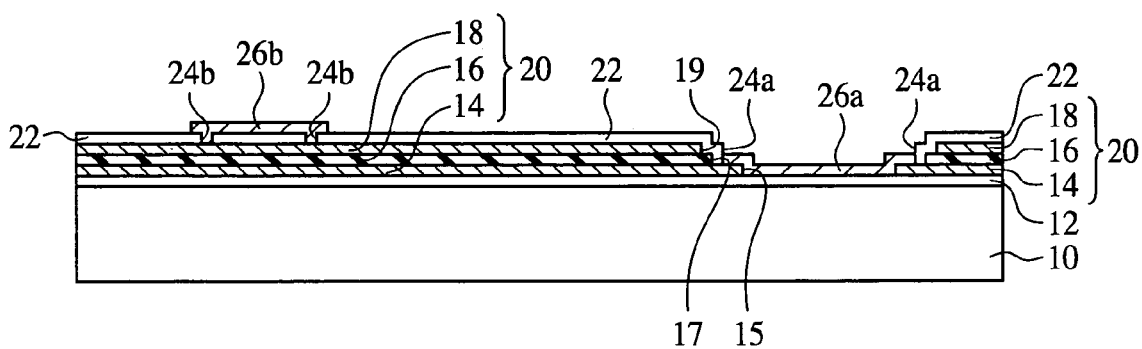
Figure 3C:
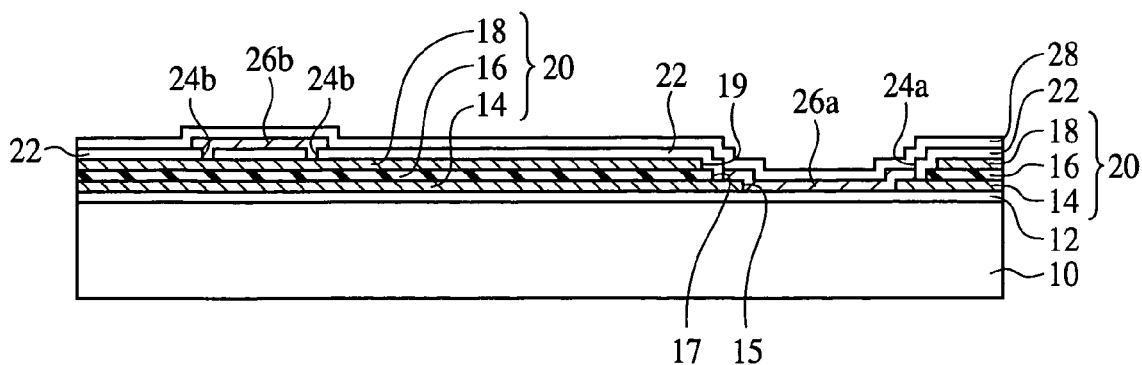

Thus, the capacitor parts 20 each including the capacitor electrode 14, the capacitor dielectric film 16 and the capacitor electrode 18 are formed (see FIG. 2D).

In the present embodiment, for the following reason, the capacitor electrodes 14, the capacitor dielectric film 16 and the capacitor electrodes 18 are continuously formed solid, and then the capacitor electrodes 18, the capacitor electrodes 16 and the capacitor electrodes 14 are sequentially patterned.

That is, if each time the capacitor electrodes 14, the capacitor dielectric film 16 and the capacitor electrodes 18 are respectively formed, the films are respectively patterned, the fabrication yield and the reliability of the capacitor parts 20 may be decreased due to dust and fins generated in each patterning. In contrast to this, in continuously forming the capacitor electrodes 14, the capacitor dielectric film 16 and the capacitor electrodes 18 solid, and then sequentially patterning the capacitor electrodes 18, the capacitor dielectric film 16 and the capacitor electrodes 14, there is no risk of the fabrication yield decrease and the reliability decrease due to the dust and fins. Accordingly, in the present embodiment, the capacitor electrodes 14, the capacitor dielectric film 16 and the capacitor electrodes 18 are continuously formed solid, and then the capacitor electrodes 18, the capacitor electrodes 16 and the capacitor electrodes 14 are sequentially patterned.

Then, the insulating barrier film 22 for preventing the diffusion of the hydrogen or water is formed on the entire surface by sputtering. The insulating barrier film 22 is, e.g., an amorphous BST film. The film thickness of the insulating barrier film 22 is, e.g., 50 nm.

Next, the openings 24a for exposing the capacitor electrodes 14 and the insulating film 12, and the openings 24b for partially exposing the capacitor electrodes 18 are formed in the insulating barrier film 22. The openings 24a are formed, exposing the inner edges of the capacitor electrodes 14, i.e., the peripheral edges of the openings 15 of the capacitor electrodes 14 (see FIG. 3A).

Then, on the entire surface, the conducting barrier film for preventing the diffusion of the hydrogen or water is formed by sputtering. The conducting barrier film is, e.g., amorphous TaSiN film. The film thickness of the conducting barrier film is, e.g., 100 nm.

Then, the conduction film is patterned by photolithography. Thus, the leading-out electrodes 26a of the conducting barrier film are formed on the insulation film 12 in the opening 24a and on the capacitor electrodes 14. On the insulating barrier film 22 and in the openings 24b, the leading-out electrodes 26b of the conducting barrier film are formed (see FIG. 3B).

Next, the insulating barrier film 28 for preventing the diffusion of the hydrogen or water is formed on the entire surface by sputtering. The insulating barrier film 28 is, e.g., amorphous aluminum oxide (alumina) film. The film thickness of the insulating barrier film 28 is, e.g., about 50 nm (see FIG. 3C).

Next, the protection film 30 is formed on the entire surface by, e.g., spin coating. The protection film 30 is, formed of, e.g., a photosensitive polyimide resin. The film thickness of the protection film 30 is, e.g., about 2 μm.

Figure 4A:
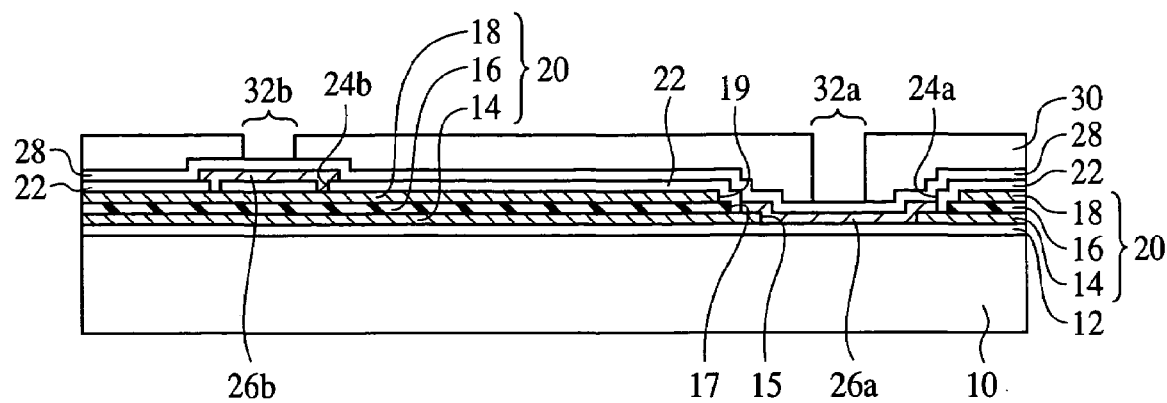
FIGS. 4A to 4C are sectional views of the thin-film capacitor according to the first embodiment of the present invention in the steps of the method for fabricating the thin-film capacitor, which illustrate the method (Part 3).
Figure 4B:
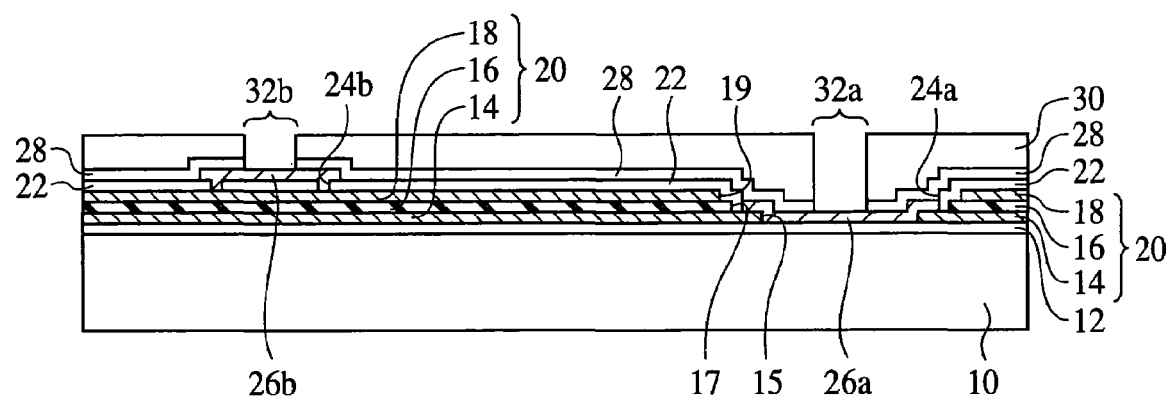

Then, the openings 32a, 32b are formed in the protection film 30 down to the insulating barrier film 28 by photolithography (see FIG. 4A).

Next, the insulating barrier film 28 exposed in the openings 32a, 32b is etched off. Thus, the openings 32a, 32b are formed in the protection film 30 and the insulating barrier film 28 down to the leading-out electrodes 26a, 26b (see FIG. 4B).

Then, a Ti film (not illustrated) and a Cu film (not illustrated) are sequentially laid by, e.g., sputtering to form the layer film. The layer film functions as the adhesion layer (not illustrated). The layer film also functions as the seed layer for the electroplating in the later step.

Then, a photoresist film (not illustrated) is formed on the entire surface by spin coating.

Then, openings (not illustrated) are formed in the photoresist film by photolithography. The openings are for forming the outside connection electrodes (pad electrodes) 34a, 34b.

Then, by electroplating, the outside connection electrodes 34a, 34b of, e.g., Ni are formed in the openings 32a, 32b and on the protection film 30 around the openings 32a, 32b.

Then, the solder bumps 36 are formed of, e.g., an Sn—Ag-based material by electroplating. Then, the photoresist film is released.

Next, the layer film exposed around the outside connection electrodes 34a, 34b is removed by wet etching.

Then, by a reflow furnace, the solder bumps 36 are melted into hemispheres.

Then, the base substrate 10 is diced into a prescribed size.

Figure 4C:
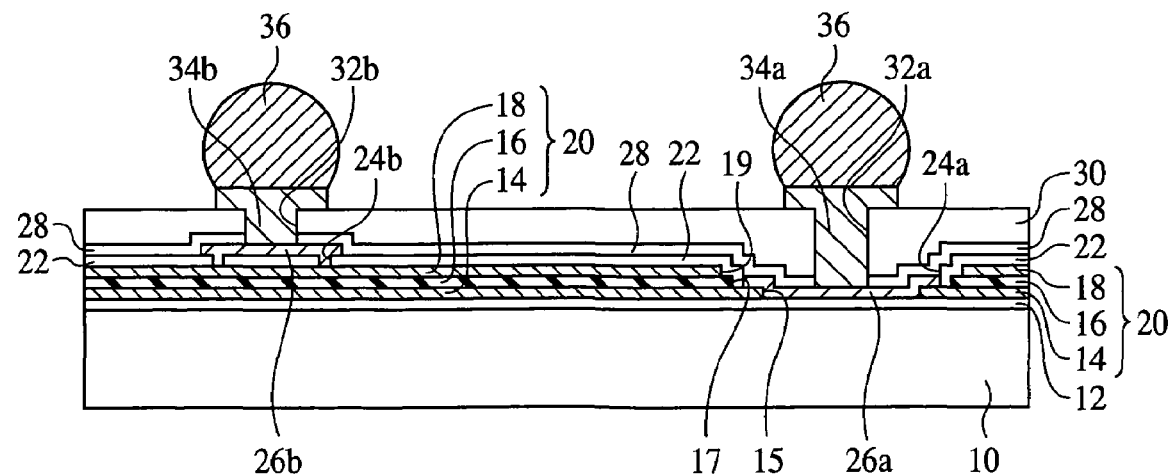

Thus, the thin-film capacitor according to the present embodiment is fabricated (see FIG. 4C).

(Evaluation Result)

The evaluation result of the thin-film capacitor according to the present embodiment will be explained.

Figure 22A:
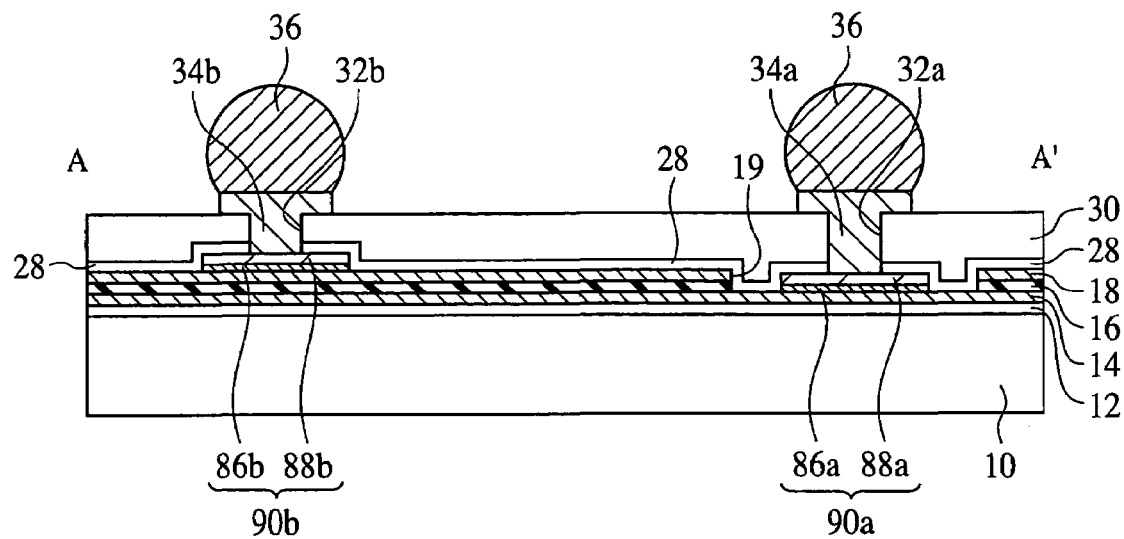
FIGS. 22A and 22B are a sectional view and a plan view of the thin-film capacitor according to a ninth embodiment of the present invention.
Figure 22B:
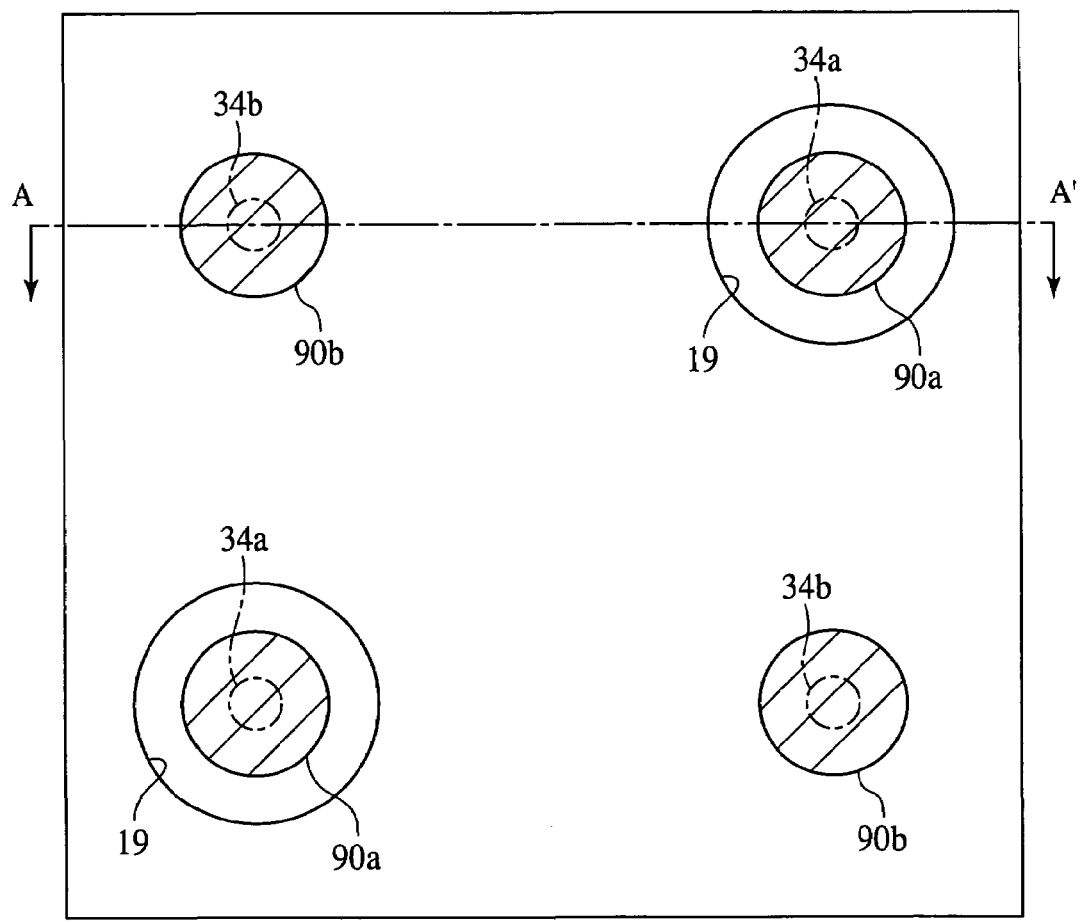

The capacitance per a unit area was measured on the proposed thin-film capacitor illustrated in FIGS. 22A and 22B. The capacitance was 5 μF/cm$^2$.

The capacitance per the unit area was measured on the thin-film capacitor according to the present embodiment was 5 μF/cm$^2$.

Based on this, it is found that the capacitance of the thin-film capacitor according to the present embodiment is equal to the capacitance per the unit area of the proposed thin-film capacitor illustrated in FIGS. 22A and 22B.

The insulation resistance was measured on the proposed thin-film capacitor illustrated in FIGS. 22A and 22B was about 50 MΩ at a 1.5 V applied voltage.

The insulation resistance was measured on the thin-film capacitor according to the present embodiment was above 10 GΩ at a 1.5 V applied voltage.

Based on this, it is found that the thin-film capacitor fabricating method according to the present embodiment can realize a thin-film capacitor of very high insulation resistance.

The PCBT (Pressure Cooker Bias Test) was made on the proposed thin-film capacitor illustrated in FIGS. 22A and 22B. The insulation resistance given in the PCBT was about 1 MΩ at a 1.5 V applied voltage. As the conditions for the PCBT test, the pressure was 2 atm.; the temperature was 125°

C.; the humidity was 85%; the applied voltage was 3 V; and the test period of time was 48 hours.

The PCBT was made on the thin-film capacitor according to the present embodiment. The insulation resistance given by the PCBT was about 1 GΩ at 1.5 V. The conditions for the PCBT test were the same as those for the PCBT on the proposed thin-film capacitor: the pressure was 2 atm.; the temperature was 125° C.; the humidity was 85%; the applied voltage was 3 V; and the test period of time was 48 hours.

Based on this, it is found that the present embodiment can drastically suppress the deterioration of the electric characteristics.

A Second Embodiment

Figure 5A:
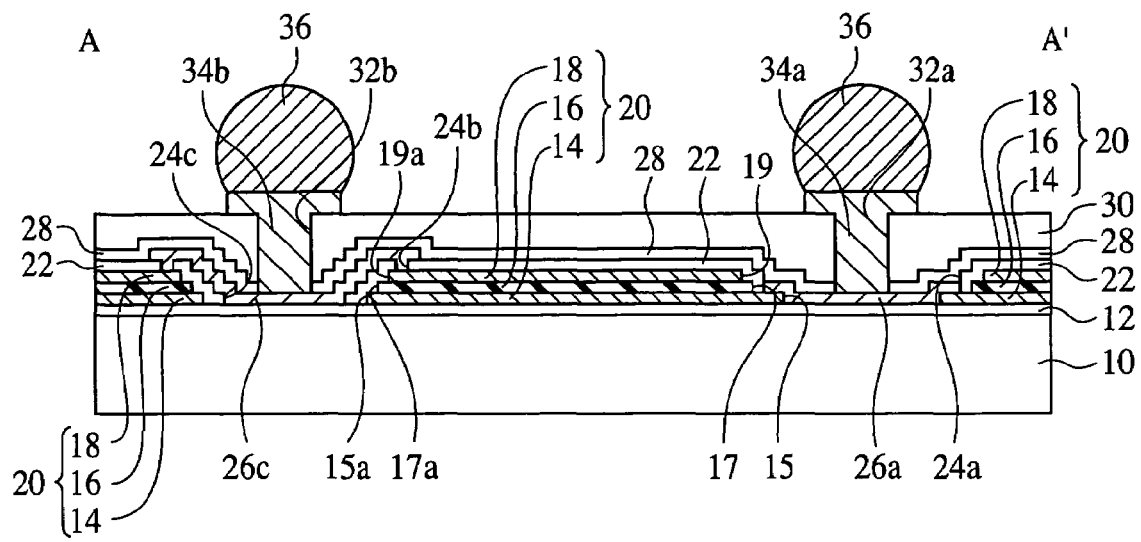
FIGS. 5A and 5B are a sectional view and a plan view of the thin-film capacitor according to a second embodiment of the present invention.
Figure 5B:
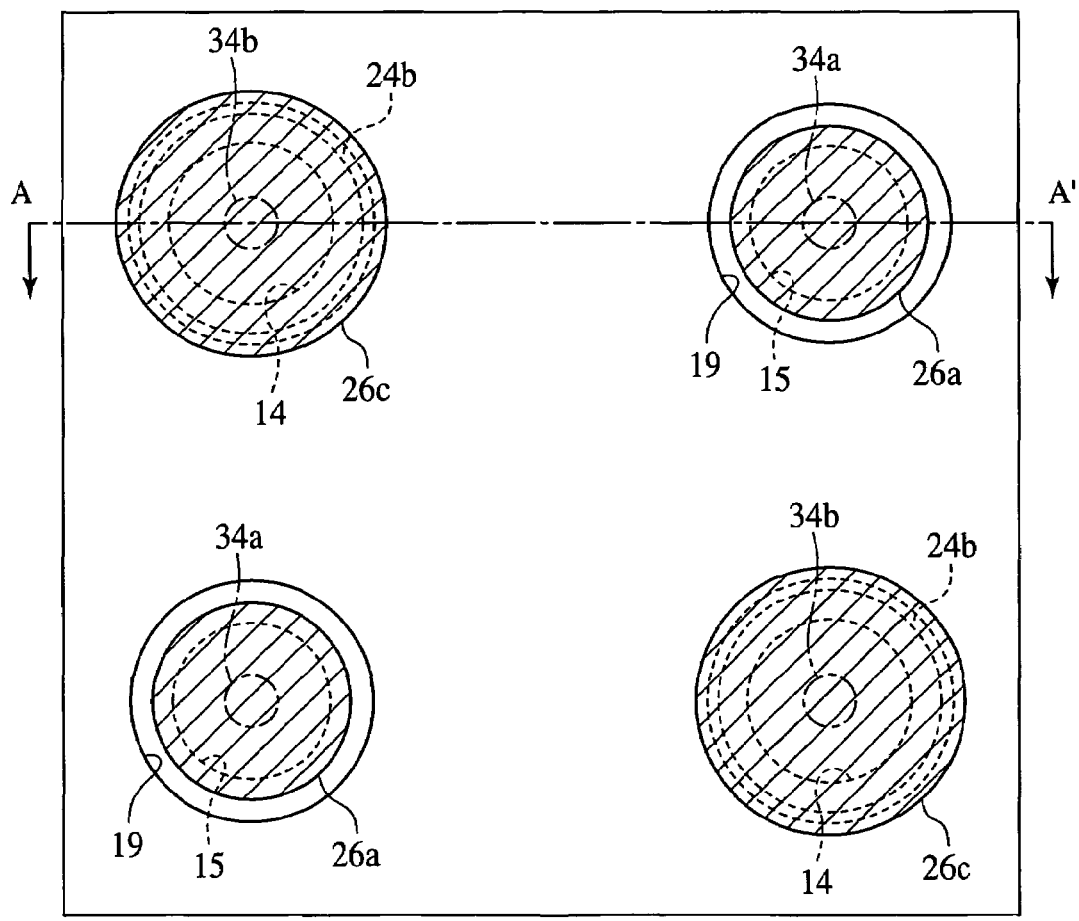

The thin-film capacitor according to a second embodiment of the present invention and the method for fabricating the thin-film capacitor will be explained with reference to FIGS. 5A to 8C. FIGS. 5A and 5B are a sectional view and a plan view of the thin-film capacitor according to the present embodiment. FIG. 5A is the sectional view along the line A-A' in FIG. 5B. The same members of the present embodiment as those of the thin-film capacitor according to the present embodiment and the method for fabricating the thin-film capacitor according to the first embodiment illustrated in FIG. 1A to 4C are represented by the same reference numbers not to repeat or to simply their explanation.

(The Thin-Film Capacitor)

The thin-film capacitor according to the present embodiment will be explained with reference to FIGS. 5A and 5B.

The thin-film capacitor according to the present embodiment is characterized in that the outside connection electrode 34b is formed in the opening 15a formed in the capacitor electrode 14.

As illustrated in FIGS. 5A and 5B, an insulation film 12 is formed on the surface of a base substrate 10.

An adhesion layer (not illustrated) of, e.g., TiO$_2$ is formed on the insulation film 12.

Capacitor electrodes (lower electrodes) 14 are formed on the insulation film 12. As the capacitor electrodes 14, a 100 nm-thickness Pt film, for example, is formed. Openings 15, 15a are formed in the capacitor electrodes 14 down to the insulation film 12.

A capacitor dielectric film 16 is formed on the capacitor electrodes 14. The capacitor dielectric film 16 is formed of, e.g., a high dielectric constant material. More specifically, the capacitor dielectric film 16 is formed of polycrystalline BST film. The film thickness of the capacitor dielectric film 16 is, e.g., 100 nm. Openings 17, 17a are formed in the capacitor dielectric film 16 down to the capacitor electrodes 14, corresponding to the openings 15, 15a. The diameter of the openings 17, 17a is larger than the diameter of the openings 15, 15a.

Capacitor electrodes (upper electrodes) 18 are formed on the capacitor dielectric film 16. The capacitor electrodes 18 are formed of, e.g., 100 nm-thickness Pt film. Openings 19, 19a are formed in the capacitor electrodes 18 down to the capacitor dielectric film 16. The openings 19 are formed, corresponding to the openings 15, 17. The openings 19a are formed, corresponding to the openings 15a, 17a. The diameter of the openings 19, 19a is larger than the diameter of the openings 17, 17a.

Thus, capacitor parts 20 each including the capacitor electrode 14, the capacitor dielectric film 16 and the capacitor electrode 18 are formed.

An insulating barrier film 22 for preventing the diffusion of the hydrogen or water is formed on the base substrate 10 with the capacitor parts 20 formed on. The insulation barrier film 22 is formed, covering the capacitor parts 20. The insulating barrier film 22 is formed of amorphous film of, e.g., the same material as the capacitor dielectric film. The insulating barrier film 22 is formed of amorphous BST film here. The film thickness of the insulating film 22 is, e.g., about 50 nm.

The insulating barrier film 22 is formed of amorphous film of, e.g., the same material as the capacitor dielectric film 16 here, but the material of the insulating barrier film 22 may be formed of a material different from that of the capacitor dielectric film 16.

In the insulating barrier film 22, openings 24a for exposing the inner edges of the capacitor electrodes 14 and the insulation film 12, openings 24b for partially exposing the capacitor electrodes 18 and openings 24c for exposing the insulation film 12 are formed.

Leading-out electrodes 26a of the conducting barrier film, which prevent the diffusion of the hydrogen or water are formed on the insulation film 12 and on the inner edges of the capacitor electrodes 14. Leading-out electrodes 26c of the conducting barrier film, which prevent the diffusion of the hydrogen or water are formed on the insulation barrier film 22 and in the openings 24b, 24c. The conducting barrier film forming the leading-out electrodes 26a, 26c is, e.g., TaSiN film. The thickness of the leading-out electrodes 26a, 26b is, e.g., about 100 nm.

On the insulating barrier film 22 and the leading-out electrodes 26a, 26b, an insulating barrier film 28 is further formed. The insulating barrier film 28 is formed of, e.g., amorphous aluminum oxide film. The film thickness of the insulating barrier film 28 is, e.g., about 50 nm.

On the insulating barrier film 28, a protection film 30 of, e.g., photosensitive polyimide is formed. The film thickness of the protection film 30 is, e.g., about 2 μm.

In the protection film 30 and the insulating barrier film 28, openings 32a are formed down to the leading-out electrodes 26a. In the protection film 30 and the insulating barrier film 28, openings 32b are formed down to the leading-out electrodes 26b.

In the openings 32a, 32b, a layer film (not illustrated) of Ti film and Cu film sequentially laid is formed. The layer film functions as an adhesion layer.

In the openings 32a, 32b with the layer film formed in, electrodes 34a, 34b for the connection to the outside are formed.

On the outside connection electrodes 34a, 34b, solder bumps 36 of, e.g., an Sn—Ag-based material are formed.

Thus, the thin-film capacitor according to the present embodiment is formed.

As described above, the thin-film capacitor according to the present embodiment is characterized mainly in that the outside connection electrodes 34a, 34b are provided in the openings 15, 15a with the capacitor electrodes 14 formed in.

According to the present embodiment, in which the outside connection electrodes 34a, 34b are provided in the openings 15, 15a with the capacitor electrodes 14 formed in, the stress generated in bonding the thin-film capacitors to a circuit board, etc. (not illustrated) is prohibited from being applied to the capacitor parts 20. Accordingly, the present embodiment can further improve the reliability.

(The Method for Fabricating the Thin-Film Capacitor)

Then, the method for fabricating the thin-film capacitor according to the present embodiment will be explained with reference to FIGS. 6A to 8C. FIGS. 6A to 8C are sectional views of the thin-film capacitor according to the present embodiment in the steps of the method for fabricating the thin-film capacitor, which illustrate the method.

First, the base substrate 10 with the insulation film 12 formed on is prepared. More specifically, a silicon substrate 10 with, e.g., the silicon oxide film 12 formed on is prepared.

Then, the base substrate 10 is loaded into the film forming chamber of a sputtering system (not shown). The sputtering system is, e.g., a multi-targets magnetron sputtering system.

Then, an adhesion layer (not illustrated) is formed of, e.g., a 100 nm-thickness $TiO_2$ film is formed on the entire surface by sputtering.

Then, a 100 nm-thickness conduction film 14, for example, is formed on the entire surface by sputtering.

Next, on the entire surface, the capacitor dielectric film 16 is formed of, e.g., a 100 nm-thickness polycrystalline BST film by sputtering.

Figure 6A:
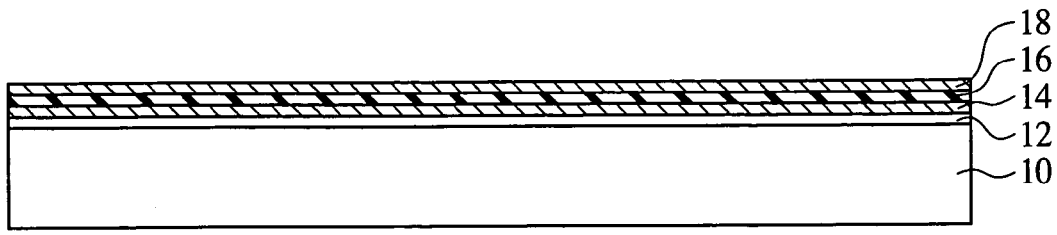
FIGS. 6A to 6D are sectional views of the thin-film capacitor according to the second embodiment of the present invention in the steps of the method for fabricating the thin-film capacitor, which illustrate the method (Part 1).
Figure 6B:
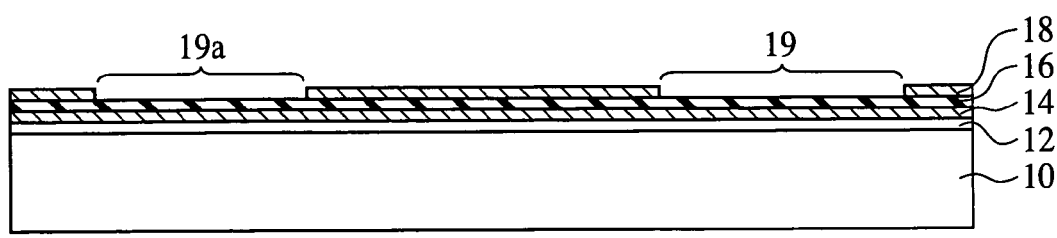
Figure 6C:
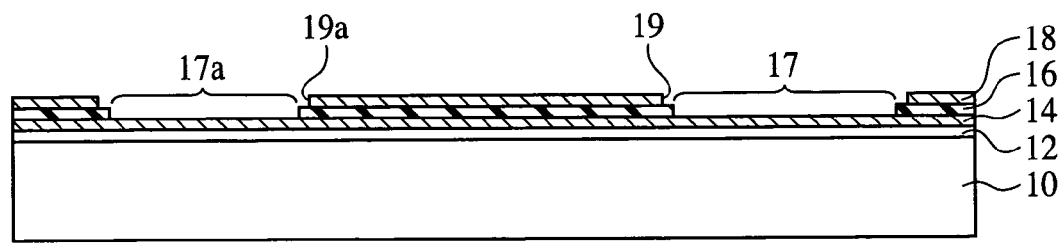
Figure 6D:
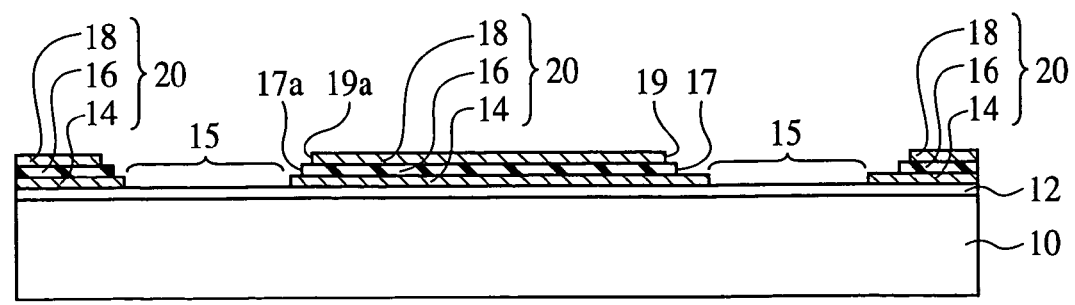

Next, on the entire surface, a conduction film 18 of, e.g., a 100 nm-thickness Pt film is formed by sputtering (see FIG. 6A).

Then, the base substrate 10 is unloaded out of the film forming chamber of the sputtering system.

Then, the conduction film 18 is patterned by photolithography. Thus, the capacitor electrodes 18 with the openings 19, 19a formed down to the capacitor dielectric film 16 are formed (see FIG. 6B).

Next, the capacitor dielectric film 16 is patterned by photolithography. Thus, the openings 17, 17a are formed in the capacitor dielectric film 16 (see FIG. 6C).

Then, the conduction film 14 is patterned by photolithography. Thus, the capacitor electrodes 14 with the openings 15, 15a formed down to the insulation film 12 are formed (see FIG. 6D).

Thus, the capacitor parts 20 each including the capacitor electrode 14, the capacitor dielectric film 16 and the capacitor electrode 18 are formed.

Then, the insulating barrier film 22 is formed on the entire surface by, e.g., sputtering. The insulating barrier film 22 is, e.g., a 50 nm-thickness amorphous BST film.

Figure 7A:
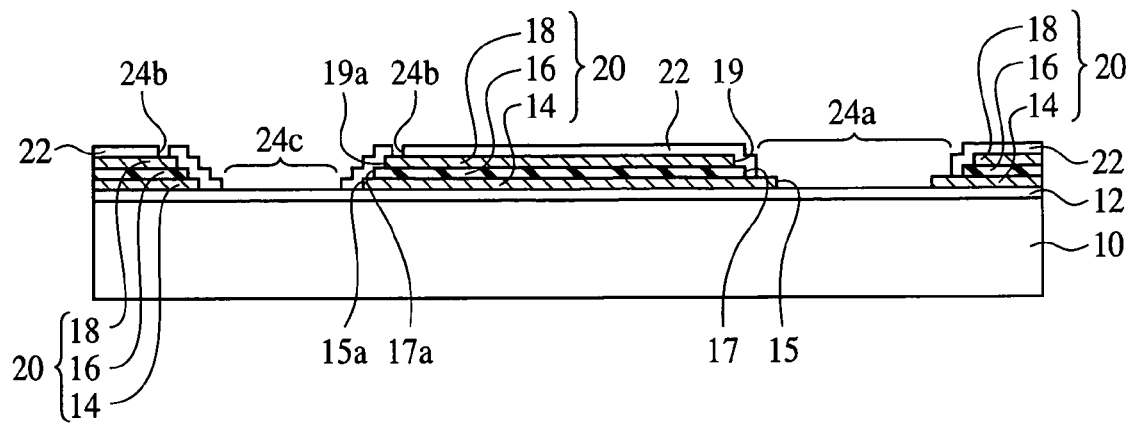
FIGS. 7A to 7C are sectional views of the thin-film capacitor according to the second embodiment of the present invention in the steps of the method for fabricating the thin-film capacitor, which illustrate the method (Part 2).
Figure 7B:
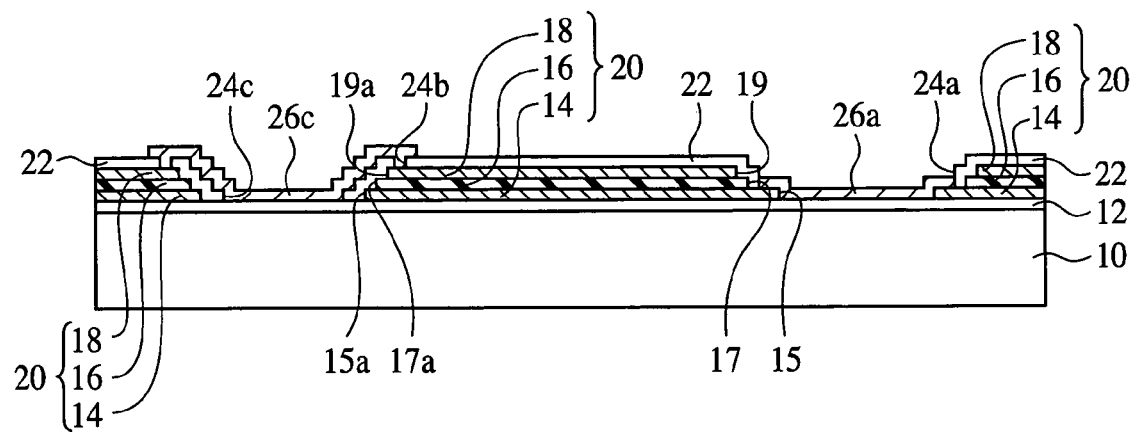

Then, in the insulating barrier film 22, the openings 24a for exposing the inner edges of the capacitor electrodes 14 and the insulation film 12, the openings 24b for partially exposing the capacitor electrodes 18 and the openings 24c for exposing the insulation film 12 are formed (see FIG. 7A).

Then, on the entire surface, the conducting barrier film for preventing the diffusion of the hydrogen or water is formed by, e.g., sputtering. The conducting barrier film is, e.g., a 100 nm-thickness amorphous TaSiN film.

Then, the conducting barrier film is patterned by photolithography. Thus, the leading-out electrodes 26a of the conducting barrier film are formed on the insulation film 12 and the inner edges of the capacitor electrodes 14. The leading-out electrodes 26c of the conducting barrier film are formed on the insulating barrier film 22 and in the openings 24b, 24c (see FIG. 7B).

Figure 7C:
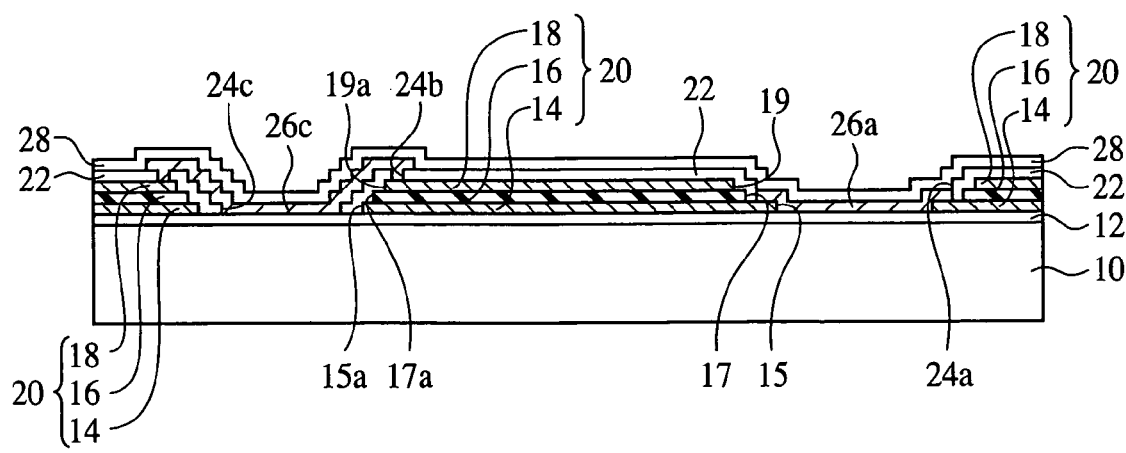

Then, the insulating barrier film 28 for preventing the diffusion of the hydrogen or water is formed on the entire surface by, e.g., sputtering. The insulating barrier film 28 is, e.g., amorphous aluminum oxide film. The film thickness of the insulating barrier film 28 is, e.g., about 50 nm (FIG. 7C).

Next, the protection film 30 of, e.g., photosensitive polyimide is formed on the entire surface by, e.g., spin coating. The thickness of the protection film 30 is, e.g., about 2 µm.

Figure 8A:
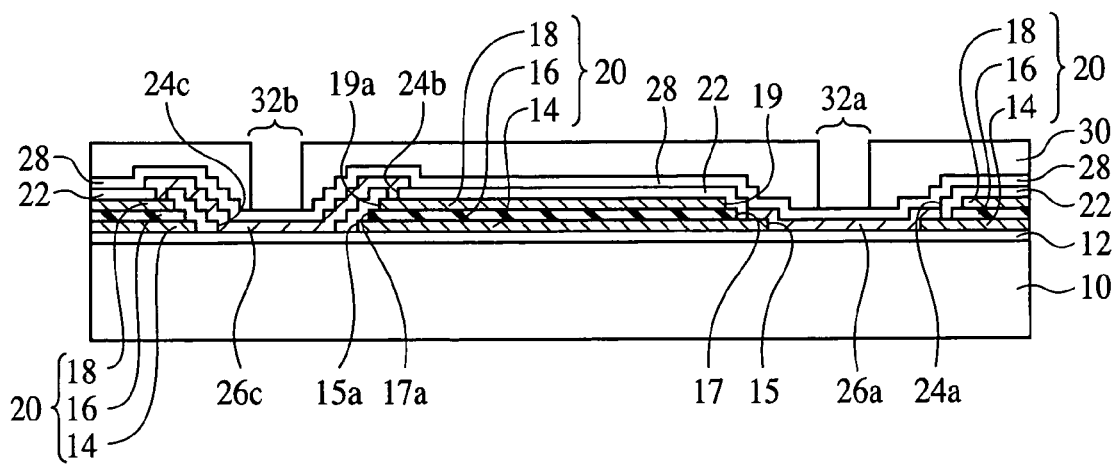
FIGS. 8A to 8C are sectional views of the thin-film capacitor according to the second embodiment of the present invention in the steps of the method for fabricating the thin-film capacitor, which illustrate the method (Part 3).
Figure 8B:
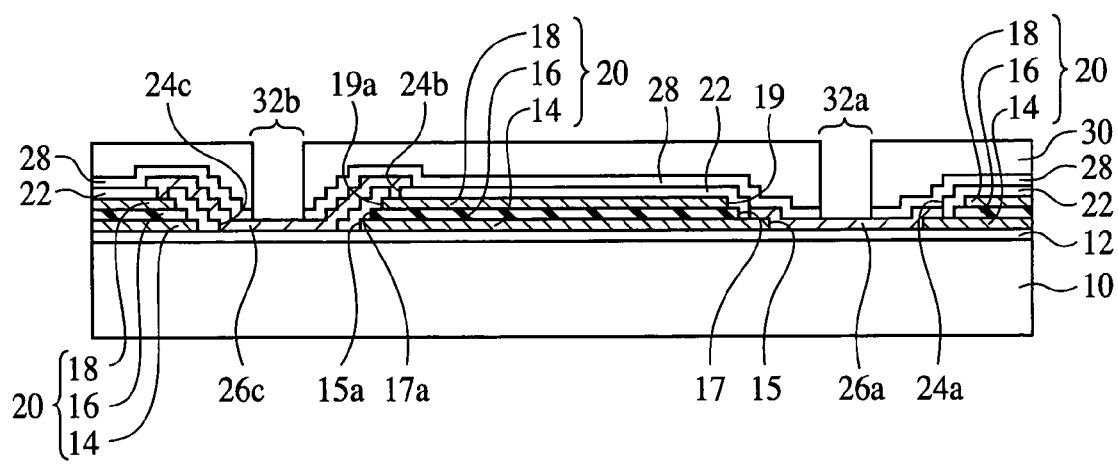

Then, the openings 32a, 32b are formed in the protection film 30 down to the insulating barrier film 28 by photolithography (see FIG. 8A).

Then, the insulating etching film 28 in the openings 32a, 32b is etched off. Thus, the openings 32a, 32b are formed in the protection film 30 and the insulating barrier film 28 down to the leading-out electrodes 26a, 26b (see FIG. 8B).

Then, the layer film (not illustrated) of a Ti film and a Cu film sequentially laid is formed by, e.g., sputtering. The layer film functions as an adhesion layer. The layer film functions as the seed layer for forming the outside connection electrodes 34a, 34b by electroplating in a later step.

Next, on the entire surface, a photoresist film (not illustrated) is formed by spin coating.

Then, openings (not illustrated) are formed in the photoresist film by photolithography. The openings are for forming the outside connection electrodes 34a, 34b.

Next, the outside connection electrodes 34a, 34b of, e.g., Ni are formed in the openings by electroplating.

Then, the solder bumps 36 are formed of, e.g., an Sn—Ag-based material by electroplating. Then, the photoresist film is released.

Next, the layer film exposed around the outside connection electrodes 34a, 34b is removed by wet etching.

Next, the solder bumps 36 are melted by reflow furnace and formed into a hemisphere.

Next, the base substrate 10 is diced into a prescribed size.

Figure 8C:
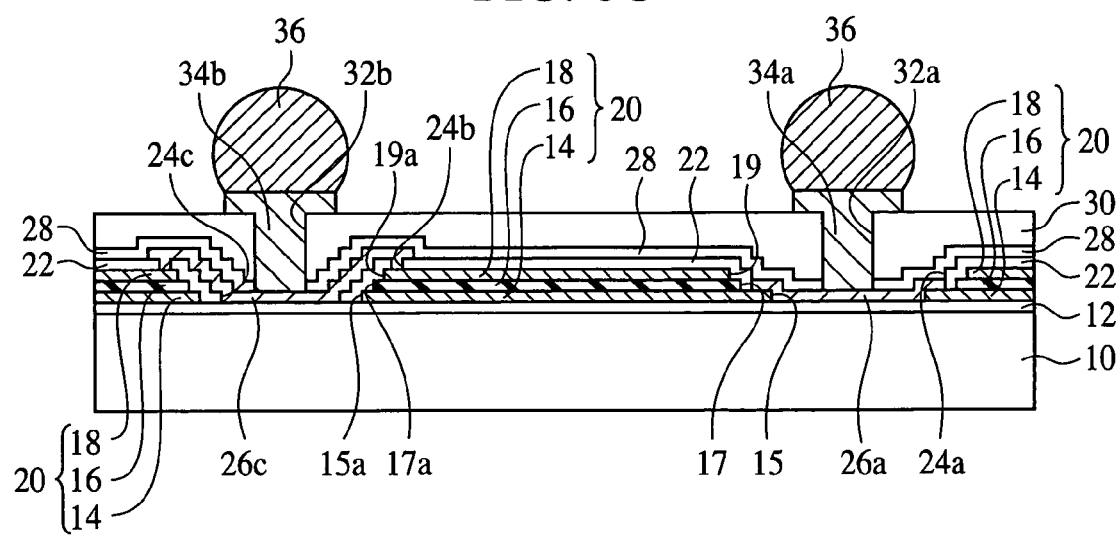

Then, the thin-film capacitor according to the present embodiment is fabricated (see FIG. 8C).

A Third Embodiment

Figure 9A:
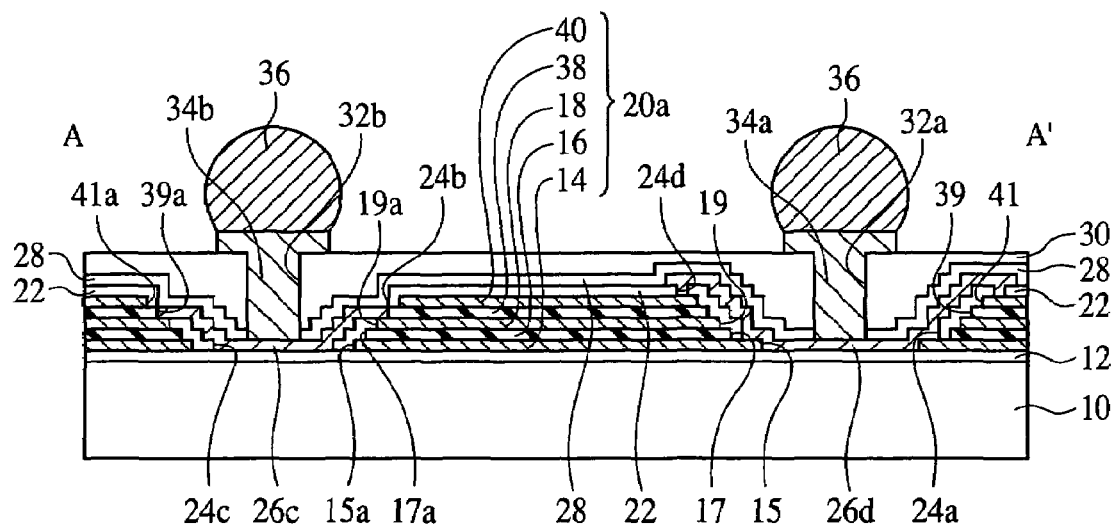
FIGS. 9A and 9B are a sectional view and a plan view of the thin-film capacitor according to a third embodiment of the present invention.
Figure 9B:
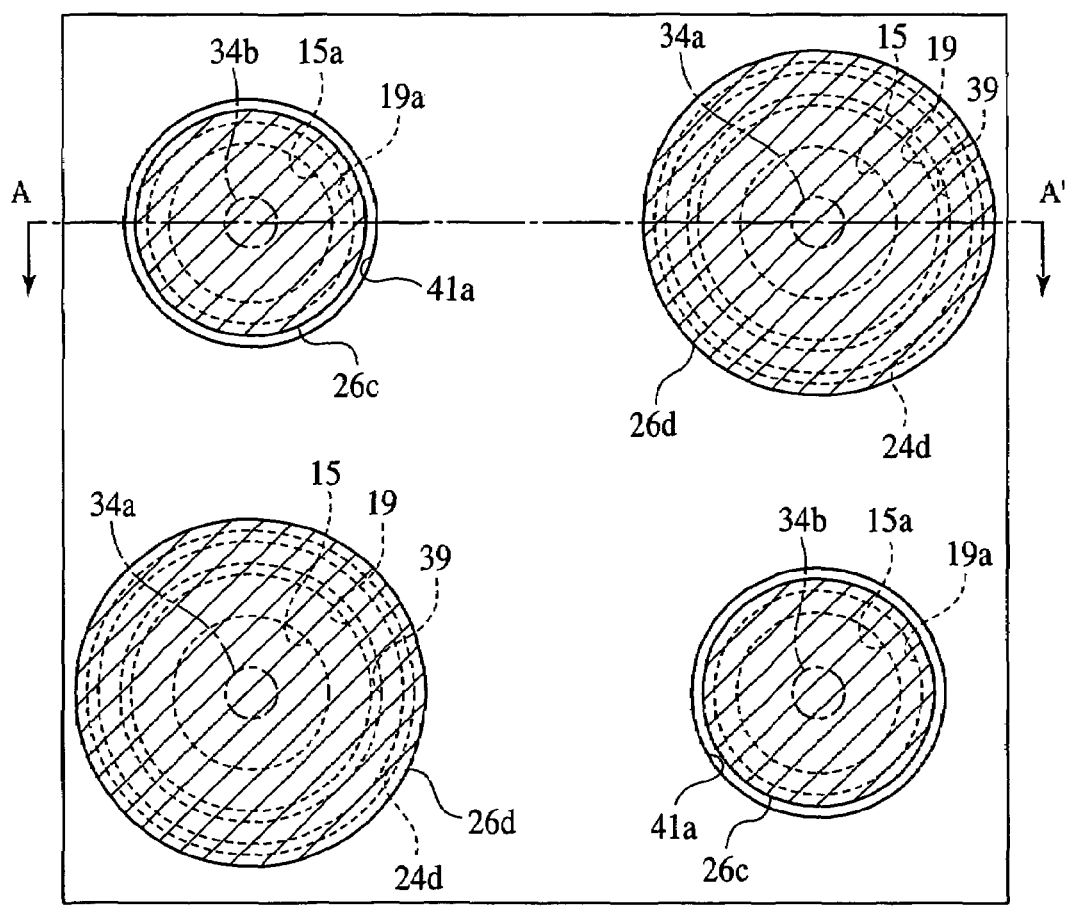

The thin-film capacitor according to a third embodiment of the present invention will be explained with reference to FIGS. 9A to 13B. FIGS. 9A and 9B are a sectional view and a plan view of the thin-film capacitor according to the present embodiment. FIG. 9A is the sectional view along the line A-A' line in FIG. 9B. The same members of the present embodiment as those of the thin-film capacitor according to the first or the second embodiment and the method for fabricating the thin-film capacitor illustrated in FIGS. 1A to 8C are represented by the same reference numbers not to repeat or to simplify their explanation.

The thin-film capacitor according to the present embodiment is characterized mainly in that a capacitor dielectric film 38 is further formed on the capacitor electrodes 18, and capacitor electrodes 40 are further formed on the capacitor dielectric film 38, and the capacitor electrodes 40 and the capacitor electrodes 14 are electrically connected to each other.

As illustrated in FIGS. 9A and 9B, the capacitor dielectric film 38 is formed on the capacitor electrodes 18. The capacitor dielectric film 38 is formed of a high dielectric constant material, as is the capacitor dielectric film 16, for example. More specifically, the capacitor dielectric film 38 is polycrystalline BST film. The film thickness of the capacitor dielectric film 38 is, e.g., 100 nm.

Capacitor electrodes 40 are formed on the capacitor dielectric film 38. The capacitor electrodes 40 are formed of, e.g., a 100 nm-thickness Pt film. The capacitor electrodes 40 are electrically connected to the capacitor electrode 14 via leading-out electrodes 26d which will be described later.

Thus, capacitor parts 20a each including the capacitor electrodes 14, the capacitor dielectric film 16, the capacitor electrode 18, the capacitor dielectric film 38 and the capacitor electrode 40 are formed.

On the base substrate 10 with the capacitor parts 20a formed on, an insulating barrier film 28 for preventing the diffusion of the hydrogen or water is formed. The insulating barrier film 28 is formed, covering the capacitor parts 20a. The insulating barrier film 28 is amorphous film of the same material as, e.g., the capacitor dielectric films 16, 38 are formed of. The capacitor dielectric film 28 is amorphous BST film here. The film thickness of the insulating barrier film 28 is, e.g., about 50 nm.

The insulating barrier film 28 is formed here of amorphous film of the same material as the capacitor dielectric films 16, 38 are formed of. However, the insulating barrier film 28 may be formed of a material different from the material of the capacitor dielectric films 16, 38.

Openings 24a for exposing the inner edges of the capacitor electrodes 14 and the insulating film 12, openings 24b for partially exposing the capacitor electrodes 18, openings 24c for exposing the surface of the insulation film 12 and openings 24d for partially exposing the capacitor electrodes 40 are formed in the insulating barrier film 22.

The leading-out electrodes 26d of the conducting barrier film, which prevent the diffusion of the hydrogen or water are formed in the openings 24d, on the insulating barrier film 22, on the inner edges of the capacitor electrodes 14 and on the insulating film 12. The leading-out electrodes 26c of the conducting barrier film which prevent the diffusion of the hydrogen or water are formed on the inner edges of the capacitor electrodes 18, on the insulating barrier film 22 and on the insulation film 12. The conducting barrier film forming the leading-out electrodes 26c, 26d is, e.g., iridium oxide ($IrO_2$) film. The film thickness of the leading-out electrodes 26c, 26d is, e.g., about 100 nm.

An insulating barrier film 28 is further formed on the insulating barrier film 22 and the leading-out electrodes 26c, 26d. The insulating barrier film 28 is, e.g., amorphous aluminum oxide film. The film thickness of the insulating barrier film 28 is, e.g., about 50 nm.

On the insulating barrier film 28, a protection film 30 of, e.g., photosensitive polyimide is formed. The thickness of the protection film 30 is, e.g., about 2 μm.

Openings 32a, 32b are formed in the protection film 30 and the insulating barrier film 28 down to the leading-out electrodes 26c, 26d.

A layer film (not illustrated) of a Ti film and a Cu film sequentially laid is formed in the openings 32a, 32b. The layer film functions as an adhesion layer. Outside connection electrodes 34a, 34b of Ni for connecting to the outside are formed in the openings 32a, 32b with the layer film formed in.

Solder bumps of, e.g., an Sn—Ag-based material are formed on the outside connection electrodes 34a, 34b.

Thus, the thin-film capacitor according to the present embodiment is fabricated.

As described above, the thin-film capacitor according to the present embodiment is characterized mainly in that the capacitor dielectric film 38 is further formed on the capacitor electrodes 18, the capacitor electrodes 40 are further formed on the capacitor dielectric film 38, and the capacitor electrodes 40 and the capacitor electrodes 14 are electrically connected by the leading-out electrodes 26d.

The thin-film capacitor according to the present embodiment can have the capacitor electrodes 14, 40 and the capacitor electrodes 16 opposed to each other over a large total area, whereby the thin-film capacitor have the larger capacitance increased.

(The Method for Fabricating the Thin-Film Capacitor)

Next, the method for fabricating the thin-film capacitor according to the present embodiment will be explained with reference to FIGS. 10A to 13B. FIGS. 10A to 13B are sectional views of the thin-film capacitor according to the present embodiment in the steps of the method for fabricating the thin-film capacitor, which illustrate the method.

First, the base substrate 10 with the insulation film 12 is prepared. More specifically, for example, a silicon substrate 10 with a silicon oxide film 12 formed on the surface is prepared.

Then, the base substrate 10 is loaded into the film forming chamber of a sputtering system (not illustrated). The sputtering system is, e.g., a multi-targets type magnetron sputtering system.

Then, an adhesion layer (not illustrated) is formed of, e.g., a 100 nm-thickness $TiO_2$ film on the entire surface by sputtering.

Then, the conduction film 14 of, e.g., a 100 nm-thickness Pt film is formed on the entire surface by sputtering.

Next, the capacitor dielectric film 16 of, e.g., a 100 nm-thickness polycrystalline BST film is formed on the entire surface by sputtering.

Next, the conduction film 18 of, e.g., a 100 nm-thickness Pt film is formed on the entire surface by sputtering.

Then, the capacitor dielectric film 38 of, e.g., a 100 nm-thickness BST film is formed on the entire surface by sputtering.

Figure 10A:
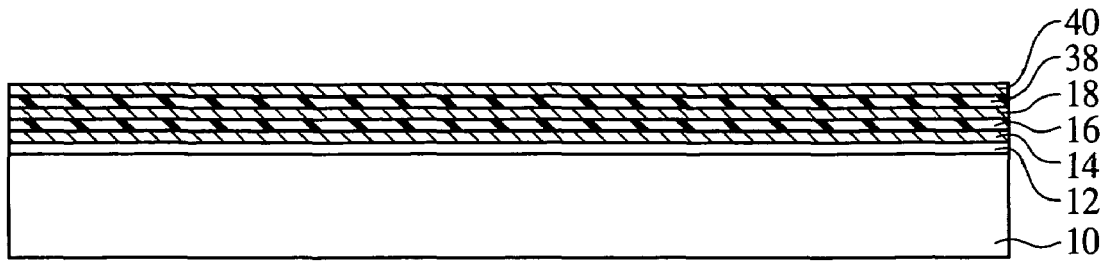
FIGS. 10A to 10D are sectional views of the thin-film capacitor according to the third embodiment of the present invention in the steps of the method for fabricating the thin-film capacitor, which illustrate the method (Part 1).
Figure 10B:
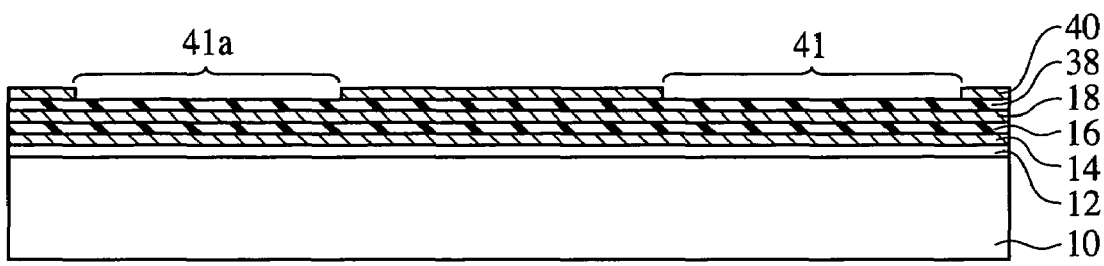
Figure 10C:
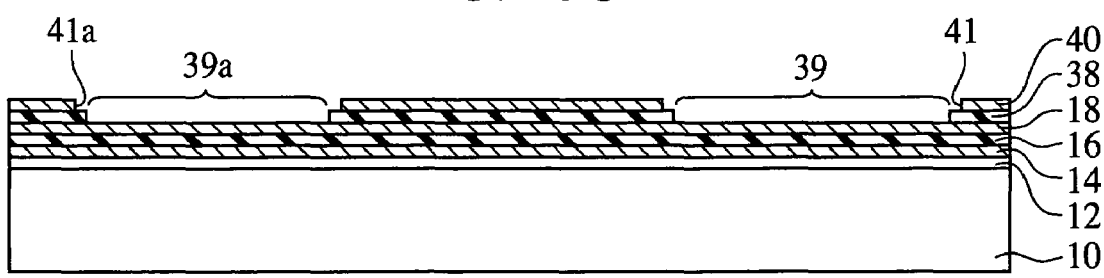
Figure 10D:
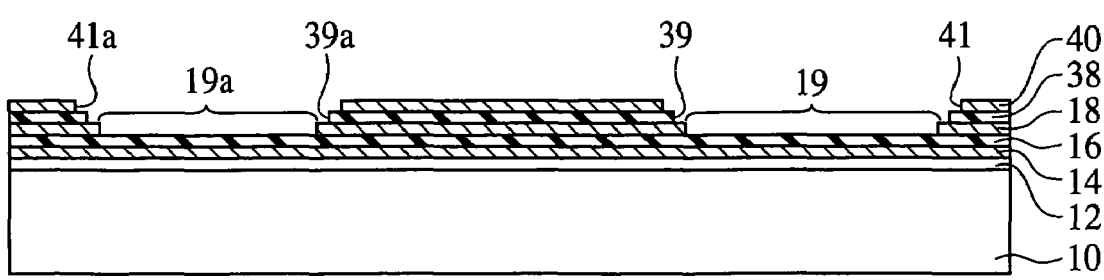

Then, the conduction film 40 of, e.g., a 100 nm-thickness Pt film is formed on the entire surface by puttering (see FIG. 10A).

Then, the base substrate 10 is unloaded out of the film forming chamber of the sputtering system.

Next, the conduction film 40 is patterned by photolithography. Thus, the capacitor electrodes 40 with the openings 41, 41a formed down to the capacitor dielectric film 38 are formed (see FIG. 10B).

Then, the capacitor dielectric film 38 is patterned by photolithography. Thus, the openings 41, 41a are formed in the capacitor dielectric film 38 down to the conduction film 18 (see FIG. 10C).

Next, the conduction film 18 is patterned by photolithography. Thus, the capacitor electrodes 18 with the openings 19, 19a formed down to the capacitor dielectric film 16 is formed (see FIG. 10D).

Then, the capacitor dielectric film 16 is patterned by photolithography. Thus, the openings 17, 17a are formed in the capacitor dielectric film 16 down to the conduction film 14 (see FIG. 11A).

Next, the conduction film 14 is patterned by photolithography. Thus, the capacitor electrodes 14 with the openings 15, 15a formed down to the insulation film 12 are formed (see FIG. 11B).

Thus, the capacitor parts 20a each including the capacitor electrode 14, the capacitor dielectric film 16, the capacitor electrode 18, the capacitor dielectric film 38 and the capacitor electrode 40 are formed.

Next, the insulating barrier film 22 of, e.g., a 50 nm-thickness amorphous BST film is formed on the entire surface by sputtering.

Figure 11A:
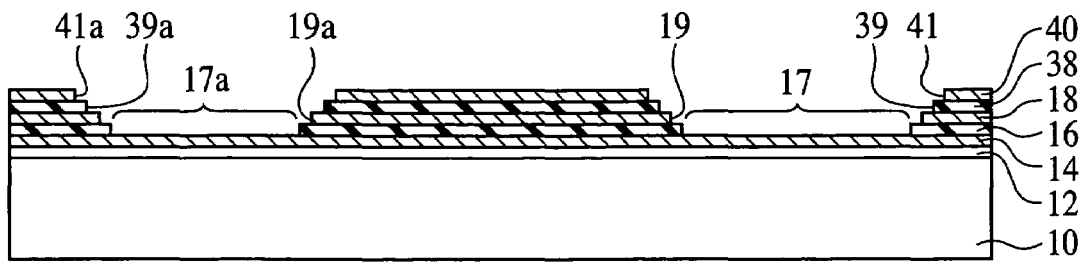
FIGS. 11A to 11C are sectional views of the thin-film capacitor according to the third embodiment of the present invention in the steps of the method for fabricating the thin-film capacitor, which illustrate the method (Part 2).
Figure 11B:
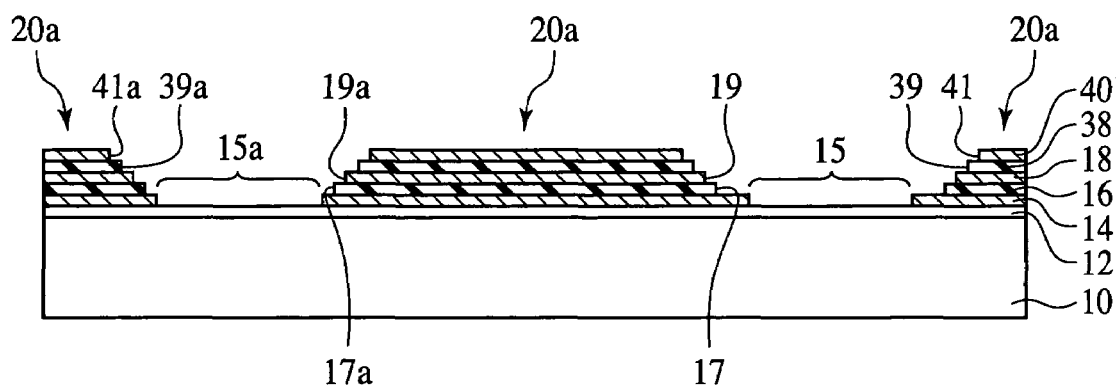
Figure 11C:
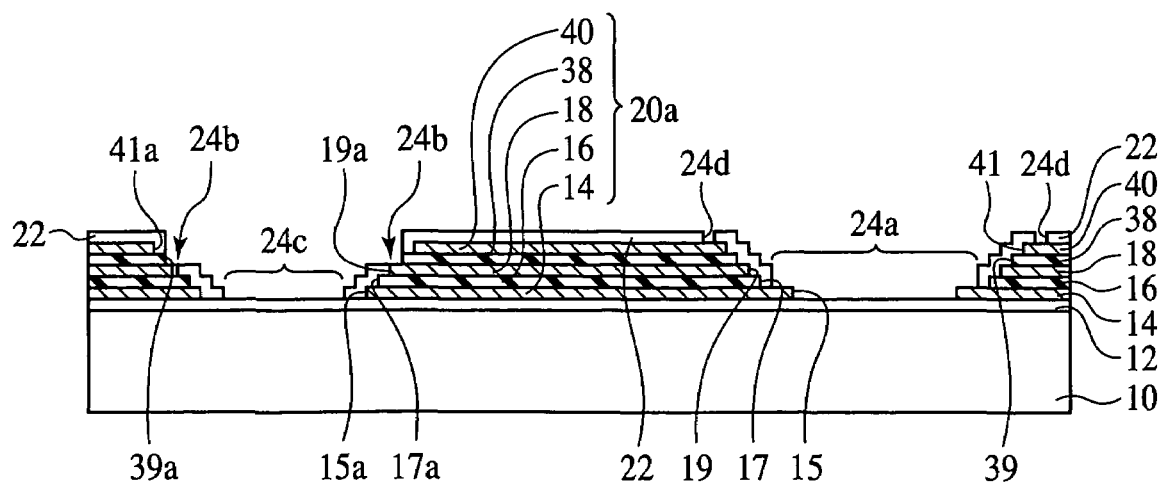

Next, the openings 24a for exposing the inner edges of the capacitor electrodes 14 and the insulation film 12, the openings 24b for partially exposing the capacitor electrodes 18, the openings 24c for exposing the insulation film 12 and the openings 24d for partially exposing the capacitor electrodes 40 are formed in the insulating barrier film 22 by photolithography (see FIG. 11C).

Then, the conducting barrier film for preventing the diffusion of the hydrogen or water is formed on the entire surface by sputtering. The conducting barrier film is, e.g., a 100 nm-thickness amorphous iridium oxide ($IrO_2$).

Then, the conducting barrier film is patterned by photolithography. Thus, the leading-out electrodes 26d of the conducting barrier film are formed on the insulation film 12 and the inner edges of the capacitor electrodes 14 in the openings 24a. The leading-out electrodes 26c of the conducting barrier film are formed on the inner edges of the capacitor electrodes 18, the insulating barrier film 22 and the insulation film 12 (see FIG. 12A).

Next, the insulating barrier film 28 for preventing the diffusion of the hydrogen or water is formed on the entire surface by sputtering. The insulating barrier film 28 is, e.g., amorphous aluminum oxide film. The film thickness of the insulating barrier film 28 is, e.g., about 50 nm (see FIG. 12B).

Then, the protection film 30 of, e.g., a photosensitive polyimide is formed on the entire surface by, e.g., spin coating. The thickness of the protection film 30 is, e.g., about 2 μm.

Figure 12A:
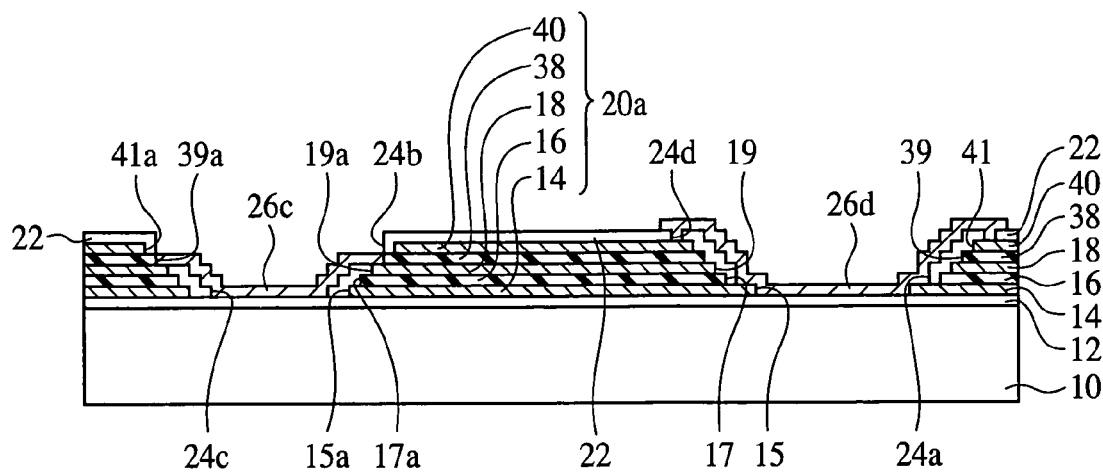
FIGS. 12A to 12C are sectional views of the thin-film capacitor according to the third embodiment of the present invention in the steps of the method for fabricating the thin-film capacitor, which illustrate the method (Part 3).
Figure 12B:
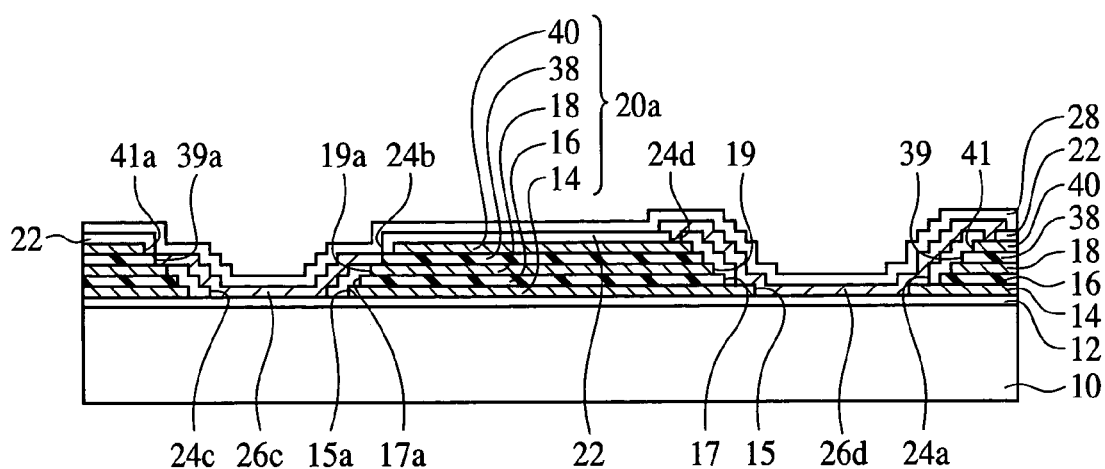
Figure 12C:
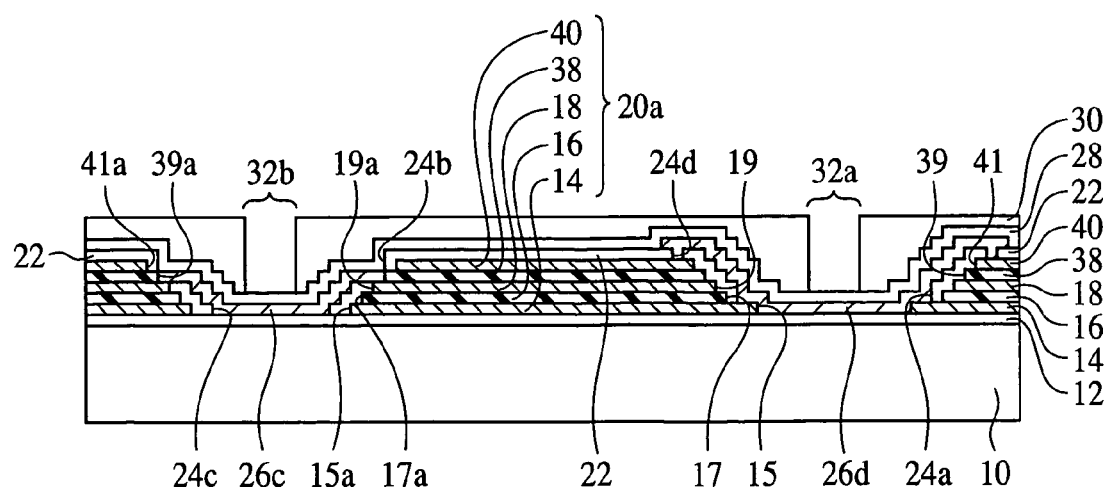

Next, the openings 32a, 32b are formed in the protection film 30 down to the insulating barrier film 28 by photolithography (see FIG. 12C).

Next, the insulating barrier film 28 exposed in the openings 32a, 32b is etched off. Thus, the openings 32a, 32b are formed in the protection film 30 and the insulating barrier film 28 down to the leading-out electrodes 26a, 26b.

Next, the layer film of a Ti film and a Cu film sequentially laid is formed by, e.g., sputtering.

Next, a photoresist film (not illustrated) is formed on the entire surface.

Then, openings are formed in the photoresist film by photolithography. The openings are for forming the outside connection electrodes 34a, 34b.

Next, the outside connection electrodes 34a, 34b of, e.g., Ni are formed in the openings 32a, 32b by electroplating.

Then, the solder bumps of, e.g., an Sn—Ag-based material are formed by electroplating. Then, the photoresist film is released.

Next, the layer film of the Cu film and the Ti film is removed by wet etching.

Next, the solder bumps 36 are melted by reflow furnace and formed into a hemisphere.

Next, the base substrate 10 is diced into a prescribed size.

Figure 13A:
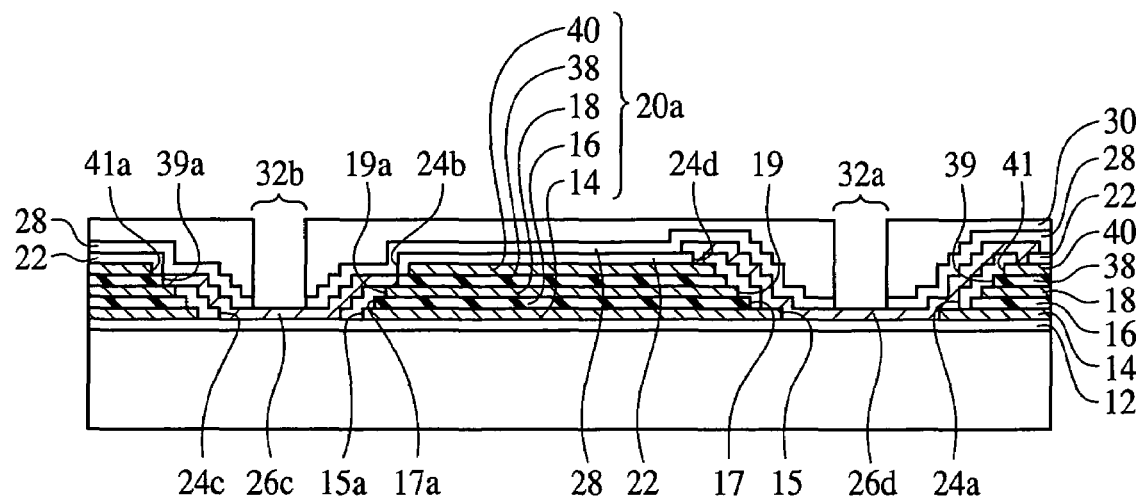
FIGS. 13A and 13B are sectional views of the thin-film capacitor according to the third embodiment of the present invention in the steps of the method for fabricating the thin-film capacitor, which illustrate the method (Part 4).
Figure 13B:
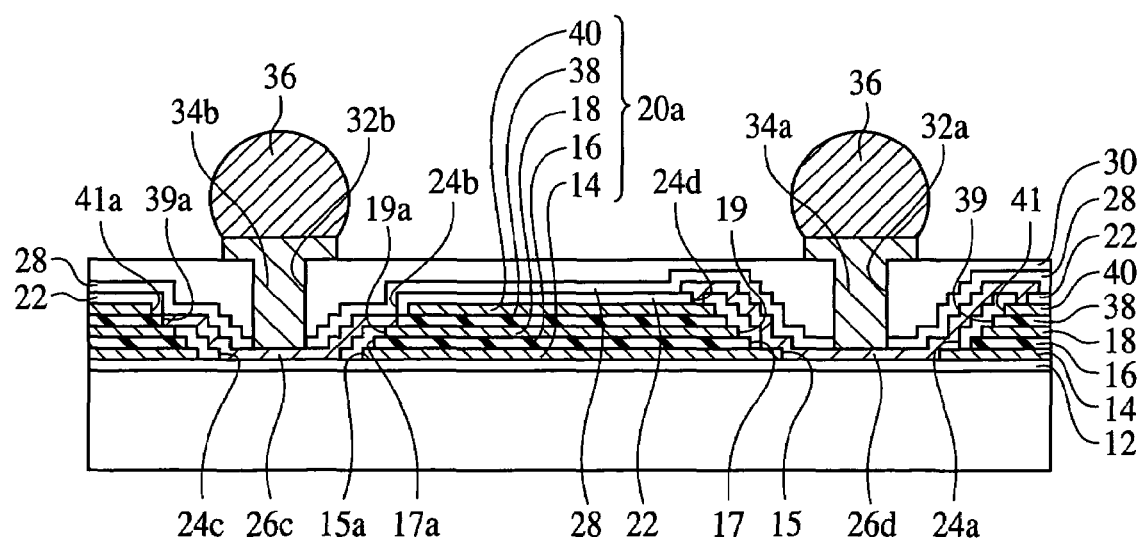

Thus, the thin-film capacitor according to the present embodiment is fabricated (see FIG. 13B).

(Evaluation Result)

The evaluation result of the thin-film capacitor according to the present embodiment will be explained.

The proposed thin-film capacitor illustrated in FIGS. 22A and 22B had a 5 μF/cm$^2$ capacitance per the unit area, as described above.

The capacitance was measured on the thin-film capacitor according to the present embodiment. The capacitance was 9 μF/cm$^2$.

Based on this, it is found that the present embodiment can realize a thin-film capacitor having a large capacitance per a unit area. The present embodiment can realize a thin-film capacitor of a large capacitance per a unit area because of the capacitor electrodes 14, 30 formed respectively above and below the capacitor electrodes 18.

The proposed thin-film capacitor illustrated in FIGS. 22A and 22B had the insulation resistance of an about 50 MΩ at a 1.5 V applied voltage.

The insulation resistance was measured on the thin-film capacitor according to the present embodiment. The insulation resistance was 10 GΩ or above at a 1.5 V applied voltage.

Based on this, it is found that the present embodiment can realize a thin-film capacitor having a very high insulation resistance.

The proposed thin-film capacitor illustrated in FIGS. 22A and 22B had an about 1 MΩ insulation resistance after a PCBT at a 1.5 V applied voltage. As the conditions for the PCBT, the pressure was 2 atm.; the temperature was 125° C.; the humidity was 85%; the applied voltage was 3 V; and the test period of time was 48 hours.

The PCBT was made on the thin-film capacitor according to the present embodiment. The insulation resistance after the PCBT was about 1 GΩ at a 1.5 V applied voltage. The conditions for the PCBT were the same as those of the PCBT made on the proposed thin-film capacitor: the pressure was 2 atm.; the temperature was 125° C.; the humidity was 85%; the applied voltage was 3 V; and the test period time was 48 hours.

Based on this, the present embodiment can drastically suppress the deterioration of the electric characteristics.

A Fourth Embodiment

Figure 14:
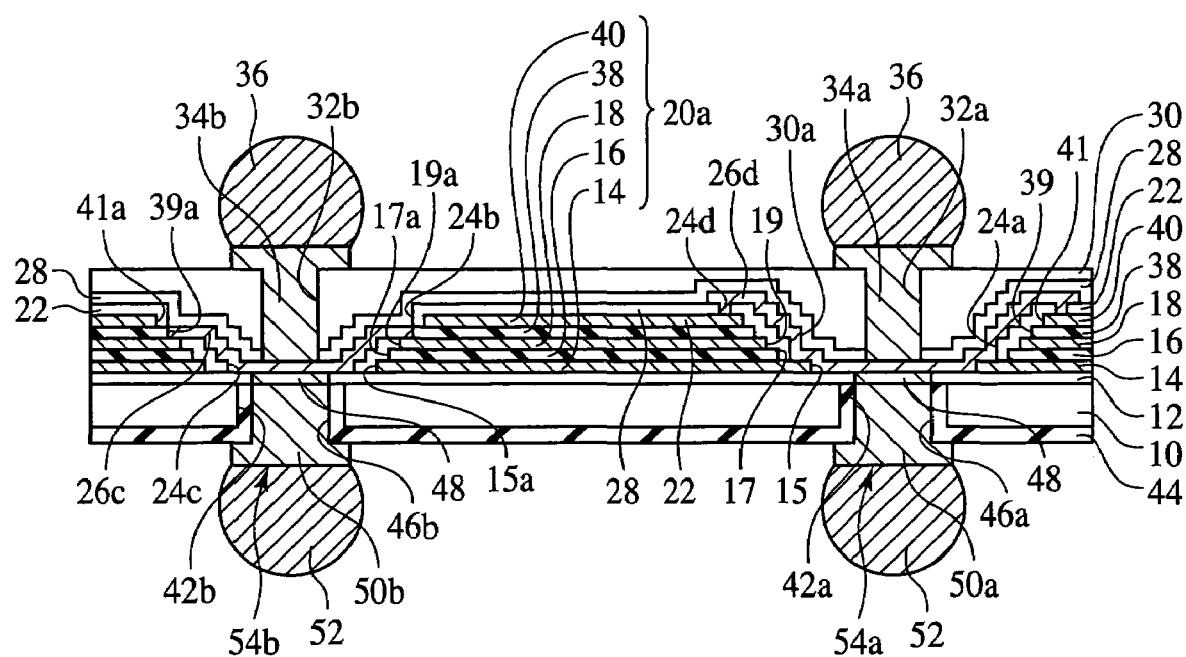
FIG. 14 is a sectional view of the thin-film capacitor according to a fourth embodiment of the present invention.

The thin-film capacitor according to the present embodiment and the method for fabricating the thin-film capacitor will be explained with reference to FIGS. 14 to 17. FIG. 14 is a sectional view of the thin-film capacitor according to the present embodiment. The same members of the present embodiment as those of the thin-film capacitor according to the first to the third embodiments and the method for fabricating the thin-film capacitor illustrated in FIGS. 1A to 13B are represented by the same reference numbers not to repeat or to simplify their explanation.

The thin-film capacitor according to the present embodiment functions as an interposer. The interposer is disposed, e.g., between a circuit board, etc. and a semiconductor device (LSI), etc. In the specification and the claims of the present application, the thin-film capacitor includes the inter-poser.

As illustrated in FIG. 14, an insulation film 12 is formed on a base substrate 10.

An adhesion layer of, e.g., a 100 nm-thickness titanium oxide ($TiO_2$) film is formed on the insulation film 12.

On the adhesion layer, capacitor electrode 14 of, e.g., a 100 nm-thickness Pt film are formed. Openings 13, 13a are formed in the capacitor electrodes 14 down to the insulation film 12.

A capacitor dielectric film 16 of, e.g., a 100 nm-thickness BST film is formed on the capacitor electrodes 12. Openings 15, 15a are formed in the capacitor dielectric film 16 down to the capacitor dielectric film 14. The openings 15, 15a are formed, corresponding to the openings 13, 13a.

Capacitor electrodes 18 of, e.g., a 100 nm-thickness Pt film of are formed on the capacitor dielectric film 16. Openings 19, 19a are formed in the capacitor electrodes 18 down to the capacitor dielectric film 16. The openings 19, 19a are formed, corresponding to the openings 13, 13a.

On the capacitor electrodes 18, a capacitor dielectric film 38 is formed of, e.g., a 100 nm-thickness BST film. Openings 39, 39a are formed in the capacitor dielectric film 38 down to the capacitor electrodes 18. The openings 39, 39a are formed, corresponding to the openings 13, 13a.

On the capacitor dielectric film 38, capacitor electrodes 40 of, e.g., a 100 nm-thickness Pt film are formed. The capacitor electrodes 40 are electrically connected to the capacitor electrodes 14 via leading-out electrodes 26d. Openings 41, 41a are formed in the capacitor electrodes 40 down to the capacitor dielectric film 38. The openings 41, 41a are formed, corresponding to the openings 13, 13a.

Thus, capacitor parts 20a each including the capacitor electrode 14, the capacitor dielectric film 16, the capacitor electrode 18, the capacitor dielectric film 38 and the capacitor electrode 40 are formed.

An insulating barrier film 22 for preventing the diffusion of the hydrogen or water is formed on the base substrate 10 with the capacitor parts 20a formed on. The insulating barrier film 22 is formed, covering the capacitor parts 20a. The insulating barrier film 22 is amorphous film of the same material as, e.g., the capacitor dielectric film 16. The insulating film 22 is, e.g., a 50 nm-thickness amorphous BST film here.

The insulating barrier film 22 is formed of an amorphous film of the same material as the capacitor dielectric films 16, 38 here. The insulating barrier film 22 may be formed of material different from the material forming the capacitor dielectric films 16, 38.

Openings 24a for exposing the inner edges of the capacitor electrodes 14 and the insulation film 12, openings 24d for partially exposing the capacitor electrodes 40, openings 24c for exposing the insulation film 12 and openings 24b for exposing the inner edges of the capacitor electrodes 18 are formed in the insulating barrier film 22.

The leading-out electrodes 26d of a conducting barrier film, which prevents the diffusion of the hydrogen or water are formed in the openings 24d, on the insulating barrier film 22, on the inner edges of the capacitor electrodes 14 and on the insulation film 12. Leading-out electrodes 26c of the conducting barrier film, which prevents the diffusion of the hydrogen or water are formed on the inner edges of the capacitor electrodes 18, on the insulating barrier film 22 and on the insulation film 12. The conducting barrier film forming the leading-out electrodes 26c, 26d is, e.g., a 100 nm-thickness iridium oxide ($IrO_2$) film.

An insulation film 28 is further formed on the insulating barrier film 22 and the leading-out electrodes 26c, 26d. The insulating barrier film 28 is, e.g., a 50 nm-thickness amorphous aluminum oxide film.

A protection film 30 of, e.g., a 2 μm-thickness photosensitive polyimide film is formed on the insulating barrier film 28.

In the protection film 30 and the insulating barrier film 28, openings 32a, 32b are formed down to the leading-out electrodes 26c, 26d.

A layer film (not illustrated) of a Ti film and a Cu film sequentially laid is formed in the openings 32a, 32b.

Partial electrodes 34a, 34b of, e.g., Ni are formed in the openings 32a, 32b with the layer film formed in. The partial electrodes 34a, 34b are parts of through-electrodes 54a, 54b.

On the partial electrodes 34a, 34b, solder bumps 36 of, e.g., an Sn—Ag-based material.

Through-holes 42a, 42b are formed in the base substrate 10 and the insulation film down to the leading-out electrodes 26c, 26d.

An insulating film 44 of, e.g., a resin is formed in the through-holes 42a, 42b and on the underside of the base substrate 10 (opposed to the side where the capacitor parts 20a formed on).

Through-holes 46a, 46b are formed in the insulation film 12 and the insulation film 44 down to the leading-out electrodes 26c, 26d.

A conducting barrier film 48 for preventing the diffusion of the hydrogen or water is formed on the underside of the leading-out electrodes 26c, 26d in the openings 46a, 46b (opposed to the side contacting the partial electrodes 34a, 34b).

In the through-holes with the insulation film 44 and the conducting barrier film 48 formed in, partial electrodes 50a, 50b of, e.g., Ni are formed. The partial electrodes 50a, 50b are parts of the through-electrodes 54a, 54b. The partial electrodes 34a and the partial electrodes 54a form the through-electrodes 54a. The partial electrodes 34b and the partial electrodes 54b form the through-electrodes 54b.

Solder bumps 52 of, e.g., an Sn—Ag-based material are formed on the underside of the partial electrodes 50a, 50b (opposed to the side contacting the conducting barrier film 48).

Thus, the thin-film capacitor 4 according to the present embodiment is formed.

The thin-film capacitor according to the present embodiment is disposed, e.g., between a circuit board (not illustrated) and an LSI (not illustrated). The thin-film capacitors are disposed between the circuit board and the LSI, whereby the inductance between the LSI and the capacitor parts 20a can be made very small. Thus, according to the present embodiment, the source voltage change, radio-frequency noises, etc. can be more surely removed.

(The Method for Fabricating the Thin-Film Capacitor)

Then, the method for fabricating the thin-film capacitor according to the present embodiment will be explained with reference to FIGS. 15A to 17. FIGS. 15A to 17 are sectional views of the thin-film capacitor according to the present embodiment in the steps of the method for fabricating the thin-film capacitor, which illustrate the method.

Figure 15A:
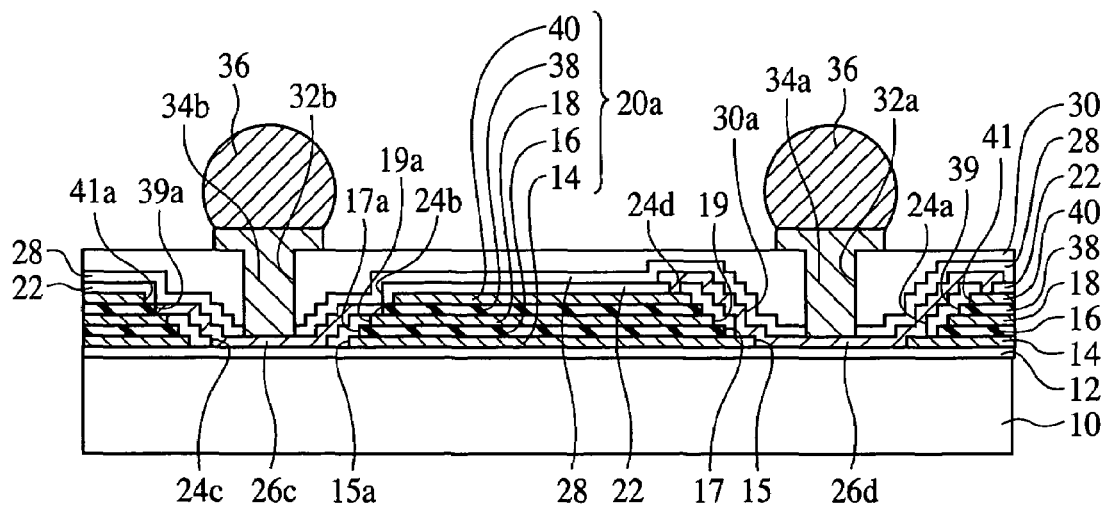
FIGS. 15A to 15C are sectional views of the thin-film capacitor according to the fourth embodiment of the present invention in the steps of the method for fabricating the thin-film capacitor, which illustrate the method (Part 1).

First, the step of preparing the base substrate 10 with the insulation film 12 formed on the surface to the step of forming the solder bumps 36 on the partial electrodes 34a, 34b are the same as those of the method for fabricating the thin-film capacitor according to the third embodiment illustrated in FIG. 10A to FIG. 13B, and their explanation will not be repeated (see FIG. 15A).

Then, the front side of the base substrate 10 (where the protection film 30, the solder bumps 36, etc. are formed) is adhered to a base (supporting substrate) with, e.g., an adhesive tape (not illustrated). The adhesive tape is, e.g., a UV tape. The UV tape is a tape having the property that the tape is very adhesive when applied and when UV is applied, abruptly becomes less adhesive.

Figure 15B:
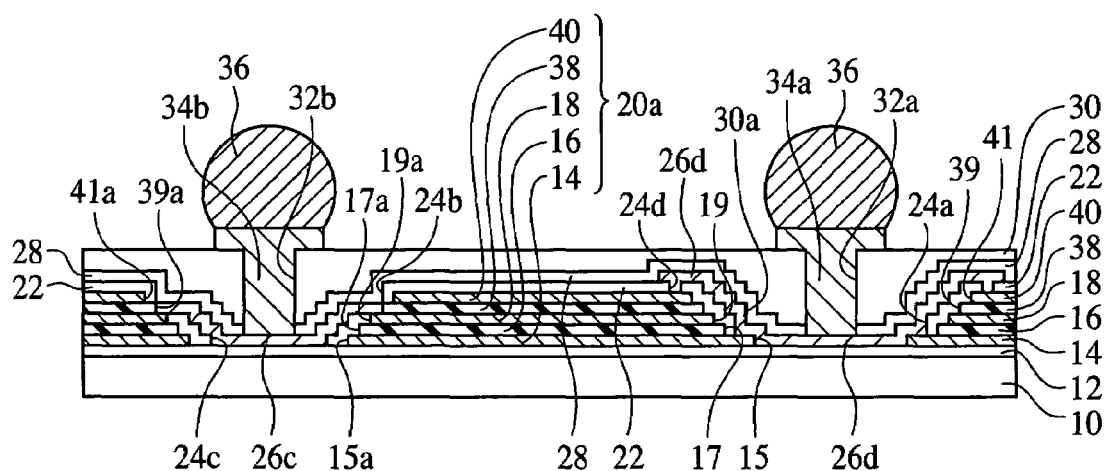
Figure 15C:
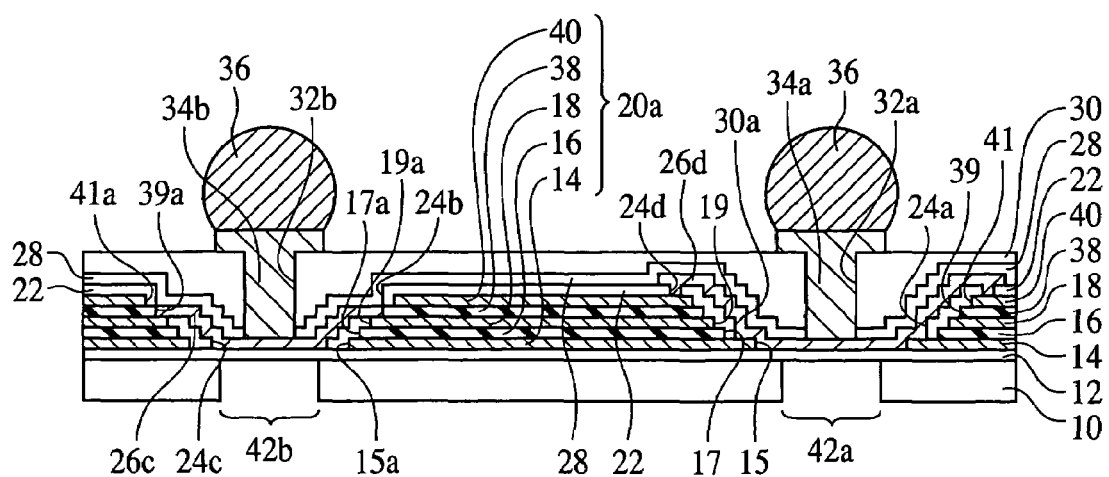
Figure 16A:
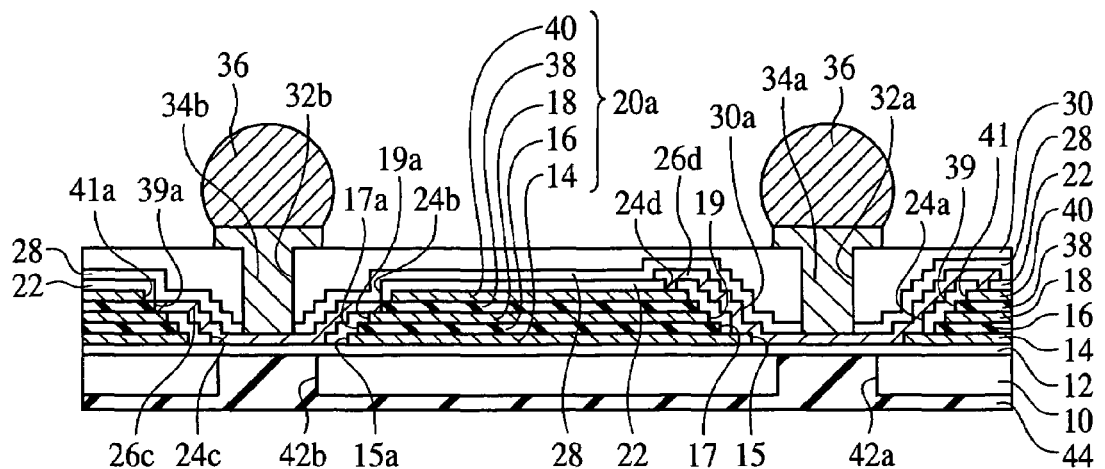
FIGS. 16A to 16C are sectional views of the thin-film capacitor according to the fourth embodiment of the present invention in the steps of the method for fabricating the thin-film capacitor, which illustrate the method (Part 2).
Figure 16B:
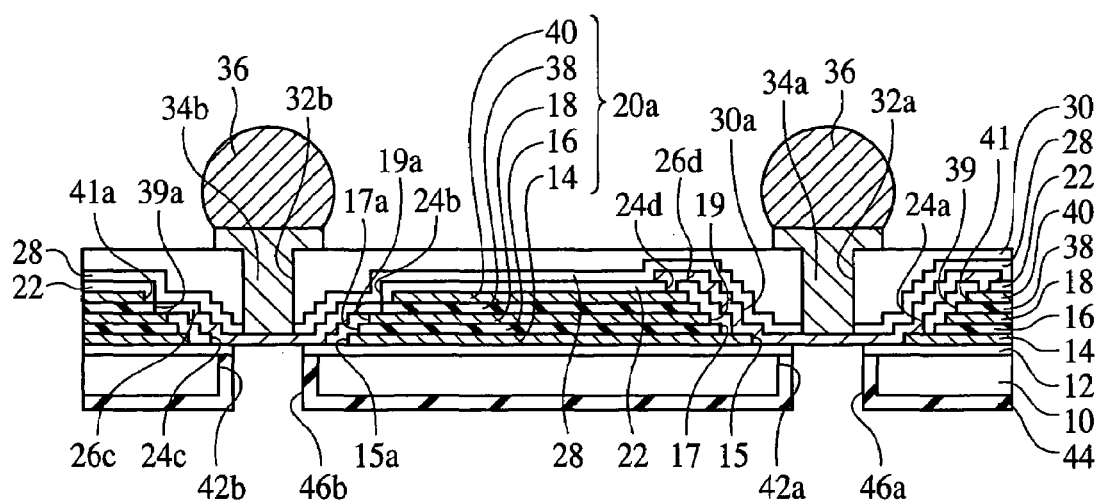
Figure 16C:
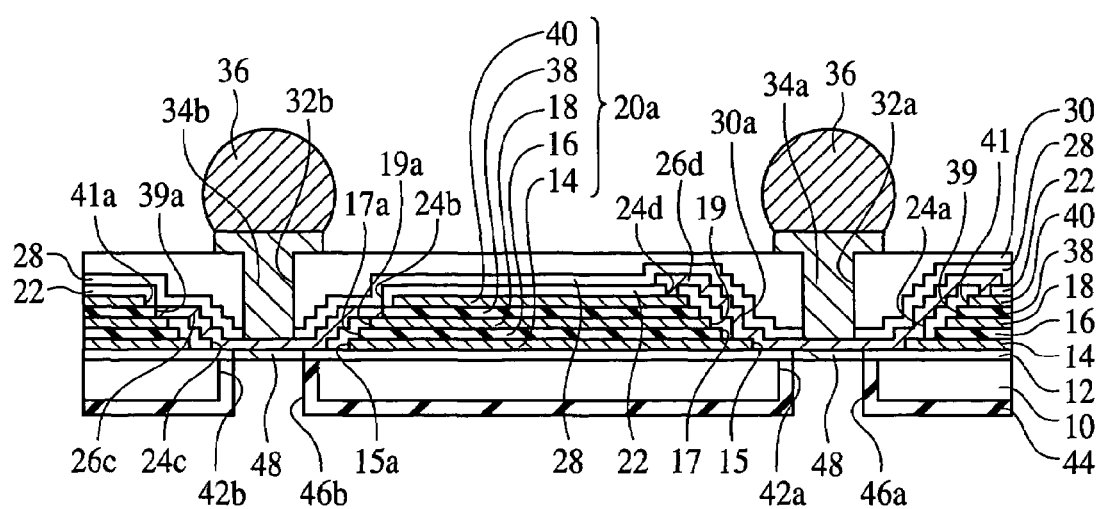

Next, the underside of the base substrate 10 (opposite to the side where the capacitor parts 20a are formed) is polished with, e.g., a back grinder until the thickness of the base substrate 10 becomes about 50 μm (see FIG. 15B).

Then, a photoresist film is formed on the underside of the base substrate 10 by spin coating. Then, the photoresist film is patterned by photolithography. Thus, openings for forming the through-holes 42a, 42b (see FIG. 15C) are formed in the photoresist film.

Then, with the photoresist film as the mask and with the insulation film 12 as the etching stopper, the base substrate 10 is wet etched to thereby form the through-holes 42a, 42b. The etchant is, e.g., a mixed solution of hydrogen fluoride and nitric acid. The diameter of the through-holes 42a, 42b is, e.g., about 100 μm. The pitch of the through-holes 42a, 42b is, e.g., about 250 μm (see FIG. 15C).

Then, epoxy resin is applied to the underside of the base substrate 10 by spin coating. Then, thermal processing is made to cure the epoxy resin. Thus, the insulation film 44 is formed of the epoxy resin (see FIG. 16A).

Then, the through-holes 46a are formed in the insulation film 44 by, e.g., an ArF excimer laser. The diameter of the through-holes 46a is, e.g., about 70 μm. At this time, the insulation film 12 exposed in the through-holes 46a is also removed (see FIG. 16B).

Next, an conducting barrier film for preventing the diffusion of the hydrogen or water is formed on the underside of the base substrate 10 by sputtering. The conducting barrier film is, e.g., a 200 nm-thickness amorphous TaSiN film.

Next, the conducting barrier film on the underside of the base substrate 10 and the side surfaces of the through-holes 46a, 46b is removed by ion milling. Thus, the conducting barrier film 48 is formed on the underside of the leading-out electrodes 26c, 26d in the through-holes 46a, 46b (see FIG. 16C).

Then, the layer film of a Ti film and a Cu film is formed on the underside of the base substrate by, e.g., sputtering. The layer film functions as an adhesion layer. The layer film also functions as the seed layer for the electroplating in a later step.

Next, a photoresist film (not illustrated) is formed on the entire underside of the base substrate 10 by spin coating.

Then, openings (not illustrated) are formed in the photoresist film by photolithography. The openings are for forming the partial electrodes 50a, 50b.

Next, the partial electrodes 50a, 50b of, e.g., Ni are formed in the openings by electroplating. The partial electrodes 34a and the partial electrodes 50a form the through-electrodes 54a. The partial electrodes 34b and the partial electrodes 50b form the through-electrodes 54b.

Next, the solder bumps 52 of, e.g., an Sn—Ag-based material are formed by electroplating. Then, the photoresist film is released.

Then, the layer film of a Cu film and a Ti film is removed by wet etching.

Next, the base substrate 10 is diced into a prescribed size.

Figure 17:
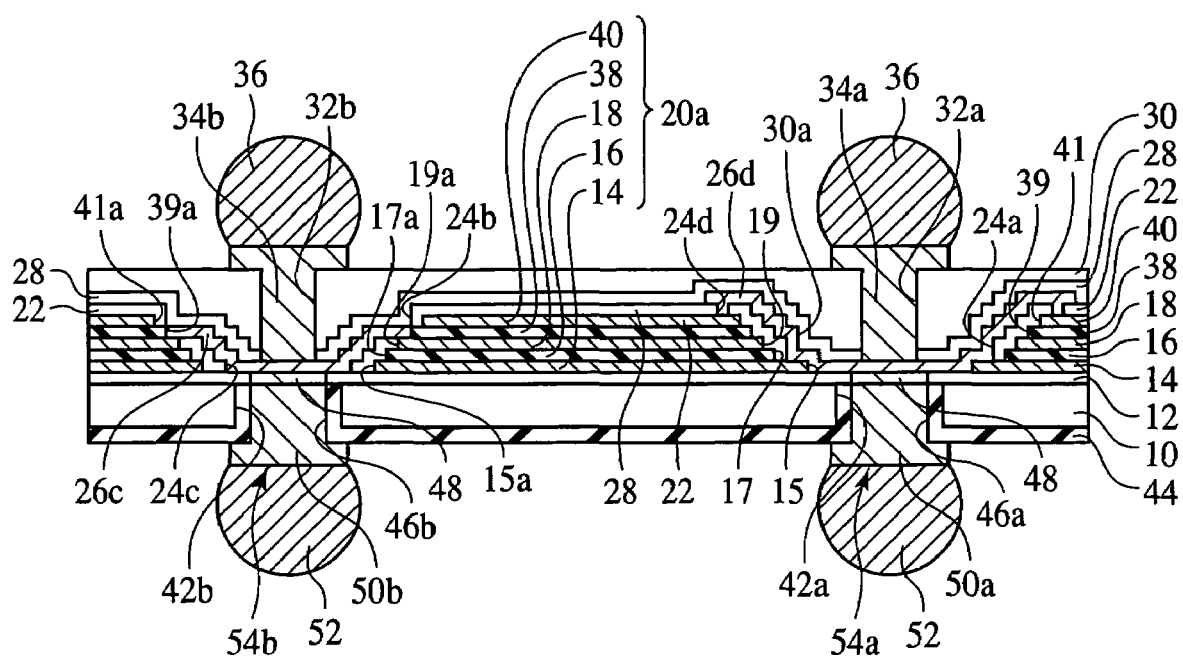
FIG. 17 is sectional views of the thin-film capacitor according to the fourth embodiment of the present invention in the steps of the method for fabricating the thin-film capacitor, which illustrate the method (Part 3).

Thus, the thin-film capacitor according to the present embodiment is fabricated (see FIG. 17).

(Evaluation Result)

The evaluation result of the thin-film capacitor according to the present embodiment will be explained.

The proposed thin-film capacitor illustrated in FIGS. 22A and 22B had the capacitance per a unit area of about 5 $\mu F/cm^2$, as described above.

The thin-film capacitor according to the present embodiment had the capacitance per the unit area of 8 $\mu F/cm^2$.

Based on this, it is found that the present embodiment can realize a thin-film capacitor of a large capacitance per a unit area. In the present embodiment, the thin-film capacitance can have a large capacitance per a unit area, because the capacitor electrodes 14, 40 are formed above and below the capacitor electrodes 18, whereby the capacitor electrodes 18 and the capacitor electrodes 14, 40 are opposed over a large total area.

As described above, the proposed thin-film capacitor had the insulation resistance of about 50 MΩ at a 1.5 V applied voltage.

The insulation resistance was measured on the thin-film capacitor according to the present embodiment. The insulation resistance was 10 GΩ or above at a 1.5 V applied voltage.

Based on this, it is found that the present embodiment can realize a thin-film capacitor of very higher insulation resistance.

The proposed thin-film capacitor illustrated in FIGS. 22A and 22B had the insulation resistance of about 1 MΩ at a 1.5 V applied voltage after a PCBT. As the conditions for the PCBT, as described above, the pressure was 2 atm.; the temperature was 125° C.; the humidity was 85%; the applied voltage was 3 V; and the test period of time was 48 hours.

The PCBT was made on the thin-film capacitor according to the present embodiment. After the PCBT, the insulation resistance was about 10 MΩ at a 1.5 V applied voltage. As the conditions for the PCBT, as are the conditions for the PCBT on the proposed thin-film capacitor, the pressure was 2 atm.; the temperature was 125° C.; the humidity was 85%; the applied voltage was 3 V; and the test period of time was 48 hours.

Based on this, it is found that the present embodiment can drastically suppress the deterioration of the electric characteristics.

A Fifth Embodiment

Figure 18:
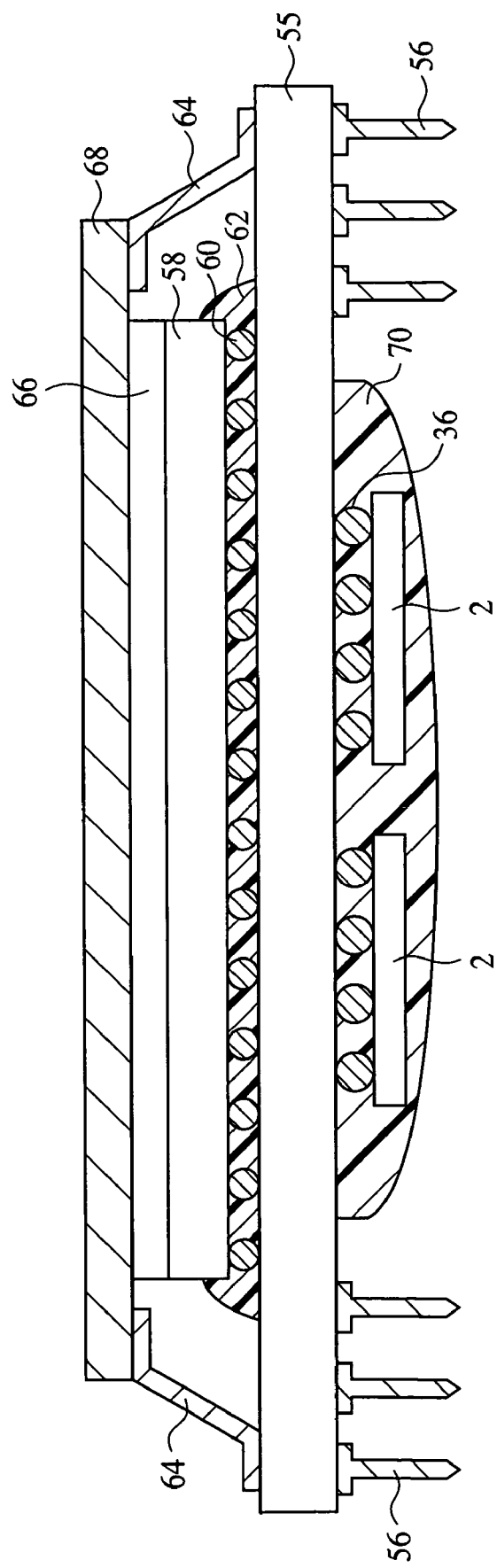
FIG. 18 is a sectional view of the electronic device according to a fifth embodiment of the present invention.

The electronic device according to a fifth embodiment of the present invention will be explained with reference to FIG. 18. FIG. 18 is a sectional view of the electronic device according to the present embodiment. The same members of the present embodiment as those of the thin-film capacitor according to the first to the fourth embodiments and the method for fabricating the thin-film capacitor illustrated in FIGS. 1A to 17 are represented by the same reference numbers not to repeat or to simplify their explanation.

The electronic device (capacitors-incorporated package) according to the present embodiment is characterized mainly in that the thin-film capacitor 2 according to one of the above-described first to third embodiments is used.

Interconnections, etc. are formed on a package substrate (circuit board) 55. Pins 56 are provided on the underside of the package substrate 55. The pins are for electrically connecting the electronic device according to the present embodiment with another circuit board (not illustrated) in mounting the former on the latter. The pins 56 are electrically connected to the interconnections formed on the package substrate 55. A plurality of electrodes (not illustrated) are provided respectively on the upper side and the underside of the package substrate 55. The electrodes are electrically connected to the interconnections, etc. formed on the package substrate 55.

An LSI (semiconductor device) 58 is mounted on the package substrate 55. The electrodes formed on the package substrate 55 and the electrodes (not illustrated) formed on the LSI 58 are electrically connected with each other solder bumps 60. An under fill 62 is buried the gaps between the package substrate 55 and the LSI 58.

A frame 64 is provided on the package substrate 55 with the LSI 55 mounted on, surrounding the LSI 58.

A thermal compound 66, i.e., a heat conducting grease is applied to the LSI 58.

A radiation plate 68 is provided on the LSI 58 with the thermal compound 66 applied to.

On the other hand, the thin-film capacitors 2 according to one of the first to the third embodiments described above are mounted on the underside of the package substrate 55. The electrodes 34a, 34b of the thin-film capacitors 2 and the electrodes of the package substrate 55 are electrically connected via the solder bumps 36. The thin-film capacitors 2 are covered with an under fill 70.

Thus, the electronic device (capacitors-incorporated package) according to the present embodiment is constituted.

The electronic device according to the present embodiment uses the thin-film capacitors 2 having good electric characteristics and high reliability, and can have good electric characteristics and high reliability.

A Sixth Embodiment

Figure 19:
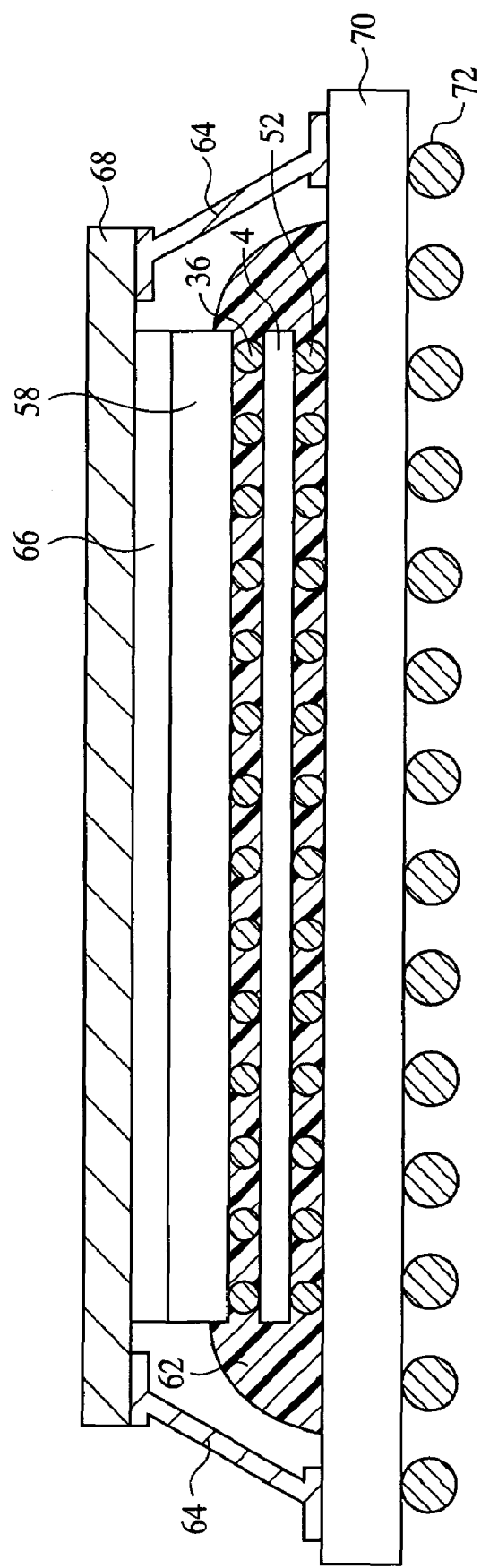
FIG. 19 is a sectional view of the electronic device according to a sixth embodiment of the present invention.

The electronic device according to a sixth embodiment of the present invention will be explained with reference to FIG. 19. FIG. 19 is a sectional view of the electronic device according to the present embodiment. The same members of the present embodiment as those of the thin-film capacitor according to the first to the fifth embodiments and the method for fabricating the thin-film capacitor illustrated in FIG. 1A to 18 are represented by the same reference numbers not to repeat or to simplify their explanation.

The electronic device (capacitors-incorporated package) according to the present embodiment is characterized mainly in that the thin-film capacitor 4 according to the fourth embodiment described above is used.

Interconnections (not illustrated), etc. are formed on a package substrate (circuit board) 70. A plurality of electrodes are formed respectively on the upper side and the underside of the package substrate 70. The electrodes are electrically connected to the interconnections, etc. formed on the package substrate 70. Solder bumps 72 are formed on the electrodes formed on the package substrate 70. The solder bumps 72 are for electrically connecting the electronic device according to the present embodiment to another circuit board (not illustrated) in mounting the former on the other.

The thin-film capacitors 4 according to the fourth embodiment described above is mounted on the package substrate 70. The thin-film capacitors 4 function as an interposer. The through-electrodes 54a, 54b (see FIG. 14) formed in the thin-film capacitors 4 and the electrodes (not illustrated) on the package substrate 70 are electrically connected via solder bumps 52.

An LSI (semiconductor device) 58 is mounted on the thin-film capacitors 4. The through-electrodes 54a, 54b (see FIG. 14) formed in the thin-film capacitors 4 and the electrodes (not illustrated) on the LSI 58 are electrically connected via solder bumps 36.

On the package substrate 70, an under fill is buried in the gaps between the package substrate 70 and the thin-film capacitors 4 and between the thin-film capacitors 4 and the LSI 58 to fill the gaps.

A frame 64 is disposed on the package substrate 70 with the thin-film capacitors 4 and the LSI 58 mounted on, surrounding the thin-film capacitors 4 and the LSI 58.

A thermal compound 66, i.e., a heat conducting grease is applied to the LSI 58.

A radiation plate 68 is provided on the LSI 58 with the thermal compound 66 applied to.

Thus, the electronic device (capacitors-incorporated package) according to the present embodiment is constituted.

The electronic device according to the present embodiment uses the thin-film capacitors 4 having good electric characteristics and high reliability, and can have good electric characteristics and high reliability.

A Seventh Embodiment

Figure 20:
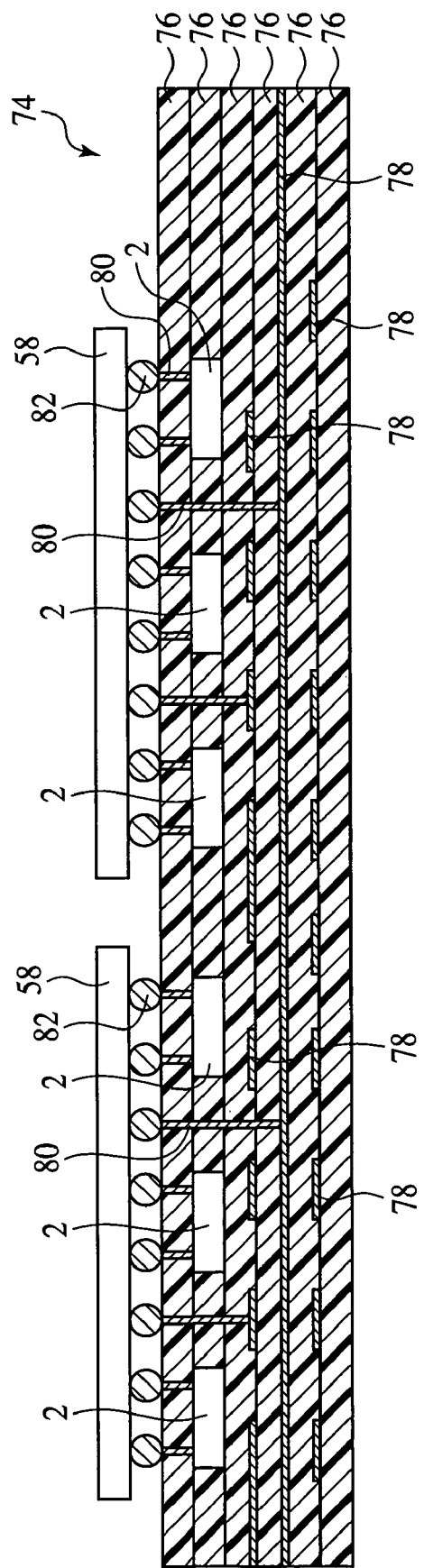
FIG. 20 is a sectional view of the electronic device according to a seventh embodiment of the present invention.

The circuit board according to a seventh embodiment of the present invention will be explained with reference to FIG. 20. FIG. 20 is a sectional view of the circuit board 74 according to the present embodiment with an LSI 58 mounted on. The same members of the present embodiment as those of the thin-film capacitor according to the first to the sixth embodiments and the method for fabricating the thin-film capacitor illustrated in FIGS. 1A to 19 are represented by the same reference numbers not to repeat or to simplify their explanation.

The circuit board (capacitors-incorporated circuit board) according to the present embodiment is characterized mainly in that the thin-film capacitor according to one of the first to the third embodiments is incorporated.

As illustrated in FIG. 20, the circuit board according to the present embodiment is formed of a resin layer 76, and an interconnection layer 78 patterned in a prescribed configuration alternately laid.

In the resin layer 76, the thin-film capacitors 2 according to one of the first to the third embodiments described above are buried in.

The thin-film capacitors 2 are electrically connected to the electronic circuit (not illustrated) of the LSI 58 through a via 80 buried in the resin layer 76 and solder bumps 82. The interconnections 78 buried in the resin layer 76 are electrically connected to the electronic circuit (not illustrated) of the LSI 58 through the via 80 and the solder bumps 82.

Thus, the circuit board (capacitors-incorporated substrate) 74 according to the present embodiment is constituted.

The circuit board 74 according to the present embodiment has the thin-film capacitors 2 of good electric characteristics and high reliability buried in, and can have good electric characteristics and high reliability.

An Eighth Embodiment

Figure 21:
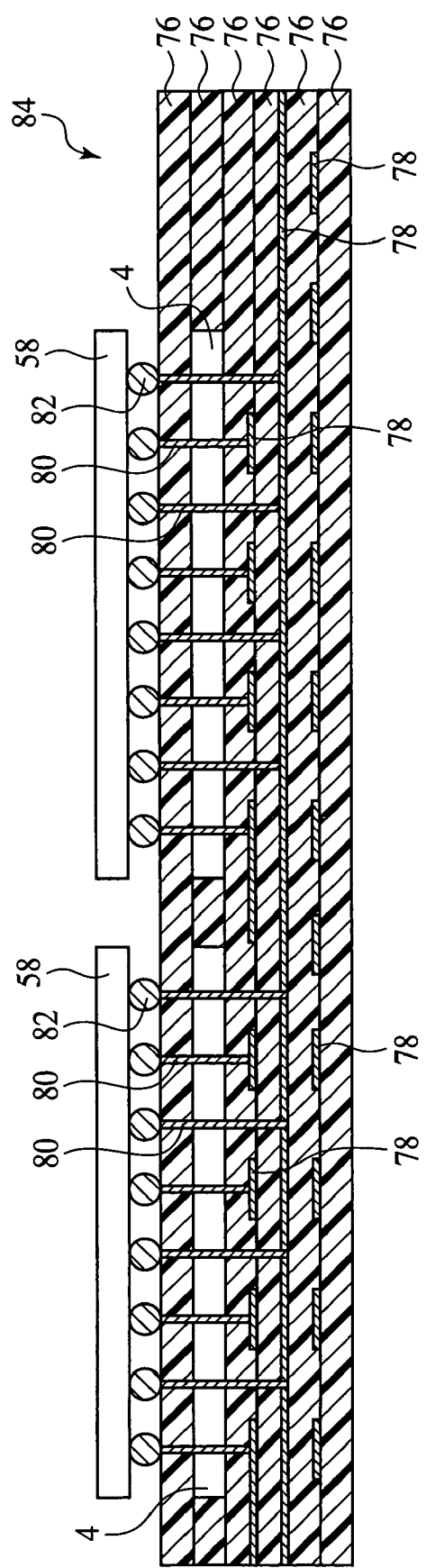
FIG. 21 is a sectional view of the electronic device according to an eighth embodiment of the present invention.

The circuit board according to an eighth embodiment of the present invention will be explained with reference to FIG. 21. FIG. 21 is a sectional view of the circuit board according to the present embodiment. FIG. 21 illustrates the circuit board 84 with an LSI 58 mounted on. The same members of the present embodiment as those of the thin-film capacitor, etc. according to the first to the seventh embodiments and the method for fabricating the thin-film capacitor, etc. illustrated in FIGS. 1A to 20 are represented by the same reference numbers not to repeat or to simplify their explanation.

The circuit board (thin-film capacitors-incorporated substrate) according to the present embodiment is characterized mainly in that the thin-film capacitors 4 according to the fourth embodiments described above are incorporated.

As illustrated in FIG. 21, the circuit board 84 according to the present embodiment is formed of a resin layer 76 and an interconnection layer 78 patterned in a prescribed pattern, which are alternately laid.

On the resin layer 76, the thin-film capacitors 4 according to the fourth embodiment described above are buried.

The interconnections 78 buried in the resin layer 76 are electrically connected to the LSI 58 through a via 80 buried in the resin layer, through-electrodes 54a, 54b (see FIG. 14) of the thin-film capacitors and the solder bumps 82.

Thus, the circuit board (thin-film capacitors incorporated substrate) 84 according to the present embodiment is constituted.

The circuit board 84 according to the present embodiment has the thin-film capacitors 4 of good electric characteristics and high reliability buried in, and can have good electric characteristics and high reliability.

A Ninth Embodiment

The thin-film capacitor according to a ninth embodiment of the present invention and the method for fabricating the thin-film capacitor will be explained with reference to FIGS. 22A to 25. FIGS. 22A and 22B are a sectional view and a plan view of the thin-film capacitor according to the present embodiment. The same members of the present embodiment as those of the thin-film capacitor, etc. according to the first to the eighth embodiments and the method for fabricating the thin-film capacitor illustrated in FIGS. 1A to 21 are represented by the same reference numbers not to repeat or to simplify their explanation.

(The Thin-Film Capacitor)

First, the thin-film capacitor according to the present embodiment will be explained with reference to FIGS. 22A and 22B.

The thin-film capacitor according to the present embodiment is characterized mainly in that conducting barrier films 86a, 86b for preventing the diffusion of the hydrogen or water are formed respectively for capacitor electrodes 14, 18, and electrodes 34a, 34b for the connection to the outside are electrically connected respectively to the capacitors 14, 18 via the conducting barrier films 86a, 86b.

As illustrated in FIGS. 22A and 22B, a conduction film 12 is formed on the surface of a base substrate 10.

An adhesion layer (not illustrated) of, e.g., $TiO_2$ is formed on the insulation film 12.

Capacitor electrodes (lower electrodes) 14 are formed on the adhesion layer. The capacitor electrodes 14 are formed of, e.g., a 100 nm-thickness Pt film.

A capacitor dielectric film 16 is formed on the capacitor electrodes 14. The capacitor dielectric film 16 is formed of, e.g., a high dielectric constant material. More specifically, the capacitor dielectric film 16 is polycrystalline BST film. The film thickness of the capacitor dielectric film 16 is, e.g., 100 nm.

Capacitor electrodes (upper electrodes) 18 are formed on the capacitor dielectric film 16. The capacitor electrodes 18 are formed of, e.g., a 100 nm-thickness Pt film. Openings 19 are formed in the capacitor electrodes 18 and the capacitor dielectric film 16 down to the capacitor electrodes 14.

Thus, capacitor parts 20 each including the capacitor electrode 14, the capacitor dielectric film 16 and the capacitor electrode 18 are formed.

The conducting barrier film 86a for preventing the diffusion of the hydrogen or water is formed on the capacitor electrodes 14 in the openings 19. The conducting barrier film 86b for preventing the diffusion of the hydrogen or water is formed on the capacitor electrodes 16. The conducting barrier film 86a and the conducting barrier film 86b are formed by patterning on and the same conduction film. The conducting barrier films 86a, 86b are, e.g., $IrO_2$ film. The conducting barrier films 86a, 86b are, e.g., $IrO_2$ film in the present embodiment because $IrO_2$ film is superior in the function of preventing the diffusion of the hydrogen or water. The film thickness of the conducting barrier films 86a, 86b is about, e.g., 50 nm.

The conducting barrier film 86a and the conducting barrier film 86b are formed of one and the same conducting film in the present embodiment for the following reason. That is, $IrO_2$ film, the conducting barrier films 86a, 86b are formed of, is superior in the function of preventing the diffusion of the hydrogen or water while having a very high internal stress. Accordingly, when the plural conducting barrier film 86a and the conducting barrier film 86b are formed in different steps, large stresses are applied to the capacitor parts 20, which may cause the problem of peeling the films, and other problems. In the present embodiment, as will be described later, the conducting barrier film 86 is formed on the entire surface (see FIG. 23D), and then the conducting film 86 is patterned to form the conducting barrier film 86a and the conducting barrier film 86b (see FIG. 24A), whereby the application of larges stresses to the capacitor parts 20 can be prevented, and the problems of peeling the film, etc. can be prevented.

Conduction films 88a, 88b are formed on the conducting barrier films 86a, 86b. The conduction films 88a, 88b are for preventing the etching-off of the conducting barrier films 86a, 86b when a protection film 30 is etched to form opening 32a, 32b. The conducting barrier films 86a, 86b, which have not been etched off, can sufficiently prevent the diffusion of the hydrogen or water.

The conduction film 86a and the conduction film 88a form a conduction layer 90a. The conducting barrier film 86b and the conduction film 88b form a conduction layer 90b.

An insulating barrier film 28 for preventing the diffusion of the hydrogen or water is formed on the base substrate 10 with the capacitor parts 20, the conduction layer 90a and the conduction layer 90b formed on. The insulating barrier film 28 is formed, covering the capacitor parts 20. The insulating barrier film 28 is, e.g., aluminum oxide film. The film thickness of the insulating barrier film 28 is, e.g., about 50 nm.

A protection film 30 of, e.g., photosensitive polyimide is formed on the insulating barrier film 28. The film thickness of the protection film 30 is, e.g., about 5 μm.

Openings 32a are formed in the protection film 30 and the insulating barrier film 28 down to the conduction layer 90a. Openings 32b are formed in the protection film 30 and the insulation layer 28 down to the conduction layer 90b.

In the openings 32a, 32b, a layer film (not illustrated) of a Ti film and a Cu film sequentially laid is formed. The layer film functions as an adhesion layer.

The outside connection electrodes 34a, 34b of Ni are formed in the openings 32a, 32b.

On the outside connection-electrodes 34a, 34b, solder bumps 36 of, e.g., an Sn—Ag-based material are formed.

Thus, the thin-film capacitor according to the present embodiment is constituted.

The thin-film capacitor according to the present embodiment is characterized mainly in that conducting barrier films 86a, 86b for preventing the diffusion of the hydrogen or water are formed respectively for capacitor electrodes 14, 18, and electrodes 34a, 34b for the connection to the outside are electrically connected respectively to the capacitors 14, 18 via the conducting barrier films 86a, 86b.

According to the present embodiment, the outside connection electrodes 34a, 34b are electrically connected respectively to the capacitors 14, 18 via the conducting barrier films 86a, 86b, whereby the hydrogen or water are prevented from arriving at the capacitor dielectric film 16 via the outside connection electrodes 34a, 34b.

(The Method for Fabricating the Thin-Film Capacitor)

Next, the method for fabricating the thin-film capacitor according to the present embodiment will be explained with reference to FIGS. 23A to 25. FIGS. 23A to 25 are sectional views of the thin-film capacitor according to the present embodiment in the steps of the method for fabricating the thin-film capacitor, which illustrate the method.

First, the base substrate 10 with the insulation film 12 formed on the surface is prepared. More specifically, a silicon substrate 10 with, e.g., a silicon oxide film 12 formed on the surface is prepared.

Next, the base substrate is loaded into the film forming chamber of a sputtering system. The sputtering system (not illustrated) is, e.g., a multi-targets type magnetron sputtering system.

Next. an adhesion layer (not illustrated) of, e.g., a 100 nm-thickness $TiO_2$ film is formed on the entire surface by sputtering.

Next, the conduction film 14 of, e.g., a 100 nm-thickness Pt film is formed on the entire surface by sputtering.

Next, the capacitor dielectric film 16 of, e.g., a 100 nm-thickness polycrystalline BST film is formed on the entire surface by sputtering.

Figure 23A:
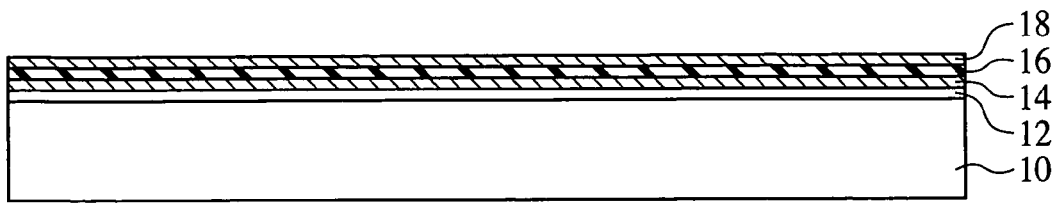
FIGS. 23A to 23D are sectional views of the thin-film capacitor according to the ninth embodiment of the present invention in the steps of the method for fabricating the thin-film capacitor, which illustrate the method (Part 1).
Figure 23B:
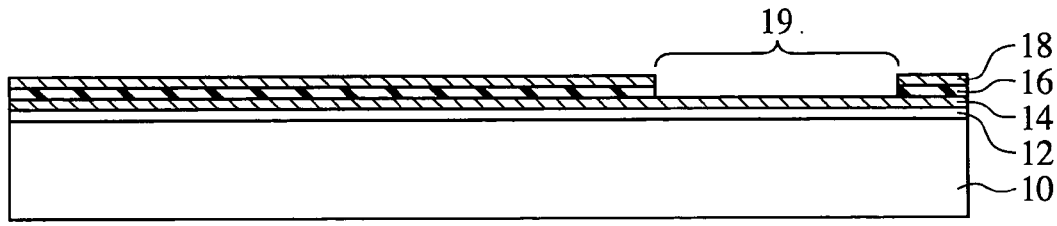

Next, the conduction film 18 of, e.g., a 100 nm-thickness Pt film is formed on the entire surface by sputtering (see FIG. 23A).

Then, the base substrate 10 is unloaded out of the film forming chamber of the sputtering system.

Next, the conduction film 18 and the capacitor dielectric film 16 are patterned by photolithography. Thus, the openings 19 are formed in the capacitor electrodes 18 and the capacitor dielectric film 16 (see FIG. 23B).

Thus, the capacitor parts 20 each including the capacitor electrode 14, the capacitor dielectric film 16 and the capacitor electrode 18 are formed.

Figure 23C:
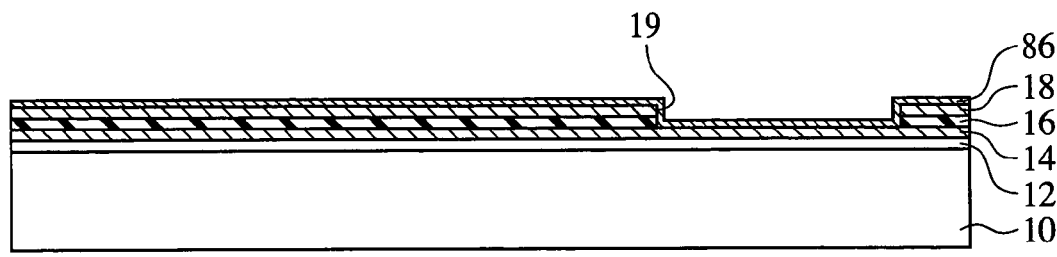
Figure 23D:
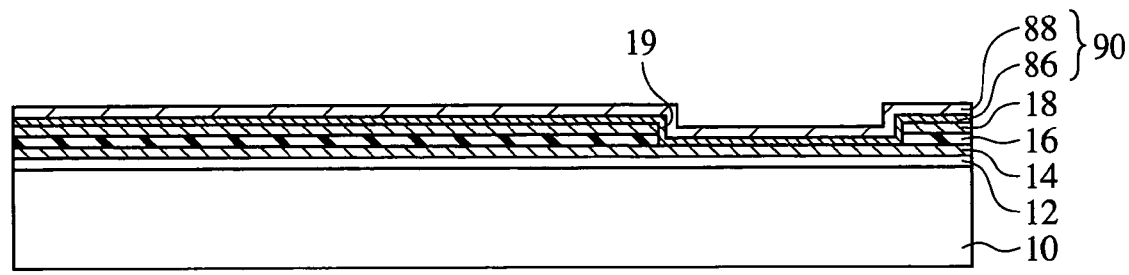

Next, as illustrated in FIG. 23C, the conducting barrier film 86 for preventing the diffusion of the hydrogen or water is formed on the entire surface by, e.g., sputtering. The conducting barrier film 86 is, e.g., a 50 nm-thickness $IrO_2$ film.

Next, the conduction film 88 is formed on the entire surface by, e.g., sputtering. The conduction film 88 is, e.g., a 50 nm-thickness Au film or Ir film. Thus, the layer film 90 of the conducting barrier film 86 and the conduction film 88 is formed (see FIG. 23D).

Next, the layer film 90 is patterned by photolithography. The conduction film 90a of the layer film 90 is formed on the capacitor electrodes 14 in the openings 19. The conduction layer 90b of the layer film 90 is formed on the capacitor electrodes 18 (see FIG. 24A).

Then, the insulating barrier film 28 for preventing the diffusion of the hydrogen or water is formed on the entire surface by, e.g., sputtering. The insulating barrier film 28 is amorphous aluminum oxide film. The film thickness of the insulating barrier film 28 is, e.g., about 50 nm (see FIG. 24B).

Figure 24A:
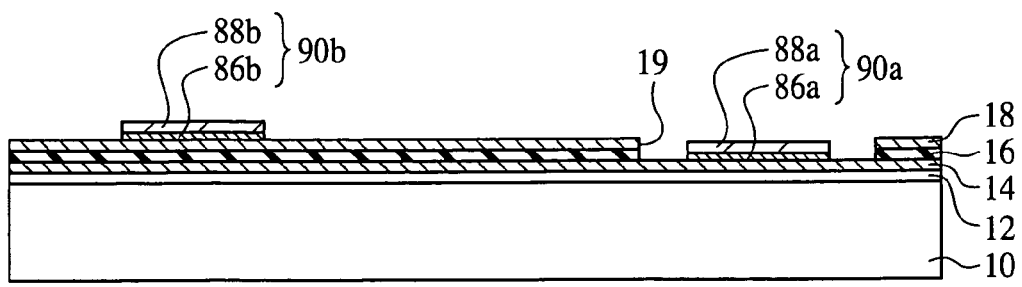
FIGS. 24A to 24D are sectional views of the thin-film capacitor according to the ninth embodiment of the present invention in the steps of the method for fabricating the thin-film capacitor, which illustrate the method (Part 2).
Figure 24B:
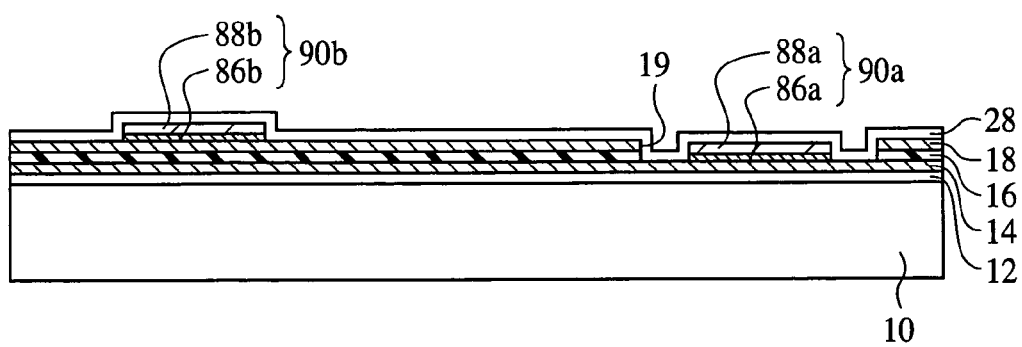
Figure 24C:
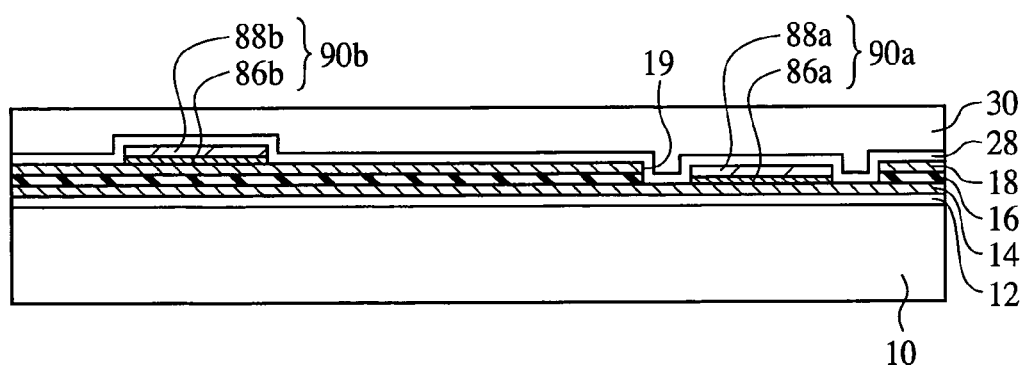
Figure 24D:
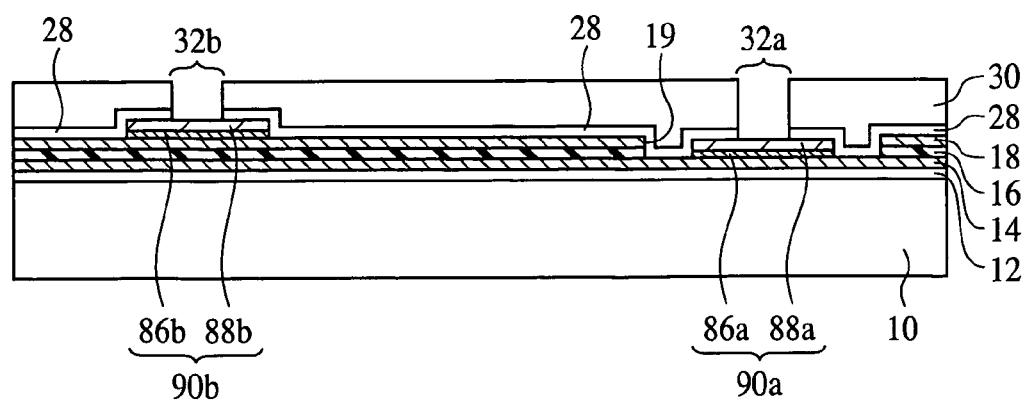

Next, as illustrated in FIG. 24C, the protection film 30 of, e.g., photosensitive polyimide is formed on the entire surface by, e.g., spin coating. The thickness of the protection film 30 is, e.g., about 5 μm.

Next, the openings 32a, 32b are formed in the protection film 30 down to the insulating barrier film 28 by photolithography.

Next, the insulating barrier film 28 exposed in the openings 32a, 32b is etched off. Thus, the openings 32a, 32b are formed in the protection film 30 and the insulating barrier film 28 down to the leading-out electrodes 26a, 26b (see FIG. 24D).

Then, the layer film (not illustrated) of a Ti film and a Cu film sequentially laid is formed by, e.g., sputtering. The layer film functions as the adhesion layer. The layer film functions as the seed layer for forming the outside connection electrodes 34a, 34b by electroplating in a later step.

Then, a photoresist film (not illustrated) is formed on the entire surface by spin coating.

Openings (not illustrated) are formed in the photoresist film by photolithography. The openings are forming the outside connection electrodes 34a, 34b. Because of the conduction films 88a, 88b formed on the conducting barrier films 86a, 86b, the conducting barrier films 86a, 86b are prevented from being etched off in forming the openings 32a, 32b. The conducting barrier films 86a, 86b, which are kept from being etched off, can sufficiently prevent the diffusion of the hydrogen or water.

The conducting barrier film 86a and the conduction film 88a formed the conduction layer 90a. The conducting barrier film 86b and the conduction film 88b form the conduction layer 90b.

Next, the outside connection electrodes 34a, 34b of, e.g., Ni are formed in the openings 34a, 34b by electroplating.

Then, the solder bumps 36 of, e.g., an Sn—Ag-based material are formed by electroplating. Then, the photoresist film is released.

Next, the layer film exposed around the outside connection electrodes 34a, 34b is removed by wet etching.

Next, the solder bumps 36 are melted by reflow furnace into a semi-sphere.

Next, the base substrate 10 is diced into a prescribed size.

Figure 25:
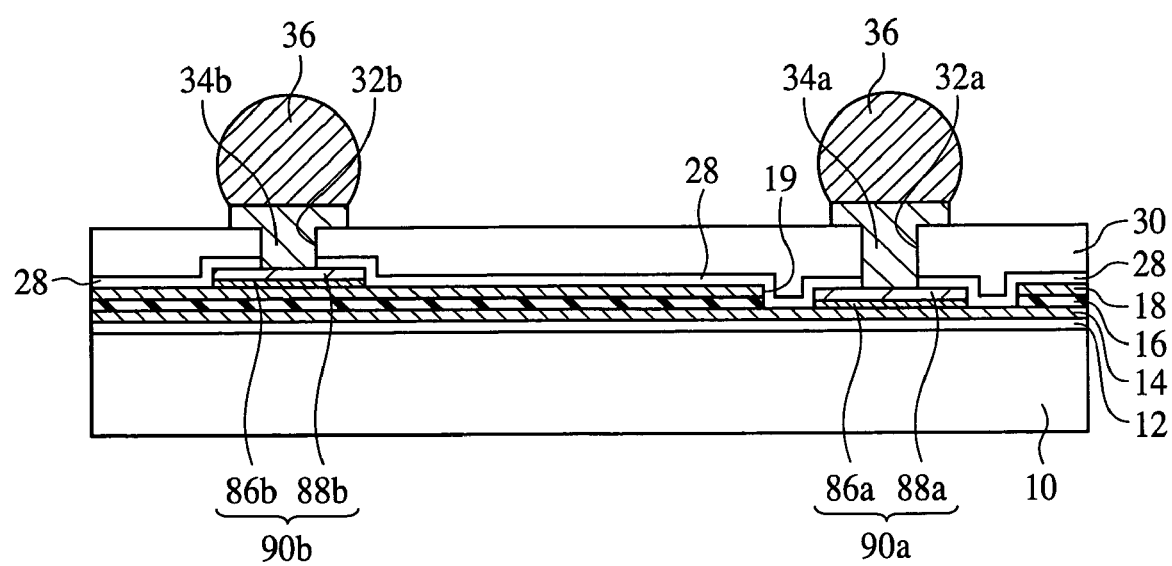
FIG. 25 is sectional views of the thin-film capacitor according to the ninth embodiment of the present invention in the steps of the method for fabricating the thin-film capacitor, which illustrate the method (Part 3).

Thus, the thin-film capacitor according to the present embodiment is fabricated (see FIG. 25).

The method for fabricating the thin-film capacitor according to the present embodiment is characterized mainly in that the conducting barrier film 86a and the conducting barrier film 86b are formed of one and the same conduction film 86. $IrO_2$ film, the conducting barrier films 86a, 86b are formed of, is superior in the function of preventing the diffusion of the hydrogen or water as described above, while having a very large inside stress. When the plural conducting barrier film 86a and the conducting barrier films 86b are formed in different steps, large stresses are applied to the capacitor parts 20, which causes the problem of releasing films, etc. In the present embodiment, the conducting barrier film 66 is formed on the entire surface and then patterned to thereby form the conducting barrier film 86a and the conducting barrier film 86b. Accordingly, only one layer of the conducting barrier film 86 may be formed. Only one layer of the conducting barrier film 86 must be formed, which prevents excessive stresses from being applied to the capacitor parts 20, and the problems of releasing films, etc. can be prevented.

One major characteristic of the method for fabricating the thin-film capacitor according to the present embodiment is that the conduction layer 88a, 88b are formed on the conducting barrier film 86a, 86b.

According to the present embodiment, because of the conduction films 88a, 88b formed on the conducting barrier films 86a, 86b, the conducting barrier films 86a, 86b are prevented from being etched off in forming the openings 32a, 32b. According to the preset embodiment, the conducting barrier films 86a, 86b, which can be kept from being etched off, can sufficiently prevent the diffusion of the hydrogen or water.

A Tenth Embodiment

Figure 26A:
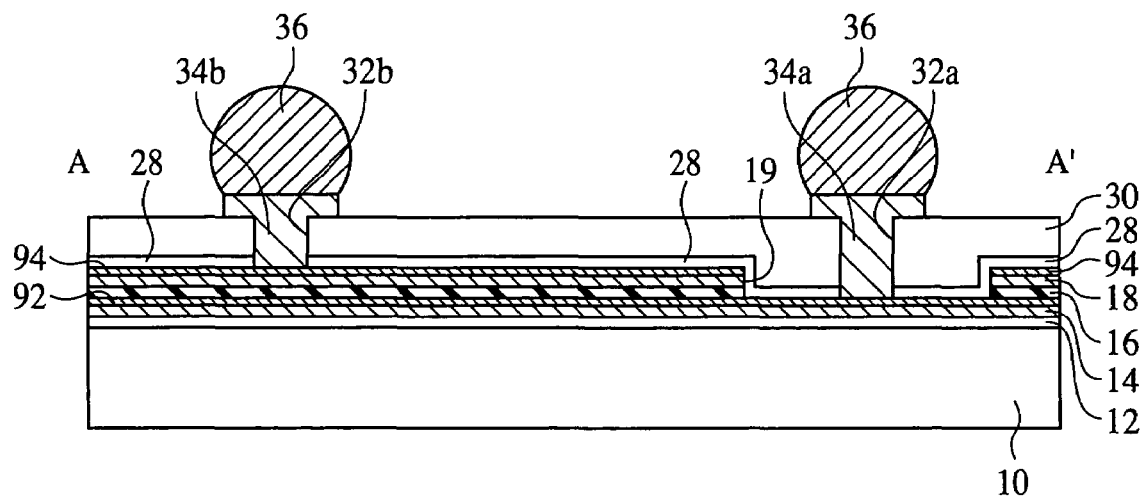
FIGS. 26A and 26B are a sectional view and a plan view of the thin-film capacitor according to a tenth embodiment of the present invention.
Figure 26B:
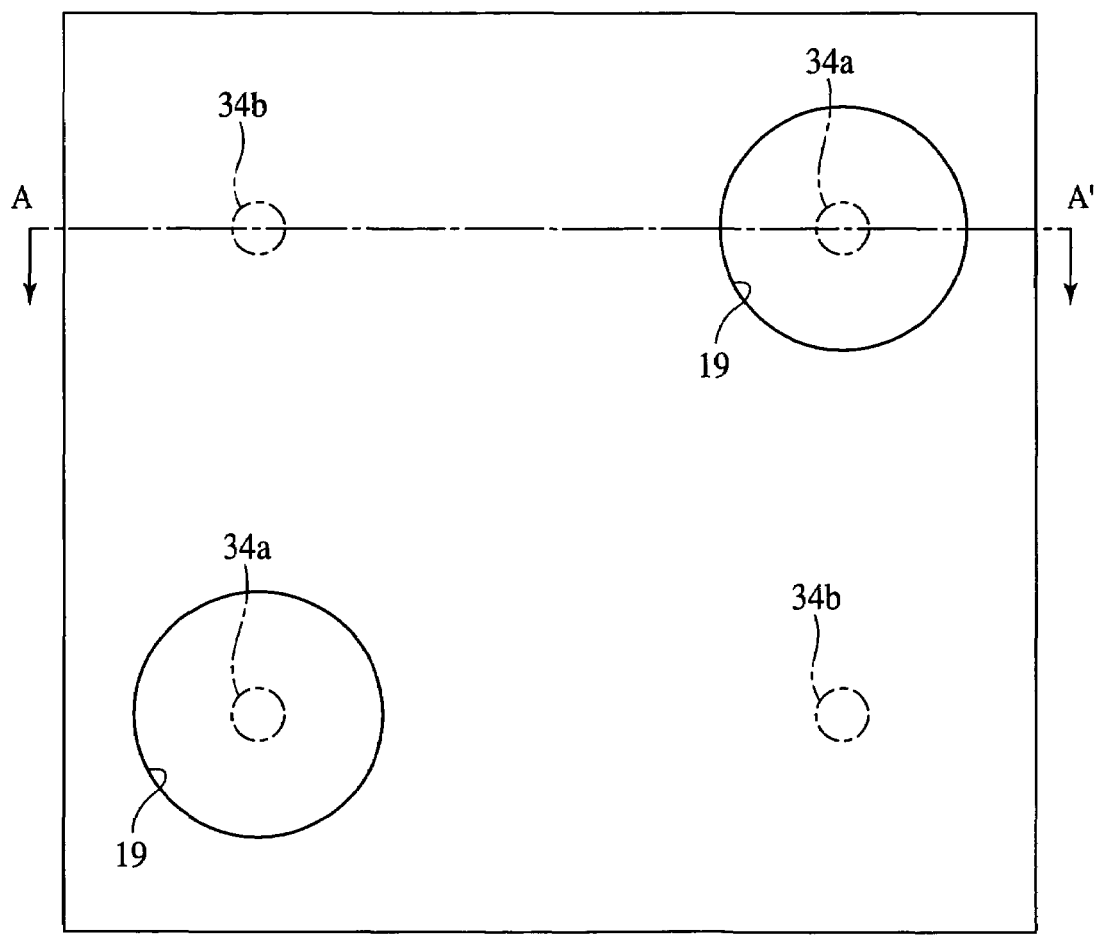

The thin-film capacitor according to a tenth embodiment of the present invention and the method for fabricating the thin-film capacitor will be explained with reference to FIGS. 26A to 28B. FIGS. 26A and 26B are a sectional view and a plan view of the thin-film capacitor according to the present embodiment. The same members of the present embodiment as those of the thin-film capacitor according to the first to the ninth embodiments and the method for fabricating the thin-film capacitors illustrated in FIGS. 1A to 25 are represented by the same reference numbers not to repeat or to simplify their explanation.

(The Thin-Film Capacitor)

First, the thin-film capacitor according to the present embodiment will be explained with reference to FIGS. 26A and 26B.

The thin-film capacitor according to the present embodiment is characterized mainly in that a conducting barrier film 92 is formed on capacitor electrodes (lower electrodes) 14, a conducting barrier film 94 which is different from the conducting barrier film 92 is formed on capacitor electrodes (upper electrodes) 18 and the conducting barrier film 92 is present between the capacitor electrodes (lower electrodes) 14 and a capacitor dielectric film 16.

As illustrated in FIGS. 26A and 26B, an insulation film 12 is formed on the surface of a base substrate 10.

An adhesion layer (not illustrated) of, e.g., $TiO_2$ is formed on the insulation film 12.

Capacitor electrodes (lower electrodes) 14 are formed on the adhesion layer. The capacitor electrodes 14 are formed of, e.g., a 100 nm-thickness Pt film.

A conducting barrier film 92 for preventing the diffusion of the hydrogen or water is formed on the capacitor electrodes 14. The conducting barrier film 92 is, e.g., $IrO_2$ film. The conducting barrier film 92 is $IrO_2$ film in the present embodiment, because, as described above, $IrO_2$ film is superior in the function of preventing the diffusion of hydrogen or water. The film thickness of the conducting barrier film 92 is, e.g., about 50 nm.

A capacitor dielectric film 16 is formed on the conducting barrier film 92. The capacitor dielectric film 16 is formed of, e.g., a high dielectric constant material. More specifically, the capacitor dielectric film 16 is polycrystalline BST film. The film thickness of the capacitor dielectric film 16 is, e.g., 100 nm.

Capacitor electrodes (upper electrodes) 18 are formed on the capacitor dielectric film 16. The capacitor electrodes 18 is, e.g., a 100 nm-thickness Pt film.

A conducting barrier film 94 for preventing the diffusion of the hydrogen or water is formed on the capacitor electrodes 18. The conducting barrier film 94 is, e.g., $IrO_2$ film. The conducting barrier film 94 is $IrO_2$ film in the present embodiment, because, as described above, $IrO_2$ film is superior in the function of preventing the diffusion of the hydrogen or water. The film thickness of the conducting barrier film 94 is, e.g., about 50 nm.

Openings 19 are formed in the conducting barrier film 94, the capacitor electrodes 18 and the capacitor dielectric film 16 down to the capacitor electrodes 14.

Thus, capacitor parts 20 each including the capacitor electrode 14, the capacitor dielectric film 16 and the capacitor electrode 18 are constituted.

An insulating barrier film 28 for preventing the diffusion of the hydrogen or water is formed on the base substrate 10 with the capacitor parts 20 formed on. The insulating barrier film 28 is formed, covering the capacitor parts 20. The insulating barrier film 28 is, e.g., aluminum oxide film. The film thickness of the insulating film 28 is, e.g., about 50 nm.

A protection film 30 of, e.g., photosensitive polyimide is formed on the insulating barrier film 28. The film thickness of the protection film 30 is, e.g., about 5 μm.

Openings 32a are formed in the protection film 30 and the insulating barrier film 28 down to the conducting barrier film 92. Openings 32b are formed in the protection film 30 and the insulation layer 28 down to the conducting barrier film 94.

A layer film (not illustrated) of a Ti film and a Cu film sequentially laid is formed in the openings 32a, 32b. The layer film functions as an adhesion layer.

Electrodes for the connection to the outside 34a, 34b of Ni are formed in the openings 32a, 32b with the layer film formed in.

Solder bumps 36 of, e.g., an Sn—Ag-based material are formed on the outside connection electrodes 34a, 34b.

Thus, the thin-film capacitor according to the present embodiment is fabricated.

The thin-film capacitor according to the present embodiment is characterized mainly in that the conducting barrier film 92 is formed on the capacitor electrodes (lower electrodes) 14, the conducting barrier film 94 different from the conducting barrier film 92 is formed on the capacitor electrodes (upper electrodes) 18, and the conducting barrier film 92 is present between the capacitor electrodes (lower electrodes) 14 and the capacitor dielectric film 16.

According to the present embodiment, because of the conducting barrier films 92, 94 present between the outside connection electrodes 34a, 34b and the capacitor electrodes 14, 18, the hydrogen or water intruding from the outside via the outside connection electrodes 34a, 34b are prevented from arriving at the capacitor electrodes 14, 18. Furthermore, according to the present embodiment, because of the conducting barrier film 92 present between the capacitor electrodes 14 and the capacitor dielectric film 16, even if the hydrogen or water should arrive at the capacitor electrodes 14, the hydrogen or water is can be prevented from arriving at the capacitor dielectric film 16 from the capacitor electrodes 14 by the conducting barrier film 92 present between the capacitor electrodes 14 and the capacitor dielectric film 16.

(The Method for Fabricating the Thin-Film Capacitor)

Next, the method for fabricating the thin-film capacitor according to the present embodiment will be explained with reference to FIGS. 27A to 28B. FIGS. 27A to 28B are sectional views of the thin-film capacitor according to the present embodiment in the steps of the method for fabricating the thin-film capacitor, which illustrate the method.

First, the base substrate 10 with the insulation film 12 formed on is prepared. More specifically, a silicon substrate 10 with, e.g., the silicon oxide film 12 formed on the surface is prepared.

Next, the base substrate 10 is loaded into the film forming chamber of a sputtering chamber. The sputtering system (not illustrated) is, e.g., a multi-targets magnetron sputtering system.

Next, the adhesion layer (not illustrated) of, e.g., a 100 nm-thickness $TiO_2$ film, for example, is formed on the entire surface by sputtering.

Next, the conduction film 14 of, e.g., a 100 nm-thickness Pt film is formed on the entire surface by sputtering.

Next, the conducting barrier film 92 for preventing the diffusion of the hydrogen or water is formed on the entire surface by, e.g., sputtering. The conducting barrier film 92 is, e.g., a 50 nm-thickness $IrO_2$ film.

Next, the capacitor dielectric film 16 of, e.g., a 100 nm-thickness polycrystalline BST film is formed on the entire surface by sputtering.

Next, the conduction film 18 of, e.g., a 100 nm-thickness Pt film is formed on the entire surface by sputtering.

Next, the conducting barrier film 94 for preventing the diffusion of the hydrogen or water is formed on the entire surface by, e.g., sputtering. The conducting barrier film 94 is, e.g., a 50 nm-thickness $IrO_2$ film (see FIG. 27A).

Then, the base substrate 10 is unloaded out of the film forming chamber of the sputtering system.

Then, the conducting barrier film 94, the conduction film 18 and the capacitor dielectric film 16 are patterned by photolithography. Thus, the openings 19 are formed in the conducting barrier film 94, the capacitor electrodes 18 and the capacitor dielectric film 16 (see FIG. 27B).

Thus, the capacitor parts 20 each including the capacitor electrode 14, the capacitor dielectric film 16 and the capacitor electrode 18 are formed.

Next, the insulating barrier film 28 for preventing the diffusion of the hydrogen or water is formed on the entire surface by, e.g., sputtering. The insulating barrier film 28 is, e.g., amorphous aluminum oxide film. The film thickness of the insulating barrier film 28 is, e.g., about 50 nm (see FIG. 27C).

Figure 27A:
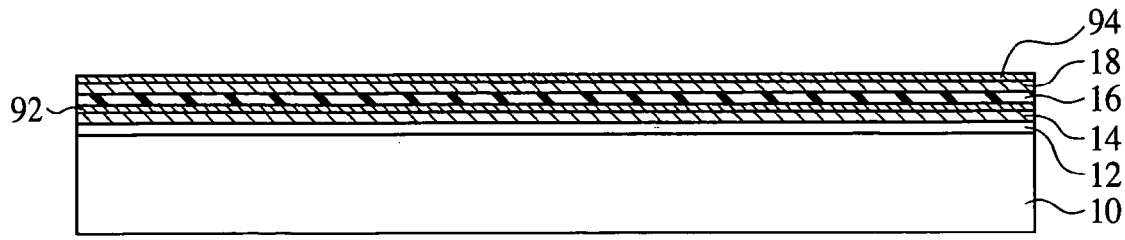
FIGS. 27A to 27D are sectional views of the thin-film capacitor according to the tenth embodiment of the present invention in the steps of the method for fabricating the thin-film capacitor, which illustrate the method (Part 1).
Figure 27B:
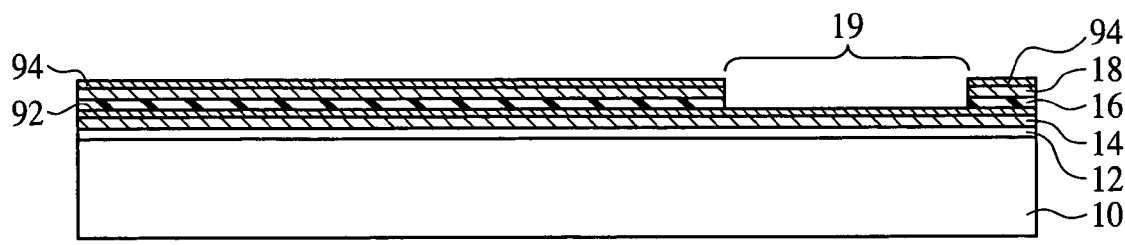
Figure 27C:
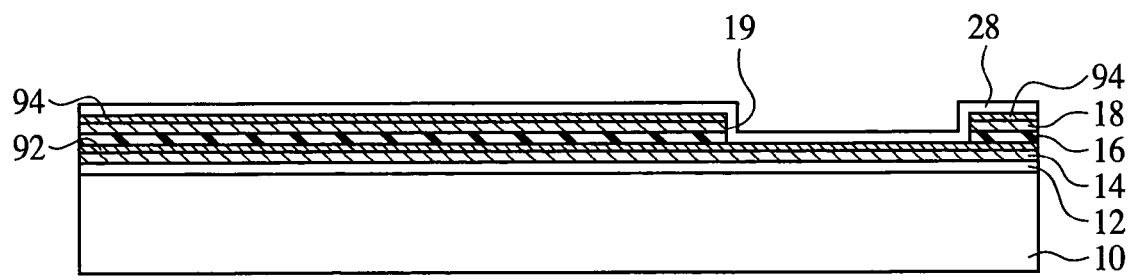
Figure 27D:
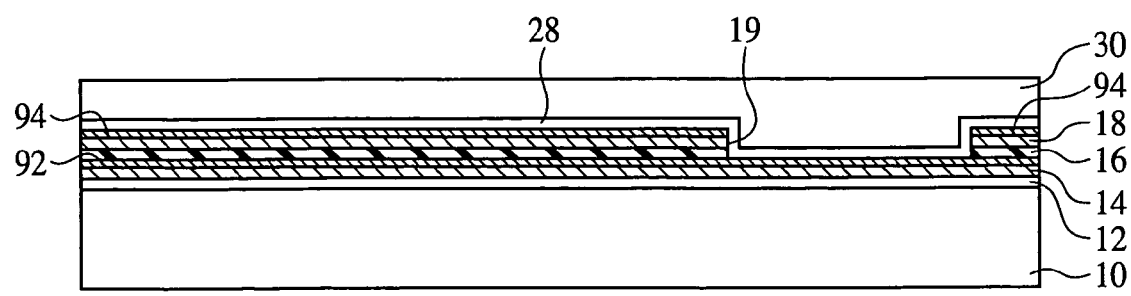

Next, as illustrated in FIG. 27D, the protection film 30 of, e.g., photosensitive polyimide is formed on the entire surface by, e.g., spin coating. The thickness of the protection film 20 is, e.g., about 5 μm.

Next, the openings 32a, 32b are formed in the protection film 30 down to the insulating barrier film 28 by photolithography.

Next, the insulating barrier film 28 exposed in the openings 32a, 32b is etched off. Thus, the openings 32a, 32b are formed in the protection film 30 and the insulating barrier film 28 down to the leading-out electrodes 26a, 26b (see FIG. 28A).

The following semiconductor device fabricating method is the same as the semiconductor device fabricating method of the ninth embodiment described above with reference to FIG. 25 and will not be repeated.

Figure 28A:
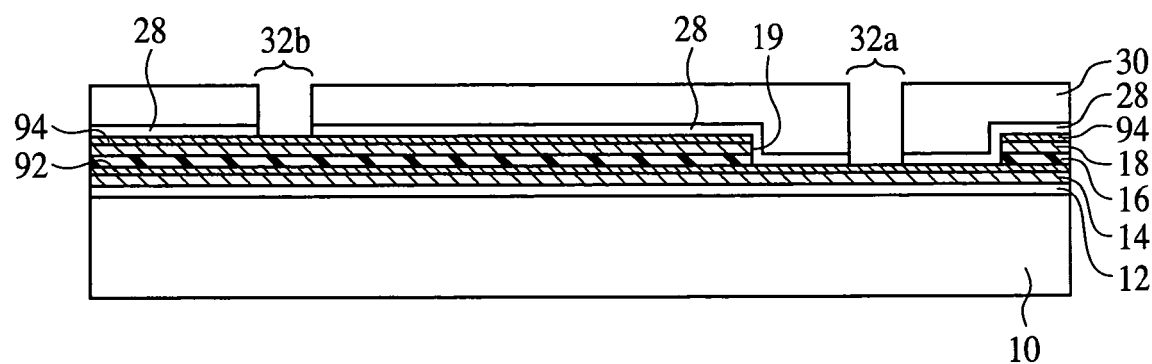
FIGS. 28A and 28B are sectional views of the thin-film capacitor according to the tenth embodiment of the present invention in the steps of the method for fabricating the thin-film capacitor, which illustrate the method (Part 2).
Figure 28B:
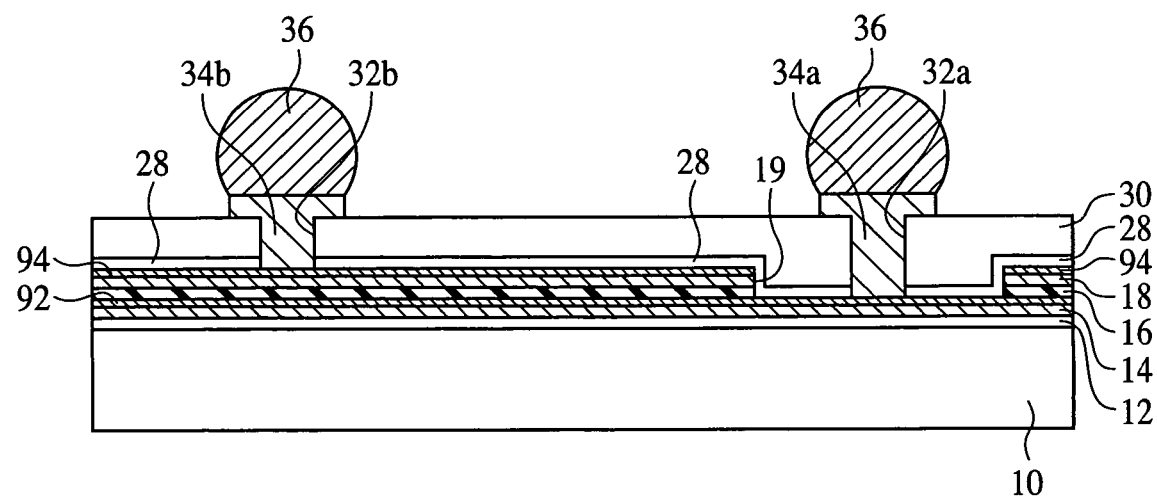

Thus, the thin-film capacitor according to the present embodiment is fabricated (see FIG. 28B).

An Eleventh Embodiment

Figure 29A:
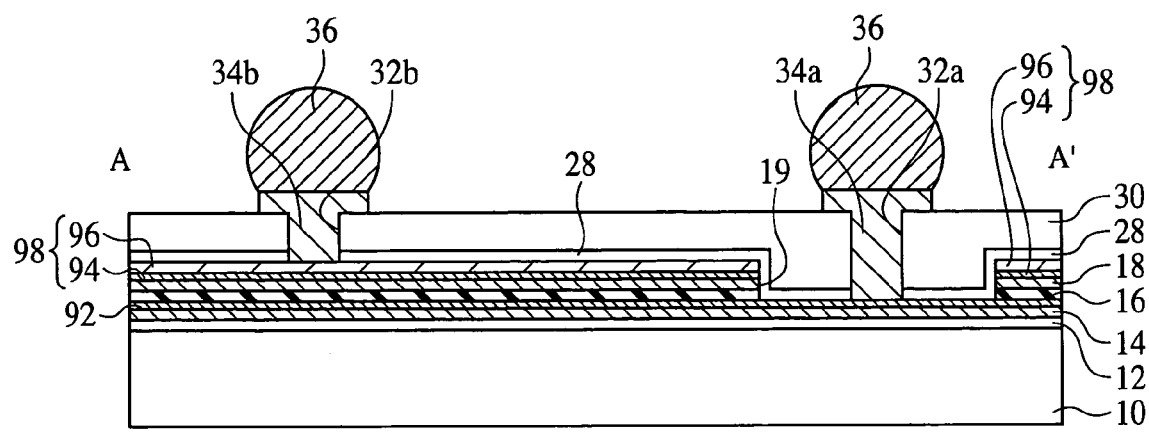
FIGS. 29A and 29B are a sectional view and a plan view of the thin-film capacitor according to an eleventh embodiment of the present invention.
Figure 29B:
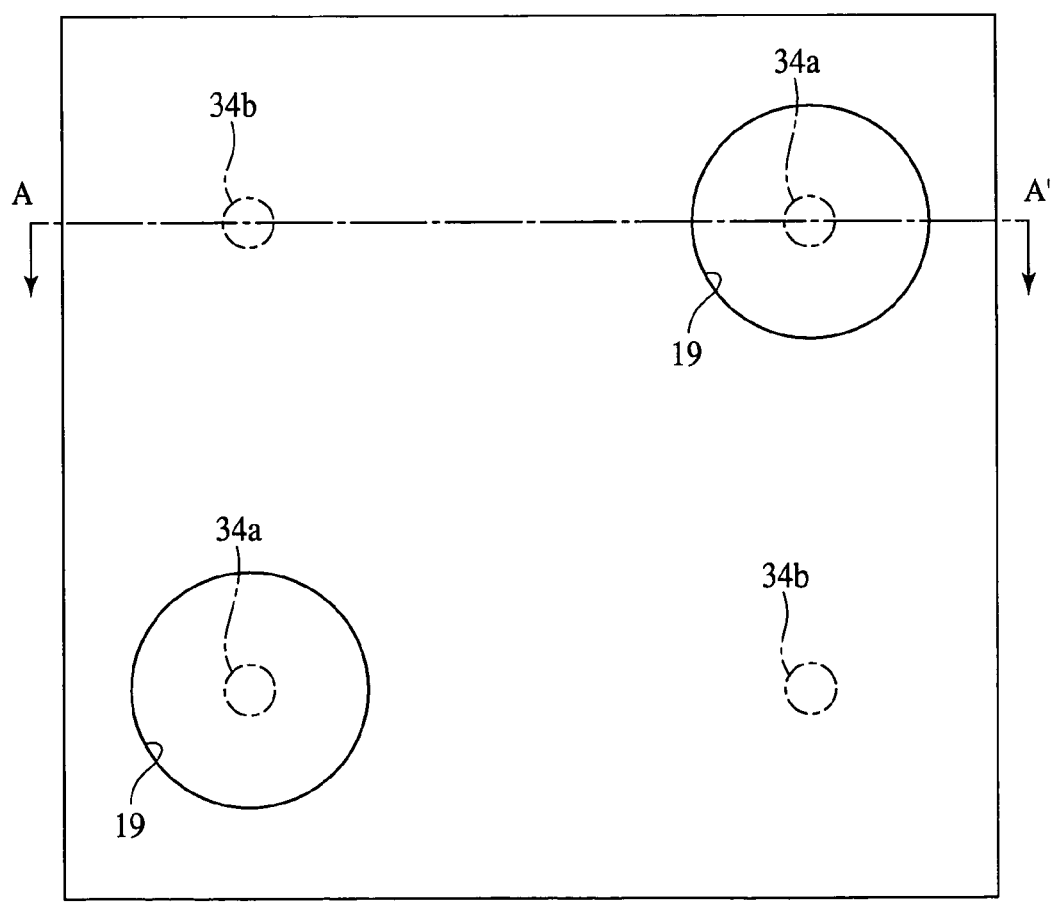

The thin-film capacitor according to an eleventh embodiment of the present invention and the method for fabricating the thin-film capacitor will be explained with reference to FIGS. 29A to 31B. FIGS. 29A and 29B are a sectional view and a plan view of the thin-film capacitor according to the present embodiment. The same member of the thin-film capacitor according to the present embodiment as those of the thin-film capacitor according to the first to the tenth embodiments illustrated in FIGS. 1 to 28B are represented by the same reference numbers not to repeat or to simplify their explanation.

(The Thin-Film Capacitor)

First, the thin-film capacitor according to the present embodiment will be explained with reference to FIGS. 29A and 29B.

The thin-film capacitor according to the present embodiment is characterized mainly in that a conduction film 96 is further formed on the conducting barrier film 92.

As illustrated in FIGS. 29A and 29B, an insulation film 12 is formed on the surface of a base substrate 10.

An adhesion layer (not illustrated) of, e.g., $TiO_2$ is formed on the insulation film 12.

Capacitor electrodes (lower electrodes) 14 are formed on the adhesion layer. The capacitor electrodes 14 are formed of, e.g., a 100 nm-thickness Pt film.

A conducting barrier film 92 for preventing the diffusion of the hydrogen or water is formed on the capacitor electrodes 14. The conducting barrier film 92 is, e.g., $IrO_2$ film. The conducting barrier film 92 is $IrO_2$ film in the present embodiment, because, as described above, $IrO_2$ film is superior in the function of preventing the diffusion of hydrogen or water. The film thickness of the conduction barrier film 92 is, e.g., about 50 nm.

A capacitor dielectric film 16 is formed on the conducting barrier film 92. The capacitor dielectric film 16 is formed of, e.g., a high dielectric constant material. More specifically, the capacitor dielectric film 16 is polycrystalline BST film. The film thickness of the capacitor dielectric film 16 is, e.g., 100 nm.

Capacitor electrodes (upper electrodes) 18 are formed on the capacitor dielectric film 16. The capacitor electrodes 18 are formed of, e.g., a 100 nm-thickness Pt film.

A conducting barrier film 94 for preventing the diffusion of the hydrogen or water is formed on the capacitor electrodes 18. The conducting barrier film 94 is, e.g., $IrO_2$ film. The conducting barrier film 94 is $IrO_2$ film in the present embodiment, because, as described above, $IrO_2$ film is superior in the function of preventing the diffusion of hydrogen or water. The film thickness of the conduction barrier film 94 is, e.g., about 50 nm.

A conduction film 96 is formed on the conducting barrier film 94. The conduction film 96 is for preventing the conducting barrier film 94 from being etched off in etching a protection film 30 to form openings 32b. The conducting barrier film 94, which is not etched off, can sufficiently prevent the diffusion of the hydrogen or water.

The conducting barrier film 94 and the conduction film 96 form a layer film 98.

Openings 19 are formed in the layer film 98, the capacitor electrodes 18 and the capacitor dielectric film 16 down to the capacitor electrodes 14.

Thus, capacitor parts 20 each including the capacitor electrode 14, the capacitor dielectric film 16 and the capacitor electrode 18 are formed.

An insulating barrier film 28 for preventing the diffusion of the hydrogen or water is formed on the base substrate 10 with the capacitor parts 20 formed on. The insulating barrier film 28 is formed, covering the capacitor parts 20. The insulating barrier film 28 is, e.g., aluminum oxide film. The film thickness of the insulating barrier film 28 is, e.g., about 50 nm.

The protection film 30 of, e.g., photosensitive polyimide is formed on the insulating barrier film 28. The film thickness of the protection film 30 is, e.g., about 5 μm.

Openings 32a are formed in the protection film 30 and the insulating barrier film 28 down to the conducting barrier film 92. Openings 32b are formed in the protection film 30 and the insulation layer 28 down to the conducting barrier film 94.

A layer film (not illustrated) of a Ti film and a Cu film sequentially laid is formed in the openings 32a, 32b. The layer film functions as an adhesion layer.

Electrodes for the connection to the outside 34a, 34b of Ni are formed in the openings 32a, 32b with the layer film formed in.

Solder bumps 36 of, e.g., an Sn—Ag-material are formed on the outside connection electrodes 34a. 34b.

Thus, the thin-film capacitor according to the present embodiment is constituted.

The thin-film capacitor according to the present embodiment is characterized mainly in that the conduction film 96 is further formed on the conducting barrier film 92. According to the present embodiment, because of the conduction film 96 further formed on the conducting barrier film 94, the conducting barrier film 94 is kept from being etched off in etching the protection 30 to form the openings 32b. Thus, according to the present embodiment, the diffusion of the hydrogen or water can be more surely prevented by the conducting barrier film 94.

(The Method for Fabricating the Thin-Film Capacitor)

Next, the method for fabricating the thin-film capacitor according to the present embodiment will be explained with reference to FIGS. 30A to 31B. FIGS. 30A to 31B are sectional views of the thin-film capacitor according to the present embodiment in the steps of the method for fabricating the thin-film capacitor, which illustrate the method.

First, the base substrate 10 with the insulation film 12 formed on the surface is prepared. More specifically, a silicon substrate 10 with, e.g., a silicon oxide film 12 formed on the surface is prepared.

Next, the base substrate 10 is loaded into the film forming chamber of a sputtering system. The sputtering system (not illustrated) is, e.g., a multi-target magnetron sputtering system.

Next, the adhesion layer (not illustrated) of, e.g., a 100 nm-thickness $TiO_2$ film is formed on the entire surface by sputtering.

Next, the conduction layer 14 of, e.g., a 100 nm-thickness Pt film is formed on the entire surface by sputtering.

Then, the conducting barrier film 92 for preventing the diffusion of the hydrogen or water is formed on the entire surface by, e.g., sputtering. The conducting barrier film 92 is, e.g., a 50 nm-thickness $IrO_2$ film.

Next, the capacitor dielectric film 16 of, e.g., a 100 nm-thickness polycrystalline BST film is formed on the entire surface by sputtering.

Next, the conduction film 18 of, e.g., a 100 nm-thickness Pt film is formed on the entire surface by sputtering.

Next, the conducting barrier film 94 for preventing the diffusion of the hydrogen or water is formed on the entire surface by, e.g., sputtering. The conducting barrier film 94 is, e.g., a 50 nm-thickness $IrO_2$ film.

Then, the conduction film 96 is formed on the entire surface by, e.g., sputtering. The conduction film 96 is, e.g., a 50 nm-thickness Au film or Ir film. Thus, the layer film 98 of the conducting barrier film 94 and the conduction film 96 is formed (see FIG. 30A).

Then, the base substrate 10 is unloaded out of the film forming chamber of the sputtering system.

Next, the layer film 98, the conduction film 18 and the capacitor dielectric film 16 are patterned. Thus, the openings 19 are formed in the layer film 98, the capacitor electrodes 18 and the capacitor dielectric film 16 (see FIG. 30B).

Thus, the capacitor parts 20 each including the capacitor electrode 14, the capacitor dielectric film 16 and the capacitor electrode 18 are formed.

Then, the insulating barrier film 28 for preventing the diffusion of the hydrogen or water is formed on the entire surface by, e.g. sputtering. The insulating barrier film 28 is, e.g., amorphous aluminum oxide film. The film thickness of the insulating barrier film 28 is, e.g., about 50 nm (see FIG. 30C).

Figure 30A:
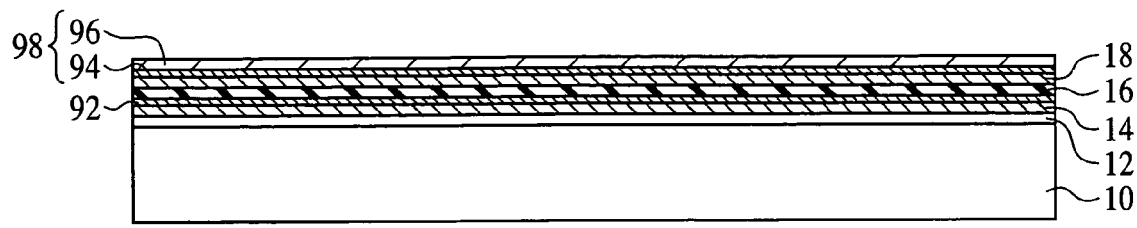
FIGS. 30A to 30D are sectional views of the thin-film capacitor according to the eleventh embodiment of the present invention in the steps of the method for fabricating the thin-film capacitor, which illustrate the method (Part 1).
Figure 30B:
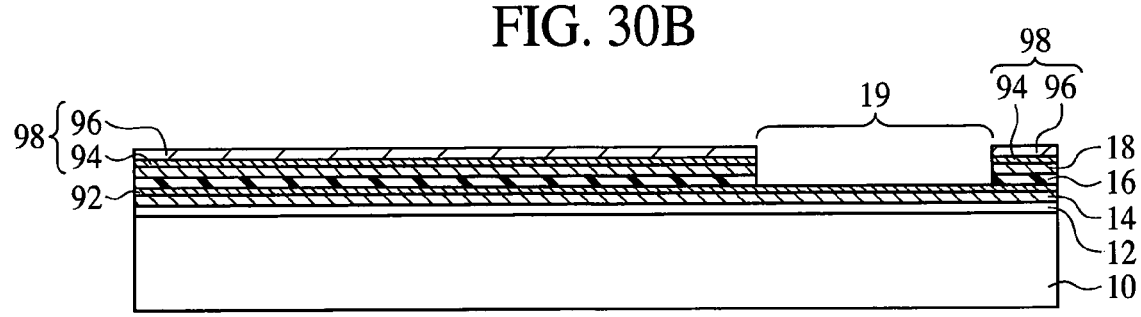
Figure 30C:
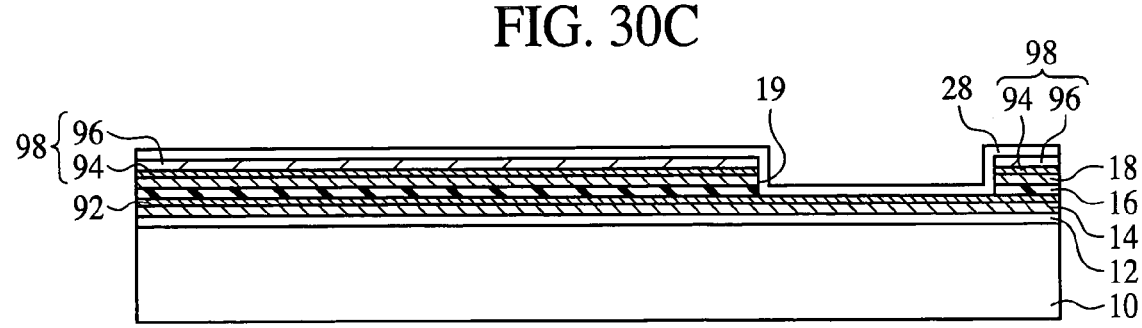
Figure 30D:
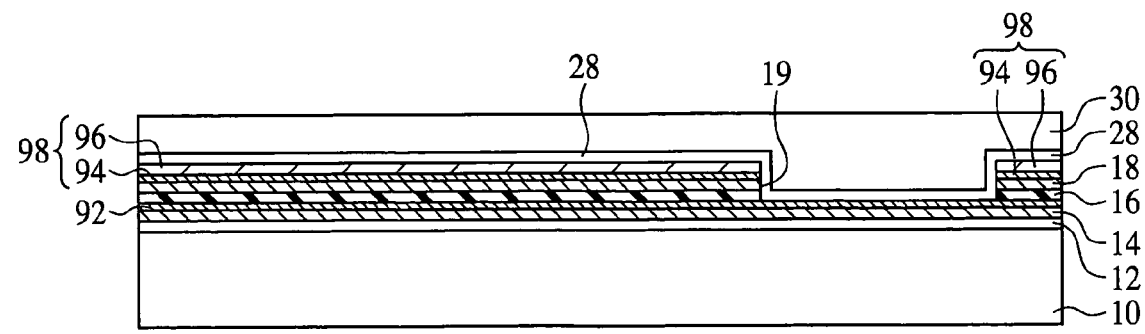

Next, as illustrated in FIG. 30D, the protection film 30 of, e.g., photosensitive polyimide is formed on the entire surface by, e.g., spin coating. The thickness of the protection film 30 is, e.g., about 50 μm.

Then, the openings 32a, 32b are formed in the protection film 30 down to the insulating barrier film 28 by photolithography. In the present embodiment, the conduction film 96 is further formed on the conducting barrier film 94, whereby the conducting barrier film 94 can be kept from being etched off in forming the openings 32b.

Next, the insulating barrier film 28 exposed in the openings 32a, 32b is etched off. Thus, the openings 32a, 32b are formed in the protection film 30 and the insulating barrier film 28 down to the leading-out electrodes 26a, 26b (see FIG. 31A).

The following semiconductor device fabricating method is the same as the semiconductor device fabricating method of the ninth embodiment described above with reference to FIG. 25 and will not be repeated.

Figure 31A:
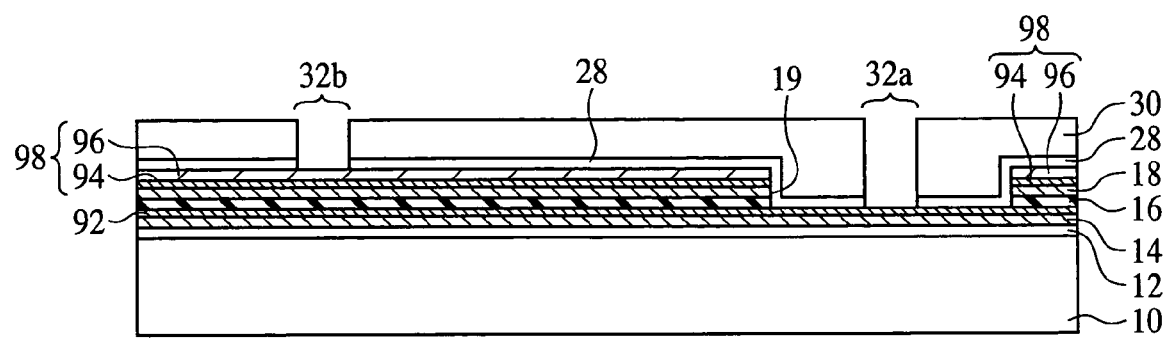
FIGS. 31A and 31B are sectional views of the thin-film capacitor according to the eleventh embodiment of the present invention in the steps of the method for fabricating the thin-film capacitor, which illustrate the method (Part 2).
Figure 31B:
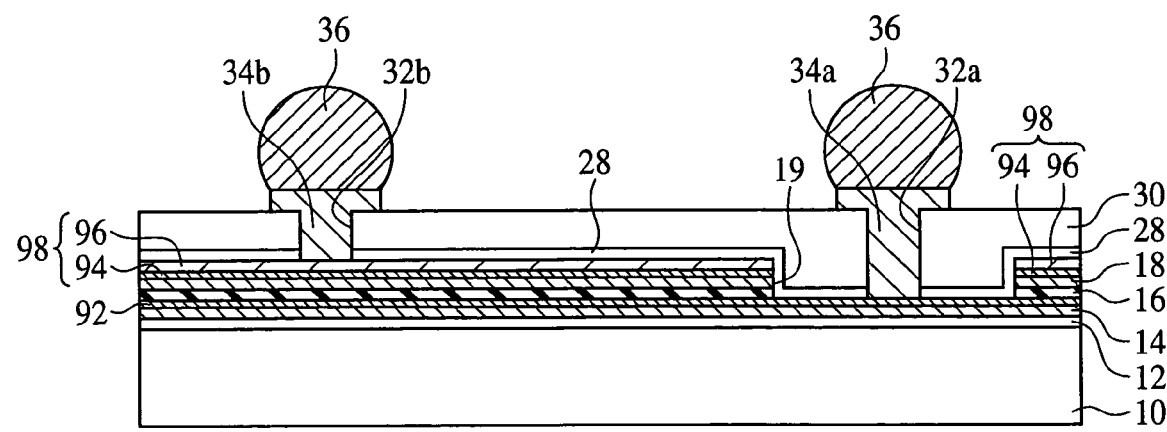

Thus, the thin-film capacitor according to the present embodiment is fabricated (see FIG. 31B).

According to the present embodiment, the conduction film 96 is further formed on the conducting barrier film 94, whereby the conducting barrier film 94 can be kept from being etched off in forming the openings 32b. Thus, according to the present embodiment, the prevention of the diffusion of the hydrogen or water can be more ensured by the conducting barrier film 94.

A Twelfth Embodiment

Figure 32A:
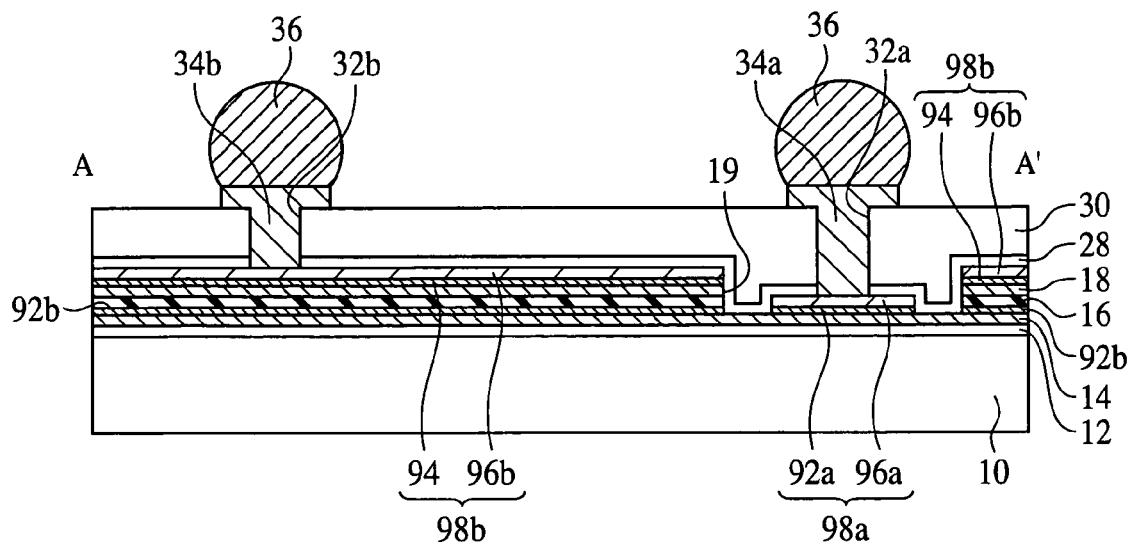
FIGS. 32A and 32B are a sectional view and a plan view of the thin-film capacitor according to a twelfth embodiment of the present invention.
Figure 32B:
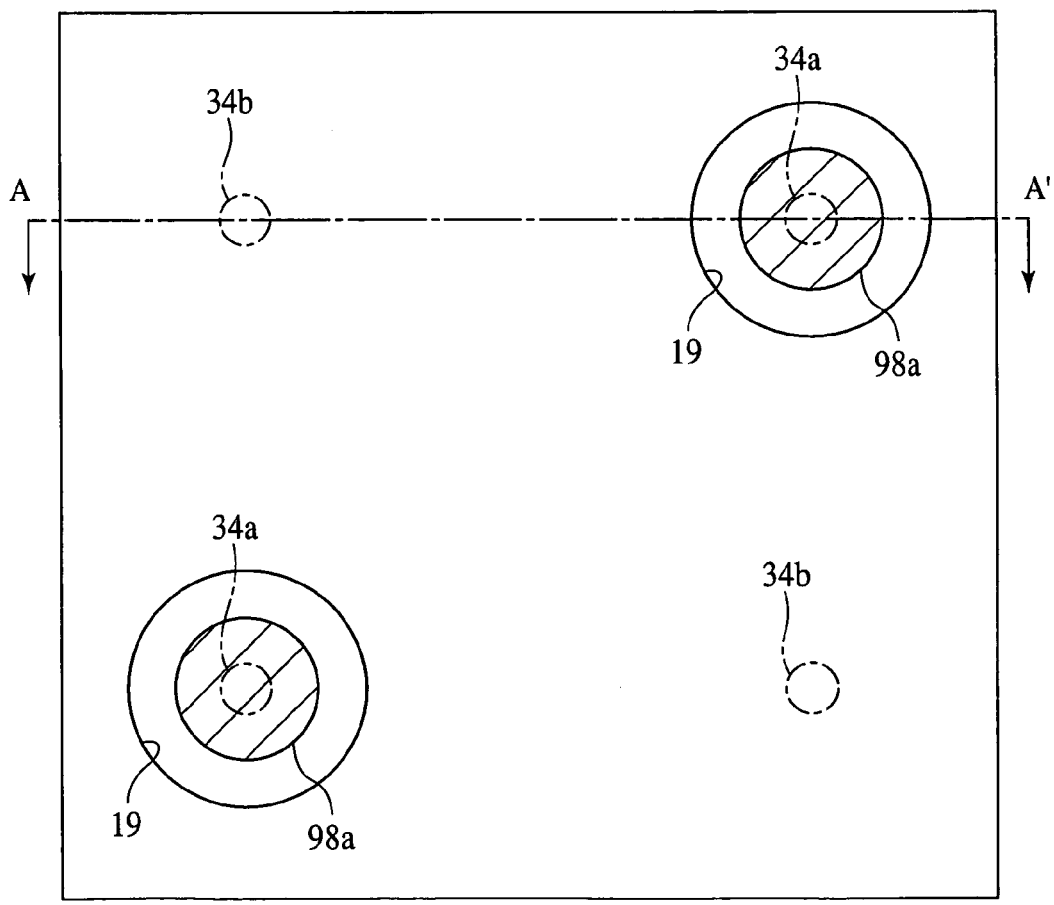
Figure 33A:
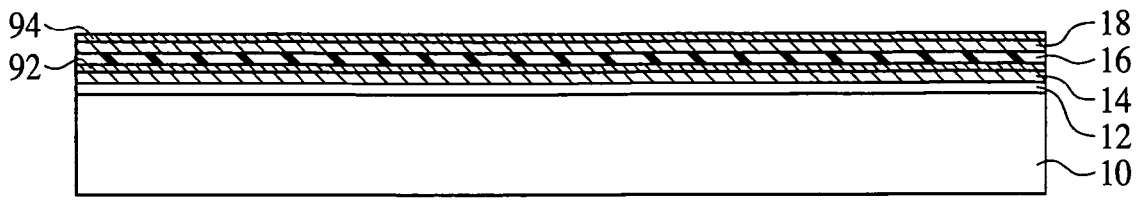
FIGS. 33A to 33D are sectional views of the thin-film capacitor according to the twelfth embodiment of the present invention in the steps of the method for fabricating the thin-film capacitor, which illustrate the method (Part 1).
Figure 33B:
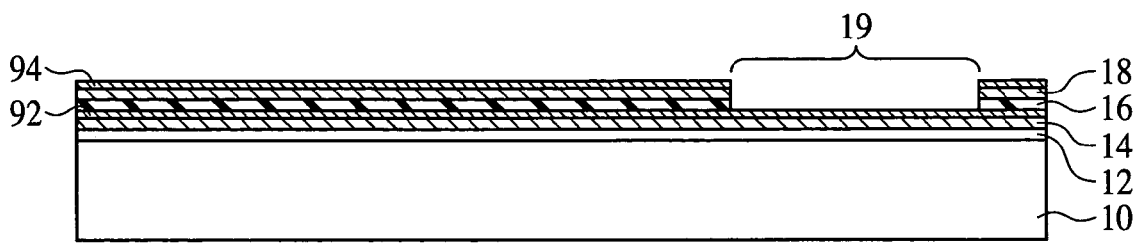
Figure 33C:
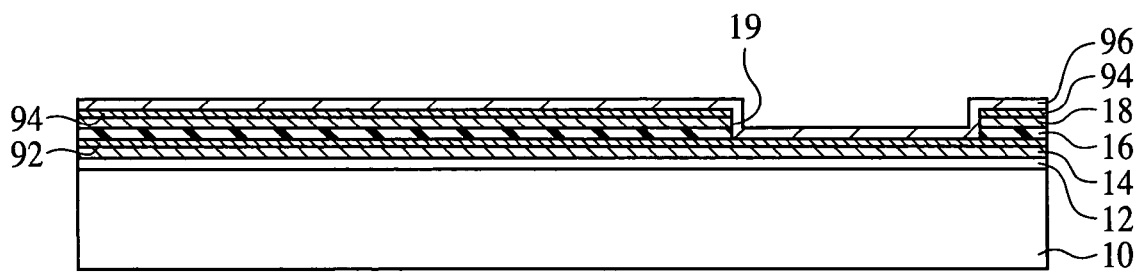
Figure 33D:
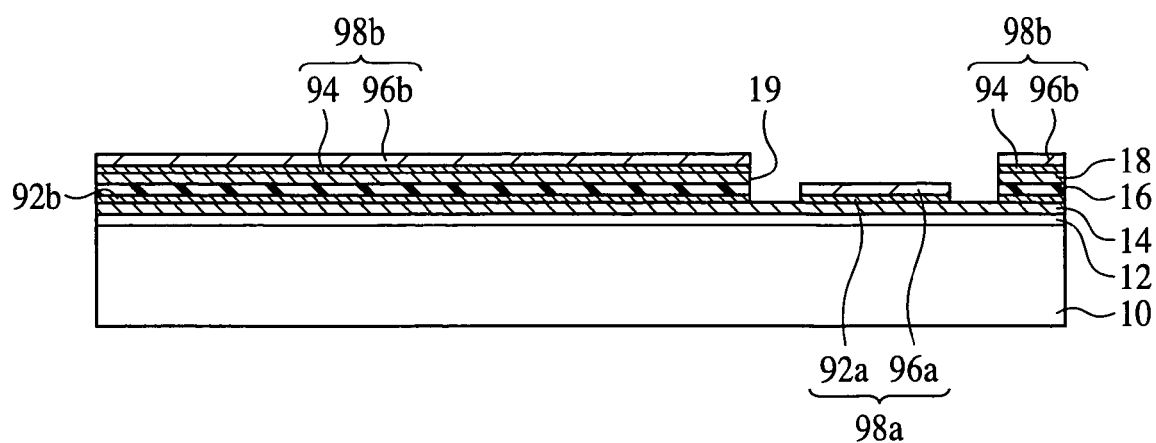

The thin-film capacitor according to a twelfth embodiment of the present invention and the method for fabricating the thin-film capacitor will be explained with reference to FIGS. 32A to 34D. FIGS. 32A and 32B are a sectional view and a plan view of the thin-film capacitor according to the present embodiment. The same members of the present embodiment as those of the thin-film capacitor according to the first to the eleventh embodiments and the method for fabricating the thin-film capacitor illustrated in FIGS. 1A to 31B are represented by the same reference numbers not to repeat or to simplify their explanation.

(The Thin-Film Capacitor)

First, the thin-film capacitor according to the present embodiment will be explained with reference to FIGS. 32A and 32B.

The thin-film capacitor according to the present embodiment is characterized mainly in that a conduction film 96b is formed on the conducting barrier film 94, and a conduction film 96a is formed on the conduction barrier film 92a.

As illustrated in FIGS. 32A and 32B, an insulation film 12 is formed on the surface of a base substrate 10.

An adhesion layer (not illustrated) of, e.g., $TiO_2$ is formed on the insulation film 12.

Capacitor electrodes (lower electrodes) 14 are formed on the adhesion layer. The capacitor electrodes 14 are formed of, e.g., a 100 nm-thickness Pt film.

Conducting barrier films 92a, 92b for preventing the diffusion of the hydrogen or water are formed on the capacitor electrodes 14. The conducting barrier films 92a, 92b are, e.g., $IrO_2$ film. The conducting barrier films 92a, 92b are $IrO_2$ film in the present embodiment because, as described above, $IrO_2$ film is very superior in the function of preventing the diffusion of hydrogen or water. The film thickness of the conducting barrier films 92a, 92b is, e.g., about 50 nm.

A capacitor dielectric film 16 is formed on the conducting barrier film 92b. The capacitor dielectric film 16 is formed of, e.g., a high dielectric constant material. More specifically, the capacitor dielectric film 16 is polycrystalline BST film. The film thickness of the capacitor dielectric film 16 is, e.g., 100 nm.

Capacitor electrodes (upper electrodes) 18 are formed on the capacitor dielectric film 16. The capacitor electrodes 18 are formed of, e.g., a 100 nm-thickness Pt film.

A conducting barrier film 94 for preventing the diffusion of the hydrogen or water is formed on the capacitor electrodes 18. The conducting barrier film 94 is, e.g., $IrO_2$ film. The conducting barrier film 94 is $IrO_2$ film in the present embodiment because, as described above, $IrO_2$ film is superior in the function of preventing the diffusion of hydrogen or water. The film thickness of the conducting barrier film 94 is, e.g., about 50 nm.

A conducting film 96b is formed on the conducting barrier film 94. The conducting film 96b is for preventing the conducting barrier film 94 from being etched off in etching the protection film 30 to form openings 32b. The conducting barrier film 94, which is not etched off, can sufficiently prevent the diffusion of the hydrogen or water.

A conduction film 96a is formed on the conducting barrier film 92a. The conducting film 96a is for preventing the conducting barrier film 92a from being etched off in etching the protection film 30 to form openings 32a. The conducting barrier film 92a, which is not etched off, can sufficiently prevent the diffusion of the hydrogen or water.

The conducting barrier film 92a and the conducting barrier film 96a formed a layer film (conduction layer) 98a. The conducting barrier film 94 and the conduction film 96b form a layer film (conduction layer) 98b.

Openings 19 are formed in the layer film 98b, the capacitor electrodes 18 and the capacitor dielectric film 16 down to the capacitor electrodes 14.

Thus, capacitor parts 20 each including the capacitor electrode 14, the capacitor dielectric film 16 and the capacitor electrode 18 are constituted.

A insulating barrier film 28 for preventing the diffusion of the hydrogen or water is formed on the base substrate 10 with the capacitor parts 20 formed on. The insulating barrier film 28 is formed, covering the capacitor parts 20. The insulating barrier film 28 is, e.g., aluminum oxide film. The film thickness of the insulating barrier film 18 is, e.g., about 50 nm.

A protection film 30 of, e.g., photosensitive polyimide is formed on the insulating barrier film 28. The film thickness of the protection film 30 is, e.g., about 5 μm.

Openings 32a are formed in the protection film 30, and the insulating barrier film 28 down to the conduction film 96a. Openings 32b are formed in the protection film 30 and the insulation layer 28 down to the conduction film 96b.

A layer film (not illustrated) of a Ti film and a Cu film sequentially laid is formed in the openings 32a, 32b. The layer film functions as an adhesion layer.

Electrodes for the connection to the outside 34a, 34b of Ni are formed in the openings 32a, 32b with the layer film formed in.

Solder bumps 36 of, e.g., an Sn—Ag-based material are formed on the outside connection electrodes 34a, 34b.

Thus, the thin-film capacitor according to the present embodiment is constituted.

The thin-film capacitor according to the present embodiment is characterized mainly in that, as described above, the conduction film 96b is formed on the conducting barrier film 94, and the conduction film 96a is formed also on the conducting barrier film 92a.

According to the present embodiment, the conduction film 96b is formed on the conducting barrier film 94, and the conduction film 96a is formed on the conducting barrier film 92a, whereby the conducting barrier film 94 is kept form being etched off in etching the protection film 30 to form the openings 32a, 32b, and the conducting barrier film 92a is also kept from being etched off. Thus, according to the present embodiment, the prevention of the diffusion of the hydrogen or water can be more ensured by the conducting barrier films 92a, 94.

(The Method for Fabricating the Thin-Film Capacitor)

Then, the thin-film capacitor according to the present embodiment will be explained with reference to FIGS. 33A to 34D. FIGS. 33A to 34D are sectional views of the thin-film capacitor according to the present embodiment in the steps of the method for fabricating the thin-film capacitor, which illustrate the method.

First, the base substrate 10 with the insulation film 12 formed on the surface is prepared. More specifically, a silicon substrate 10 with, e.g., a silicon oxide film 12 formed on is prepared.

Then, the base substrate 10 is loaded into the film forming chamber of the a puttering system. The sputtering system (not illustrated) is, e.g., a multi-target type magnetron sputtering system.

Next, the adhesion layer (not illustrated) of, e.g., a 100 nm-thickness TiO$_2$ film is formed on the entire surface by sputtering.

Then, the conduction film 14 of, e.g., a 100 nm-thickness Pt film is formed on the entire surface by sputtering.

Next, the conducting barrier film 92 for preventing the diffusion of the hydrogen or water is formed on the entire surface by, e.g., sputtering. The conducting barrier film 92 is, e.g., a 50 nm-thickness IrO$_2$ film.

Next, the capacitor dielectric film 16 of, e.g., a 100 nm-thickness polycrystalline BST film is formed on the entire surface by sputtering.

Next, the conduction film 18 of, e.g., a 100 nm-thickness Pt film is formed on the entire surface by sputtering.

Then, the conducting barrier film 94 for preventing the diffusion of the hydrogen or water is formed o the entire surface by, e.g., sputtering. The conducting barrier film 94 is, e.g., a 50 nm-thickness IrO$_2$ film (see FIG. 33A).

Then, the base substrate 10 is unloaded out of the film forming chamber of the sputtering system.

Then, the conducting barrier film 94, the conduction film 18 and the capacitor dielectric film 16 are patterned by photolithography. Thus, the openings 19 are formed in the conducting barrier film 94, the capacitor dielectric film 18 and the capacitor dielectric film 16 (see FIG. 33B).

Thus, the capacitor parts 20 each including the capacitor electrode 14, the capacitor dielectric film 16 and the capacitor electrode 18 are formed.

Next, the conduction film 96 is formed on the entire surface by, e.g., sputtering. The conduction film 96 is, e.g., a 50 nm-thickness Au film or Ir film. Thus, the layer film 98 of the conducting barrier film 94 and the conduction film 96 is formed (see FIG. 33C).

Then, the layer film 98 is patterned by photolithography. Thus, the layer film 98a is formed of the conducting barrier film 92a and the conduction film 96a. The layer film 98b is formed of the conducting barrier film 94 and the conduction film 96b (see FIG. 33D). In the present embodiment, the conduction films 96a, 96b are further formed on the conducting barrier films 92a, 94, whereby the conducting barrier films 92a, 94 are kept from being etched off in forming the openings 32a, 32b.

Next, the insulating barrier film 28 for preventing the diffusion of the hydrogen or water is formed on the entire surface by, e.g., sputtering. The insulating barrier film 28 is, e.g., amorphous aluminum oxide film. The film thickness of the insulating barrier film 28 is, e.g., about 50 nm (see FIG. 34A).

Figure 34A:
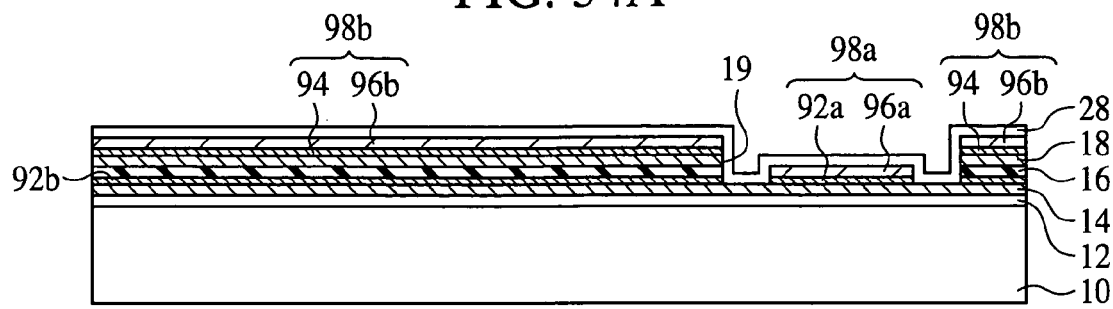
FIGS. 34A to 34D are sectional views of the thin-film capacitor according to the twelfth embodiment of the present invention in the steps of the method for fabricating the thin-film capacitor, which illustrate the method (Part 2).
Figure 34B:
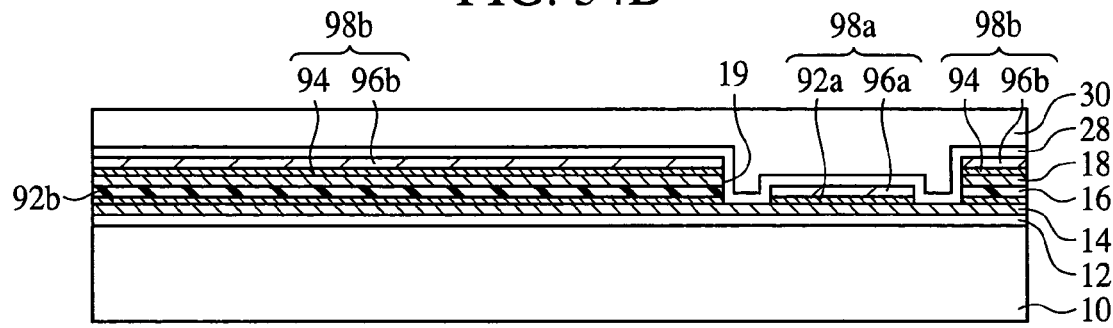
Figure 34C:
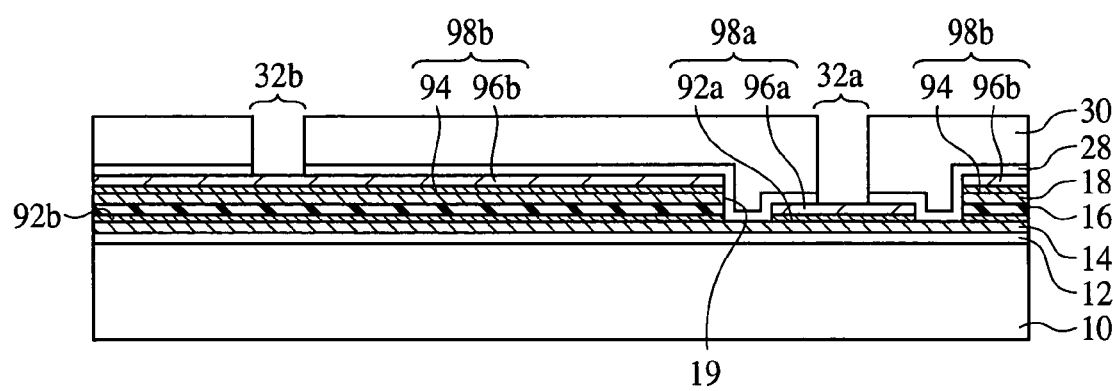
Figure 34D:
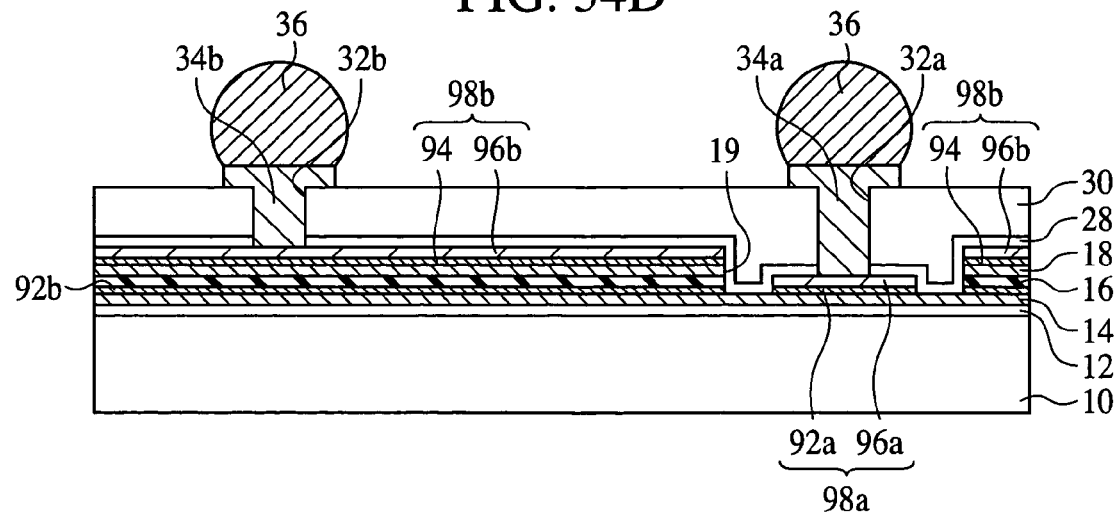
Figure 35:
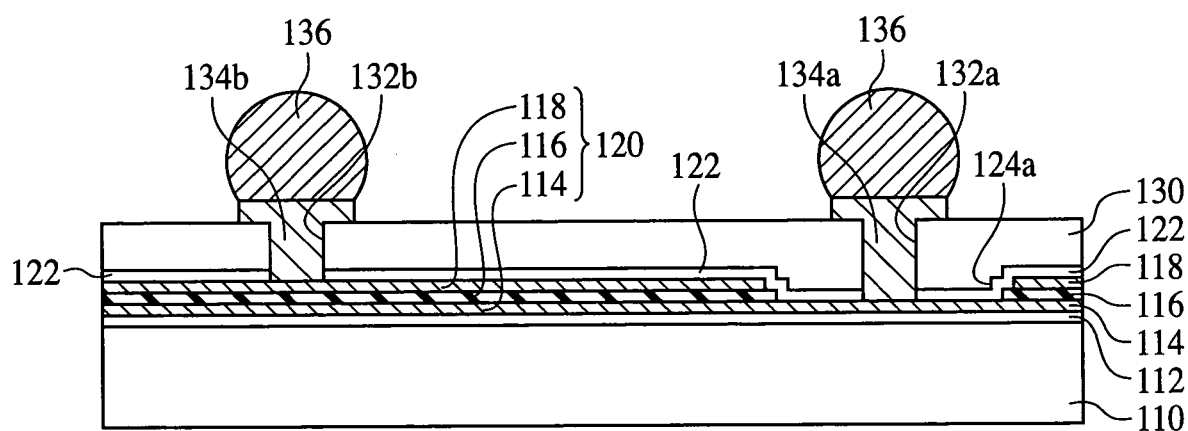
FIG. 35 is a sectional view of the proposed thin-film capacitor.

Next, as illustrated in FIG. 34B, the protection film 30 of, e.g., photosensitive polyimide is formed on the entire surface by, e.g., spin coating. The thickness of the protection film 30 is, e.g., about 5 μm.

Next, the insulating barrier film 28 exposed in the openings 32a, 32b is etched off. Thus, the openings 32a, 32b are formed in the protection film 30 and the insulating barrier film 28 down to the leading-out electrodes 26a, 26b (see FIG. 34C).

The following semiconductor device fabricating method is the same as the semiconductor device fabricating method of the ninth embodiment described above with reference to FIG. 25 and will not be repeated.

Thus, the thin-film capacitor according to the present embodiment is fabricated (see FIGS. 34A to 34D).

According to the present embodiment, the conduction film 96b is formed on the conducting barrier film 94, and the conduction film 96a is formed also on the conduction barrier film 92a, whereby the conducting barrier film 94 can be kept form being etched off in etching the protection film 30 to form the openings 32a, 32b, and the conducting barrier film 92a can be kept from being etched off. Thus, according to the present embodiment, the prevention of the diffusion of the hydrogen or water can be more ensured by the conducting barrier films 92a, 94.

Modified Embodiments

The present invention is not limited to the above-described embodiments and can cover other various modifications.

For example, in the above-described embodiments, the conducting barrier film forming the leading-out electrodes 26a-26d is amorphous film. However, the conducting barrier film is not essentially amorphous. The conducting barrier film forming the leading-out electrodes 26a-26d can be polycrystalline film of microcrystals, i.e., microcrystalline film. More specifically, polycrystalline film of microcrystals of a grain diameter of 50 nm or below can be used as the conducting barrier film forming the leading-out electrodes 26a-26d. The polycrystalline film of microcrystals have very small gap between the crystal grains, i.e., very small grain boundaries, and hydrogen or water cannot easily pass through the gaps between the crystal grains. Accordingly, when the conducting barrier film forming the leading-out electrodes 26a-26d is polycrystalline film of microcrystals, the diffusion of the hydrogen or water can sufficiently prevented.

The material of the conducting barrier film forming the leading-out electrodes 26a-26d is not limited to the materials described in the embodiments described above. For example, the conducting barrier film forming the leading-out electrodes 26a-26d can be oxide, such as $IrO_2$ or others. The material of the conducting barrier film forming the leading-out electrodes 26a-26d can be nitride, such as TiN, TaSiN or others. The material of the conducting barrier film forming the leading-out electrodes 26a-26d can be carbide, such as TiC, SiC or others. The material of the conducting barrier film forming the leading-out electrodes 26a-26d can be conducting diamond-like carbon or others. That is, the material of the conducting barrier film forming the leading-out electrodes 26a-26d can be conducting carbon film. The material of the conducting barrier film forming the leading-out electrodes 26a-26d can be silicide, such as CoSi, TaSi or others. A composite of these materials can be used as the material of the conducting barrier film forming the leading-out electrodes 26a-26d.

In the above-described embodiments, the leading-out electrodes 26a-26d are formed of the conducting barrier film which is, i.e., superior in the function of preventing the diffusion of hydrogen or water. However, a material which is not effective to prevent the diffusion of hydrogen or water may be used as the material of the leading-out electrodes 26a-26d; the outside connection electrodes 34a, 34b and the capacitor electrodes 14, 18 are connected by the leading-out electrodes 26a, 26b, whereby the connections between the outside connection electrodes 34a, 34b and the leading-out electrodes 26a, 26b, and the connections between the electrodes 14, 18 and the leading-out electrodes 26a, 26b can be sufficiently distant from each other, and accordingly, the hydrogen or water intruding via the outside connection electrodes 34a, 34b can be sufficiently blocked by the leading-out electrodes 26a, 26b. Even when the leading-out electrodes 26a-26d are formed of a usual metal, such as Cu, Au, Al, Ni, W (tungsten) or others, the sufficient barrier effect can be provided depending on conditions for using the material.

In the above-described embodiments, the insulating barrier films 22, 28 are formed of amorphous film. However, the insulating barrier films 22, 28 are not essentially amorphous. For example, the insulating barrier films 22, 28 can be polycrystalline film of microcrystals, i.e., microcrystalline film. More specifically, the insulating barrier films 22, 28 can be polycrystalline film of a crystal diameter of 50 nm or below. Polycrystalline film of microcrystals has, as described above, very small gaps between the crystal grains, i.e., a very narrow grain boundaries, and accordingly, hydrogen or water cannot easily pass through the gaps between the crystal grains. Thus, even when the insulating barrier films 22, 28 are formed of polycrystalline film of microcrystals, the insulating barrier films 22, 28 can prevent the diffusion of the hydrogen or water.

The material of the insulating barrier films 22, 28 is not limited to the material used in the above-described embodiments. For example, oxide, such as aluminum oxide, titanium oxide, zirconium oxide, $BaSrTiO_3$ (BST), $SrTiO_3$ (STO) or others, may be used as the material of the insulating barrier films 22, 28. Insulating diamond-like carbon or others may be used as the material of the insulating barrier films 22, 28. That is, insulating carbon film may be used as the insulating barrier films 22, 28. A composite of the materials may be used as the material of the insulating barrier films 22, 28.

In the above-described embodiments, the capacitor dielectric films 16, 38 are formed of BST film. However, the material of the capacitor dielectric films 16, 38 are not limited to BST film. Any other dielectric film can be suitably used as the capacitor dielectric films 16, 38.

For example, dielectric films formed mainly of oxides having the perovskite crystal structure (perovskite oxides) can be used as the capacitor dielectric films 16, 38. More specifically, for example, a $BaTiO_3$-based perovskite oxides, such as $BaSrTiO_3$ (BST), $SrTiO_3$ (STO), $BaZrTiO_3$, $BaTiSnO_3$ or others may be used as the material of the capacitor dielectric films 16, 38. A Pb-based perovskite oxide, such as $PbMnNbO_3$—$PbTiO_3$ (PMN-PT) may be used as the material of the capacitor dielectric film 16, 38.

Oxide, such as tantalum oxide, niobium oxide, hafnium oxide, yttrium oxide, aluminum oxide or others, may be used as the material of the capacitor dielectric films 16, 38. A composite oxide of two or more of metals, such as Ta, Nb, Hf, Y, Al, etc., may be used as the material of the capacitor dielectric films 16, 38. A mixture of these materials may be used as the material of the capacitor dielectric films 16, 38.

In the above-described embodiments, the capacitor dielectric films 16, 38 are polycrystalline dielectric film. However, the capacitor dielectric films 16, 38 are not essentially polycrystalline. For example, the capacitor dielectric films 16, 38 may be single crystalline dielectric film. The capacitor dielectric films 16, 38 are single crystalline dielectric film, whereby the specific dielectric constant of the capacitor parts 20, 20a can be very high. The capacitor dielectric films 16, 38 can be amorphous dielectric film. The capacitor dielectric films 16, 38 of amorphous dielectric film can form the capacitor parts of good leak characteristics. The capacitor dielectric films 16, 38 may have the mixed crystalline and amorphous phase.

In the above-described embodiments, the capacitor electrodes 14, 18, 40 are formed of Pt. However, the capacitors 14, 18, 40 are not essentially formed of Pt. The capacitor electrodes 14, 18, 40 may be formed of a noble metal, such as Ir, Ru, Rh or others. The noble metal does not tend to be oxidized and besides has low electric resistance suitably for the capacitor electrodes 14, 18, 40. The capacitor electrodes 14, 18, 40 may be formed of a conducting oxide, such as $SrRuO_3$, $LaNiO_3$, $LaSrCoO_3$ or others. The capacitor electrodes 14, 18, 40 may be formed of a conducting nitride, such as AlTiN or others. The capacitor dielectric electrodes 14, 18, 40 can be formed of a conducting carbide, such as TiC or others. The capacitor electrodes 14, 16, 40 can be formed of Cu, Ni or others.

In the above-described embodiments, the protection film 30 is formed of polyimide resin. However, the protection film 30 is not essentially formed of polyimide resin. For example, any other resin, such as epoxy resin or others, may be suitably used as the material of the protection film 30. The protection film 30 can be aluminum oxide film, silicon oxide film or others. The protection film 30 can be nitride, oxide nitride or others. The protection film 30 can be formed of another insulating material. The protection film 30 can be a layer film of a plurality of stacked insulation films. In the protection film 30 of these materials, the openings 32a, 32b can be formed down to the leading-out electrodes 26a-26d by, e.g., etching. When the protection film 30 is formed of a photosensitive material, the protection film is subjected to exposure, development and other processing to thereby form the openings 32a, 32b down to the leading-out electrodes 26a-26d.

In the above-described embodiments, the base substrate 10 is a silicon substrate. However, the base substrate 10 is not limited to the silicon substrate. For example, a glass substrate can be used as the base substrate 10. The base substrate 10 can be a ceramic substrate of aluminum oxide or others. The base substrate 10 can be a metal substrate of molybdenum (Mo), tungsten (W) or others. The base substrate 10 can be a resin substrate of epoxy resin or others. A composite material of these materials can be used as the material of the base substrate 10.

In the ninth to the twelfth embodiments, the conducting barrier films 86a, 86b are $IrO_2$ film. However, the conducting barrier films 86a, 86b are not limited to $IrO_2$ film. The conducting barrier films 86a, 86b can be formed of suitably any other material. However, it is preferable that the conducting barrier films 86a, 86b are formed of a material which is effective to prevent the diffusion of hydrogen or water. Materials which are superior in the function of preventing the diffusion of hydrogen or water are, in addition to $IrO_2$, e.g., oxides, such as $RuO_2$, etc., nitrides, such as TiN, TiSiN, TaSiN, NbSiN, etc., carbides, such as TiC, SiC, etc., carbon, etc.

What is claimed is:

1. A method for fabricating a thin-film capacitor comprising the steps of:
    forming a first capacitor electrode over a base substrate;
    forming over a first capacitor electrode a first conducting barrier film which prevents the diffusion of hydrogen or water;
    forming a capacitor dielectric film over the first conducting barrier film;
    forming a second capacitor electrode over the capacitor dielectric film;
    forming over the second capacitor electrode a second conducting barrier film which prevents the diffusion of hydrogen or water;
    forming an insulation film over the first conducting barrier film ad the second conducting barrier film; and
    burying in the insulation film a first outside connection electrode for connecting to outside connected to the first capacitor electrode via the first conducting barrier film, and a second outside connection electrode for connecting to outside connected to the second capacitor electrode via the second conducing barrier film,
    wherein the first conducting burrier film and the second conducting barrier film are formed of $IrO_2$.

2. A method for fabricating a thin-film capacitor comprising the steps of:
    forming over a base substrate a capacitor part including a first capacitor electrode, a capacitor dielectric film formed over the first capacitor electrode, and a second capacitor electrode formed over the capacitor dielectric film;
    forming over the first capacitor electrode a first conducting barrier film which prevents the diffusion of hydrogen or water and forming over the second capacitor electrode a second conducting barrier film which prevent the diffusion of hydrogen or water;
    forming an insulation film over the capacitor part, covering the first conducting layer and the second conducting layer; and
    burying in the insulation film a first outside connection electrode for connecting to outside electrically connected to the first capacitor electrode via the first conducting barrier film, and a second outside connection electrode for connecting to outside electrically connected to the second capacitor electrode via the second conducting barrier films,
    wherein the first conducting burrier film and the second conducting barrier film are formed of $IrO_2$.

3. A method for fabricating a thin-film capacitor comprising the steps of:
    forming over a base substrate a capacitor part including a first capacitor electrode, a capacitor dielectric film formed over the first capacitor electrode, and a second capacitor electrode formed over the capacitor dielectric film;
    forming a leading-out electrode led from the first capacitor electrode or the second capacitor electrode and formed of a conducting barrier film which prevents the diffusion of hydrogen or water, one part of the leading-out electrode being contacted with the first capacitor electrode or the second capacitor electrode; and
    forming an outside connection electrode for connecting to outside connected to the leading-out electrode, the outside connection electrode being contacted with another part of the leading-out electrode remote from said one part of the leading-out electrode.

4. A method for fabricating a thin-film capacitor according to claim 3, further comprising the steps of
    forming a through-electrode electrically connected to the leading-out electrode and formed through the base substrate.

5. A thin-film capacitor comprising:
    a capacitor part formed over a base substrate and including a first capacitor electrode, a capacitor dielectric film formed over the first capacitor electrode, and a second capacitor electrode formed over the capacitor dielectric film;
    a leading-out electrode led from the first capacitor electrode or the second capacitor electrode and formed of a conducting barrier film which prevents the diffusion of hydrogen or water, one part of the leading-out electrode being contacted with the first capacitor electrode or the second capacitor electrode; and
    an outside connection electrode for connecting to outside electrically connected to the leading-out electrode, the outside connection electrode being contacted with another part of the leading-out electrode remote from said one part of the leading-out electrode.

6. A thin-film capacitor according to claim 5, further comprising
    an insulating barrier film which is formed, covering the capacitor part and the leading-out electrode and prevents the diffusion of hydrogen or water.

7. A thin-film capacitor according to claim 5, wherein
    an opening is formed in the first capacitor electrode, the capacitor dielectric film and the second capacitor electrode;
    leading-out electrode is led from the inner edge of the first capacitor electrode in the opening; and
    the outside connection electrode is formed on the leading-out electrode in the opening.

8. A thin-film capacitor according to claim 5, wherein
    an opening is formed in the first capacitor electrode, the capacitor dielectric film and the second capacitor electrode;
    the leading-out electrode is led from the inner edge of the second capacitor electrode in the opening; and
    the outside connection electrode is formed on the leading-out electrode in the opening.

9. A thin-film capacitor according to claim 5, wherein
    the capacitor part further includes another capacitor dielectric film formed on the second capacitor electrode, and a third capacitor electrode formed on said another capacitor dielectric film; and
    the first capacitor electrode and the third capacitor electrode are electrically connected with each other.

10. A thin-film capacitor according to claim 5, further comprising:
    a first insulating barrier film which is formed, covering the capacitor part and prevents the diffusion of hydrogen or water, the leading-out electrode being formed on the first insulating barrier film and is connected to the second capacitor electrode via an opening formed in the first insulating barrier film; and a second insulating barrier film which is formed, covering the first insulating barrier film and the leading-out electrode and prevents the diffusion of hydrogen or water, the outside connection electrode being connected to the leading-out electrode via an opening formed in the second insulating barrier film.

11. A thin-film capacitor according to claim 1, further comprising
a through-electrode electrically connected to the leading-out electrode and formed through the base substrate.

12. A thin-film capacitor according to claim 1, wherein
the leading-out electrode is formed of an amorphous film or a polycrystalline film of microcrystals of a crystal grain diameter of 50 nm or below.

13. A thin-film capacitor according to claim 1, wherein
the leading-out electrode is formed of oxide, nitride, carbon, carbide, silicide or a composite of them.

14. A thin-film capacitor according to claim 6, wherein
the insulating barrier film is amorphous film or polycrystalline film of microcrystals of a crystal grain diameter of 50 nm or below.

15. A thin-film capacitor according to claim 5 wherein the capacitor dielectric film is a dielectric film mainly formed of oxide of the prevskite crystal structure.

16. An electronic device comprising:
a circuit board;
a thin-film capacitor monnted on the circuit board, the thin-film capacitor comprising a capacitor part including a first capacitor electrode formed over a base substrate, a capacitor dielectric film formed over the first capacitor electrode, and a second capacitor electrode formed over the capacitor dielectric film; a leading-out electrode led out from the first or the second capacitor electrode and formed of a conducting barrier film which prevents the diffusion of hydrogen or water, one part of the leading-out electrode being contacted with the first capacitor electrode or the second capacitor electrode; and an outside connection electrode for connecting to outside connected to the leading-out electrode, the outside connection electrode being contacted with another part of the leading-out electrode remote from said one part of the leading-out electrode; and
a semiconductor device mounted on the circuit board.

17. An electronic device comprising:
a circuit board;
a thin-film capacitor mounted on the circuit board, the thin-film capacitor comprising a capacitor part including a first capacitor electrode formed over a base substrate, a capacitor dielectric film formed over the first capacitor electrode, and a second capacitor electrode formed over the capacitor dielectric film; a leading-out electrode led out from the first capacitor electrode or the second capacitor electrode and formed of a conducting barrier film which prevents the diffusion of hydrogen or water, one part of the leading-out electrode being contacted with the first capacitor electrode or the second capacitor electrode; an outside connection electrode for connecting to outside connected to the leading-out electrode the outside connection electrode being contacted with another part of the leading-out electrode remote from said one part of the leading-out electrode; and a through-electrode electrically connected to the leading-out electrode and formed through the base substrate; and a semiconductor device mounted on the thin-film capacitor, and electrically connected to the circuit board via the outside connection electrode and the through-electrode.

18. A circuit board with a thin-film capacitor incorporated in, wherein
the thin-film capacitor comprises a first capacitor electrode formed over a base substrate; a capacitor dielectric film formed over the first capacitor electrode; a second capacitor electrode formed over the capacitor dielectric film; a leading-out electrode led from the first capacitor electrode or the second capacitor electrode, and formed of a conducting barrier film which prevents the diffusion of hydrogen or water, one part of the leading-out electrode being contacted with the first capacitor electrode or the second capacitor electrode; and an outside connection electrode for connecting to outside connected to the leading-out electrode, the outside connection electrode being contacted with another part of the leading-out electrode remote from said one part of the leading-out electrode, and the outside connection electrode is electrically connected to an interconnection formed in the circuit substrate.

19. A circuit board with a thin-film capacitor incorporated in, wherein
the thin-film capacitor comprises a capacitor part including a first capacitor electrode formed over a base substrate; a capacitor dielectric film formed over the first capacitor electrode; a second capacitor electrode formed over the capacitor dielectric film; a leading-out electrode led out from the first capacitor electrode or the second capacitor electrode and formed of a conducting barrier film which prevents the diffusion of hydrogen or water, one part of the leading-out electrode being contacted with the first capacitor electrode or the second capacitor electrode; an outside connection electrode for connecting to outside connected to the leading-out electrode, the outside connection electrode being contacted with another part of the leading-out electrode remote from said one part of the leading-out electrode; and a through-electrode electrically connected to the leading-out electrode and formed through the base substrate, and
the through-electrode is electrically connected to an interconnection formed in the circuit board.

20. A thin-film capacitor comprising:
a capacitor part formed over a base substrate, and including a first capacitor electrode, a capacitor dielectric film formed over the first capacitor electrode, and a second capacitor electrode formed over the capacitor dielectric film;
a first conducting barrier film which is formed over the first capacitor electrode and prevents the diffusion of hydrogen or water;
a second conducting barrier film which is formed over the second capacitor electrode and prevents the diffusion of hydrogen or water;
an insulation film formed over the capacitor part, covering the first conducting barrier film and the second conducting barrier film;
a first outside connection electrode for connecting to outside buried in the insulation film, and electrically connected to the first capacitor electrode via the first conducting barrier film; and
a second outside connection electrode for connecting to outside buried in the insulation film, and electrically connected to the second capacitor electrode via the second conducting barrier films, wherein the first conducting burner film and the second conducting barrier film are formed of IrO$_2$.

21. A thin-film capacitor according to claim 20, wherein
a third opening is formed in the capacitor dielectric film and the second capacitor electrode, and
said first conducting barrier film is formed on the first capacitor electrode in the third opening.

22. A thin-film capacitor according to claim 20, wherein
said first conducting barrier film and said second conducting barrier film are formed of one and the same conduction film.

23. A thin-film capacitor according to claim 20, further comprising;
a first conduction film formed over said first conducting barrier film; and
a second conduction film formed over the second conducting barrier film, the first outside connection electrode being connected to the first conduction film, and the second outside connection electrode being connected to the second conduction film.

24. A thin-film capacitor according to claim 20, wherein the capacitor dielectric film is a dielectric film mainly formed of an oxide having the parasite crystal structure.

25. A thin-film capacitor comprising:
a first capacitor electrode formed over a base substrate;
a first conducting barrier film which is formed over the first capacitor electrode and prevents the diffusion of hydrogen or water;
a capacitor dielectric film formed over the first conducting barrier film;
a second capacitor electrode formed over the capacitor dielectric film;
a second conducting barrier film which is formed over the second capacitor electrode and prevents the diffusion of hydrogen or water;
an insulation film formed over the first capacitor electrode and the second capacitor electrode;
a first outside connection electrode for connecting to outside buried in the insulation film, and electrically connected to the first capacitor electrode via the first conducting barrier film; and
a second outside connection electrode for connecting to outside buried in the insulation layer, and electrically connected to the second capacitor electrode via the second conducting barrier film,
wherein the first conducting burrier film and the second conducting barrier film are formed of IrO$_2$.

26. A thin-film capacitor according to claim 25, further comprising
a conduction film formed on the first conducting barrier film or the second conducting barrier film.

27. A thin-film capacitor according to claim 25, wherein the capacitor dielectric film is a dielectric film mainly formed of an oxide having the perovskite crystal structure.

* * * * *